US011812598B2

(12) United States Patent
Watanabe

(10) Patent No.: US 11,812,598 B2
(45) Date of Patent: Nov. 7, 2023

(54) MEMORY DEVICE INCLUDING LATERALLY PERFORATED SUPPORT PILLAR STRUCTURES SURROUNDING CONTACT VIA STRUCTURES AND METHODS FOR FORMING THE SAME

(71) Applicant: SANDISK TECHNOLOGIES LLC, Addison, TX (US)

(72) Inventor: Kazuto Watanabe, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 167 days.

(21) Appl. No.: 17/355,883

(22) Filed: Jun. 23, 2021

(65) Prior Publication Data

US 2022/0415907 A1 Dec. 29, 2022

(51) Int. Cl.
*H10B 43/27* (2023.01)
*H10B 43/35* (2023.01)
*H01L 23/522* (2006.01)
*H10B 41/10* (2023.01)
*H10B 41/27* (2023.01)
*H10B 41/35* (2023.01)
*H10B 43/10* (2023.01)

(52) U.S. Cl.
CPC ......... *H10B 43/35* (2023.02); *H01L 23/5226* (2013.01); *H10B 41/10* (2023.02); *H10B 41/27* (2023.02); *H10B 41/35* (2023.02); *H10B 43/10* (2023.02); *H10B 43/27* (2023.02)

(58) Field of Classification Search
None
See application file for complete search history.

(56) References Cited

U.S. PATENT DOCUMENTS

| 9,673,213 | B1 | 6/2017 | Yu et al. |
| 9,853,038 | B1 | 12/2017 | Cui |
| 9,881,929 | B1 | 1/2018 | Ravikirthi et al. |
| 10,038,006 | B2 | 7/2018 | Furihata et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Sue A Purvis
*Assistant Examiner* — Carnell Hunter, III
(74) *Attorney, Agent, or Firm* — THE MARBURY LAW GROUP PLLC

(57) ABSTRACT

A three-dimensional memory device includes an alternating stack of insulating layers and electrically conductive layers, memory stack structures vertically extending through the alternating stack, a retro-stepped dielectric material portion overlying stepped surfaces of the alternating stack, a laterally perforated support pillar structure vertically extending through the alternating stack and the retro-stepped dielectric material portion, and a layer contact via structure laterally surrounded by the laterally perforated support pillar structure and contacting a top surface of a topmost electrically conductive layer within an area of the laterally perforated support pillar structure. Each electrically conductive layer within the area of the laterally perforated support pillar structure extends through the lateral openings.

14 Claims, 60 Drawing Sheets

(56) References Cited

U.S. PATENT DOCUMENTS

| | | | |
|---|---|---|---|
| 10,192,784 | B1 | 1/2019 | Cui et al. |
| 10,249,640 | B2 | 4/2019 | Yu et al. |
| 10,304,852 | B1 | 5/2019 | Cui et al. |
| 10,622,369 | B2 | 4/2020 | Zhou et al. |
| 10,727,248 | B2 | 7/2020 | Kaminaga |
| 10,840,260 | B2 | 11/2020 | Kai et al. |
| 10,872,857 | B1 | 12/2020 | Otsu et al. |
| 10,879,264 | B1 | 12/2020 | Otsu et al. |
| 10,892,267 | B2 | 1/2021 | Mushiga et al. |
| 10,937,801 | B2 | 3/2021 | Otsu et al. |
| 2016/0268291 | A1* | 9/2016 | Ishimura ............. H10B 43/27 |
| 2017/0179154 | A1 | 6/2017 | Furihata et al. |
| 2017/0358593 | A1 | 12/2017 | Yu et al. |
| 2019/0229125 | A1 | 7/2019 | Zhou et al. |
| 2019/0252396 | A1 | 8/2019 | Mushiga et al. |
| 2019/0252403 | A1 | 8/2019 | Kaminaga et al. |
| 2019/0252404 | A1 | 8/2019 | Kaminaga |
| 2020/0035694 | A1 | 1/2020 | Kaminaga |
| 2020/0303397 | A1* | 9/2020 | Cui ..................... H10B 43/50 |

OTHER PUBLICATIONS

U.S. Appl. No. 16/881,346, filed May 22, 2020, SanDisk Technologies LLC.
U.S. Appl. No. 16/881,353, filed May 22, 2020, SanDisk Technologies LLC.
U.S. Appl. No. 16/881,401, filed May 22, 2020, SanDisk Technologies LLC.
U.S. Appl. No. 16/918,463, filed Jul. 1, 2020, SanDisk Technologies LLC.
U.S. Appl. No. 16/918,493, filed Apr. 1, 2020, SanDisk Technologies LLC.
U.S. Appl. No. 17/081,458, filed Oct. 27, 2020, SanDisk Technologies LLC.

* cited by examiner

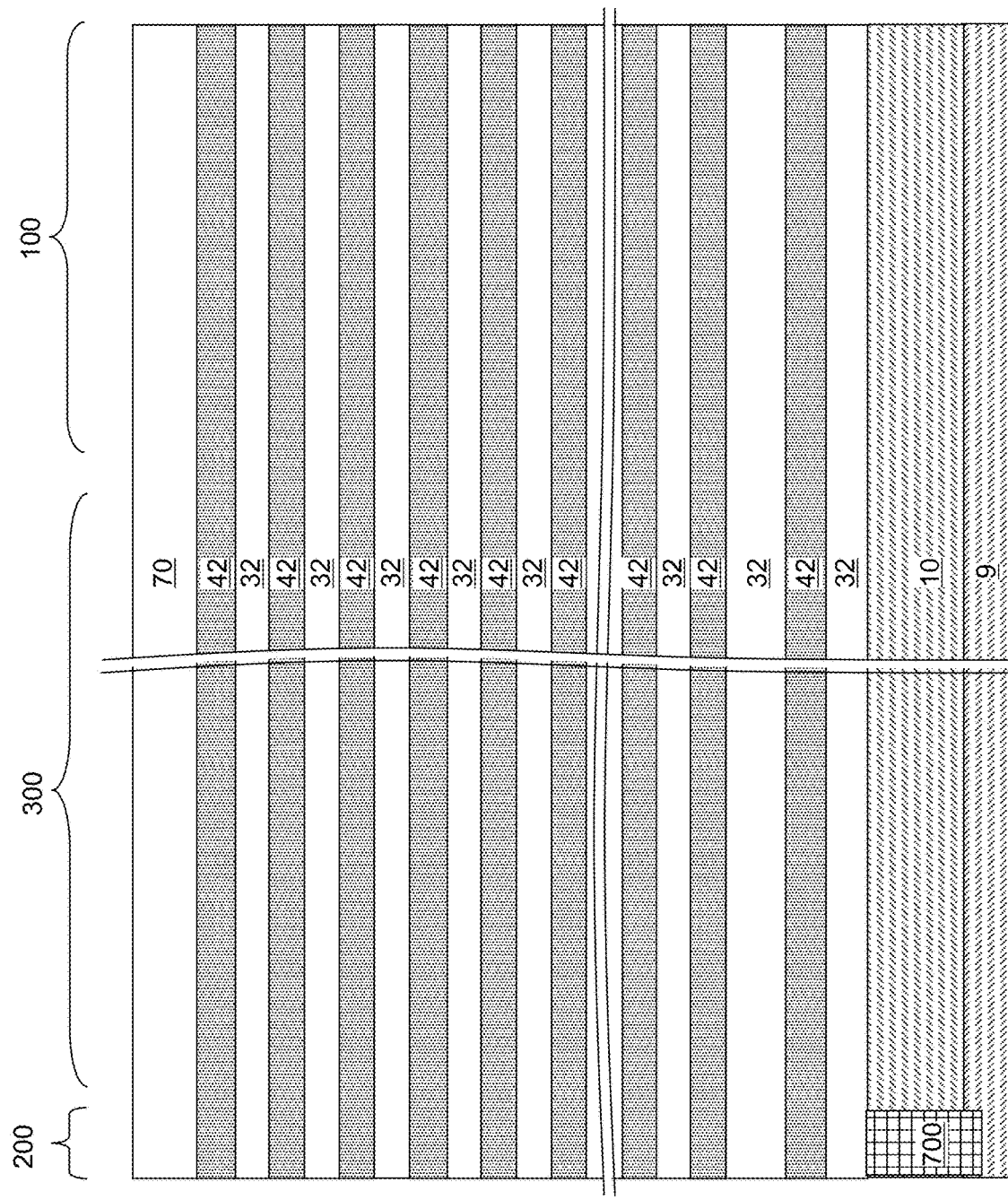

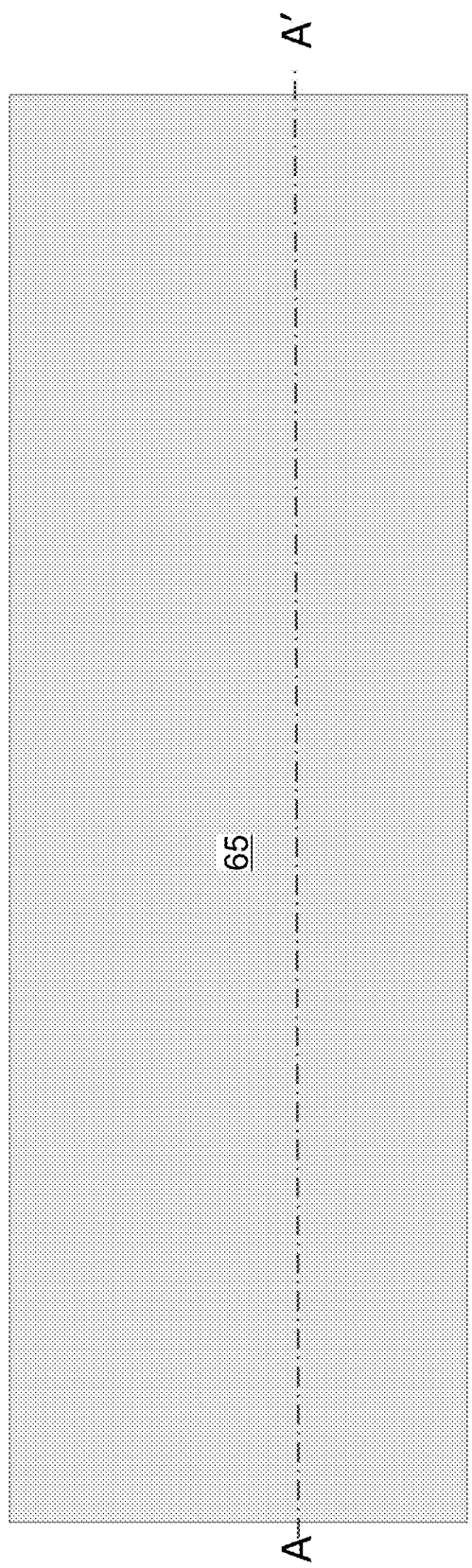
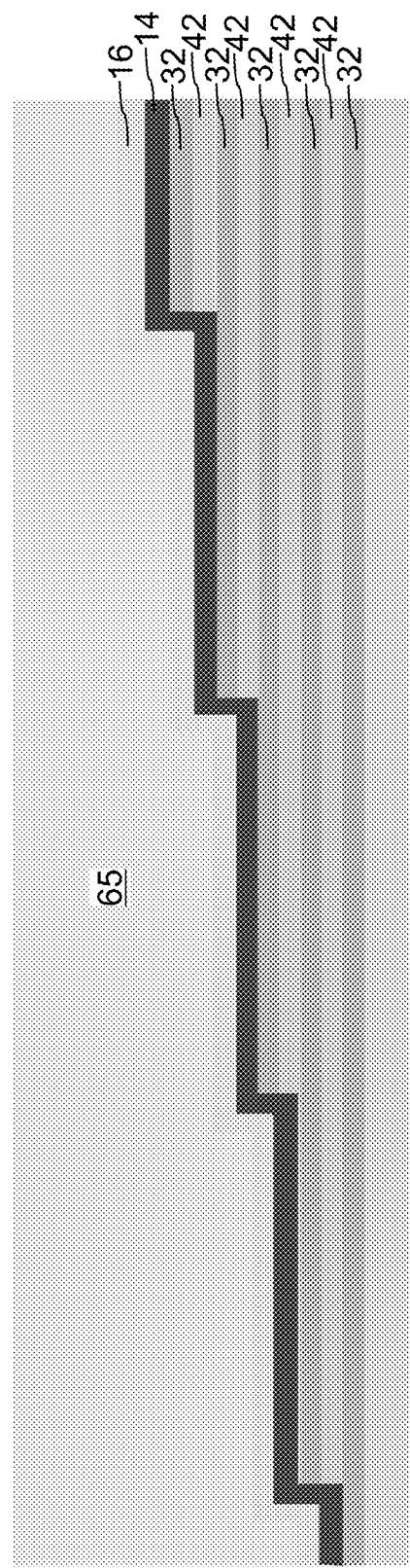

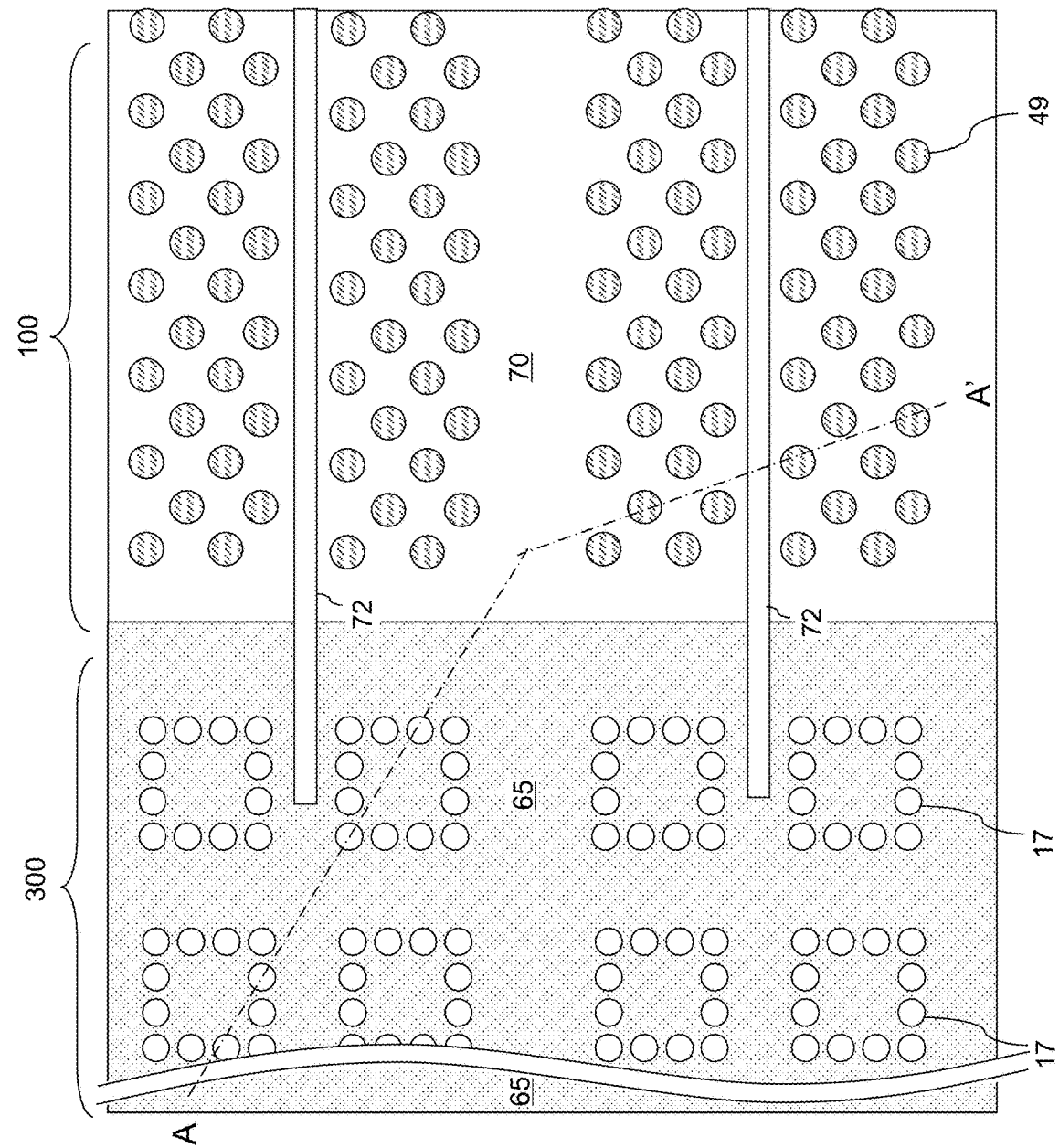

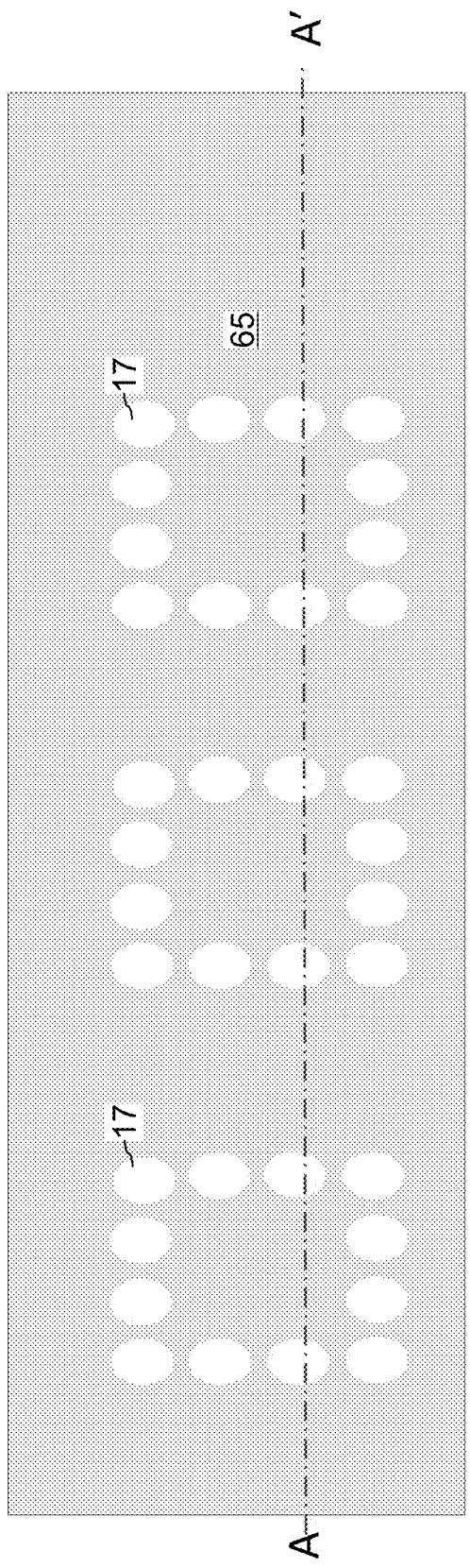
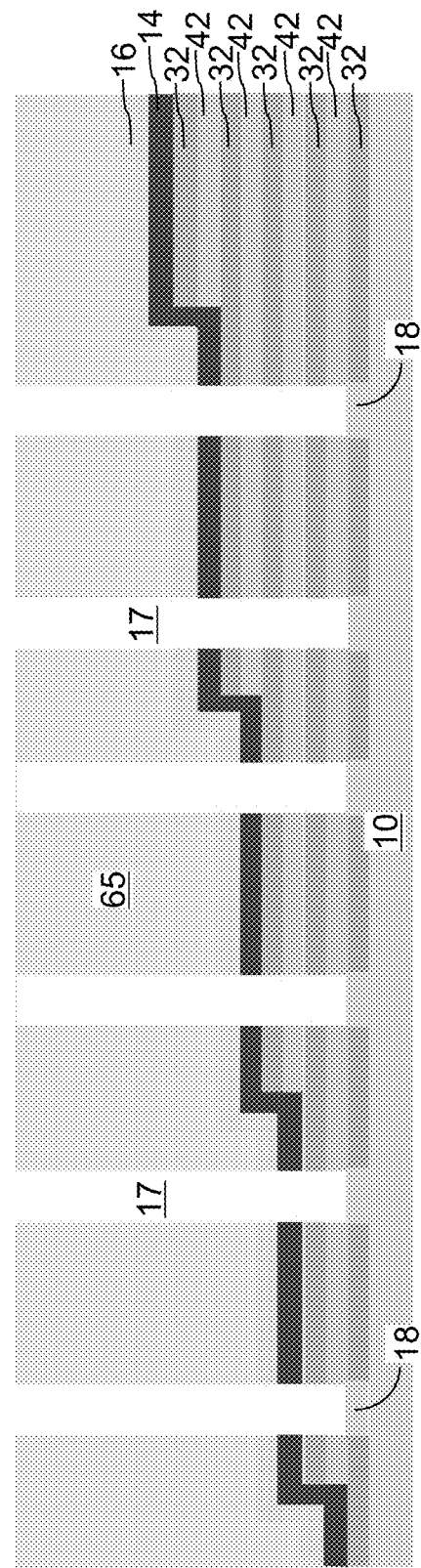
FIG. 8B
FIG. 8A

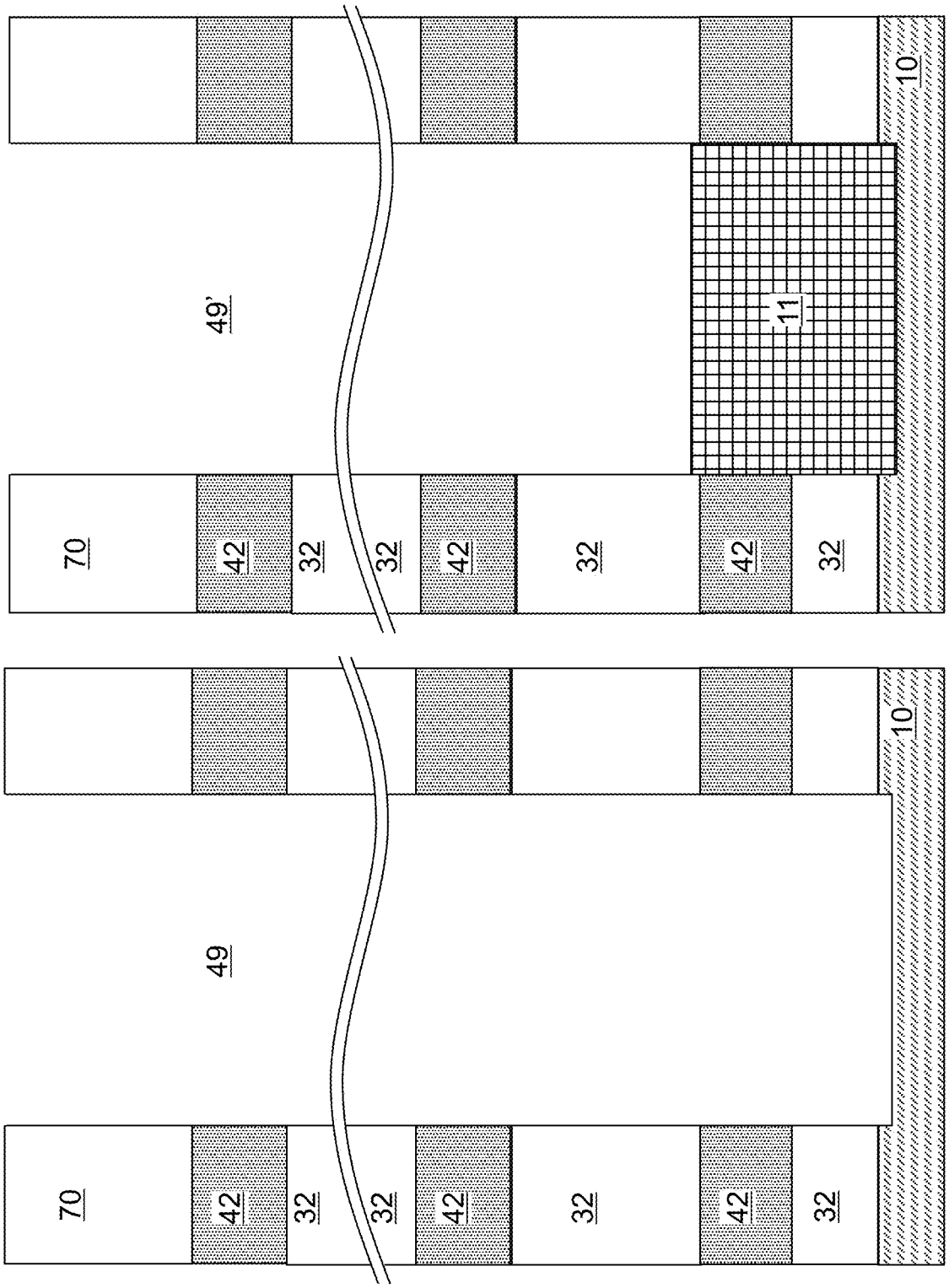

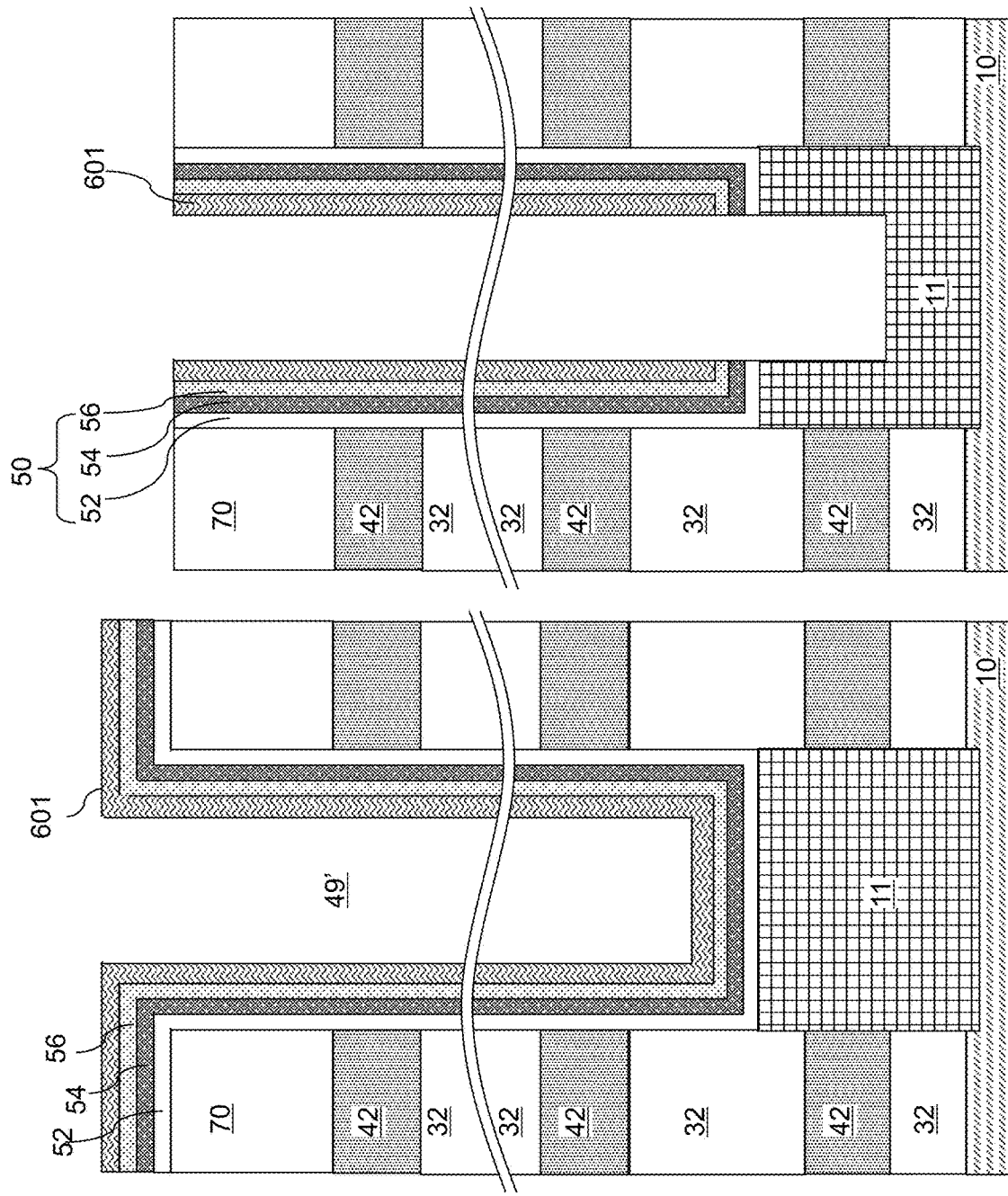

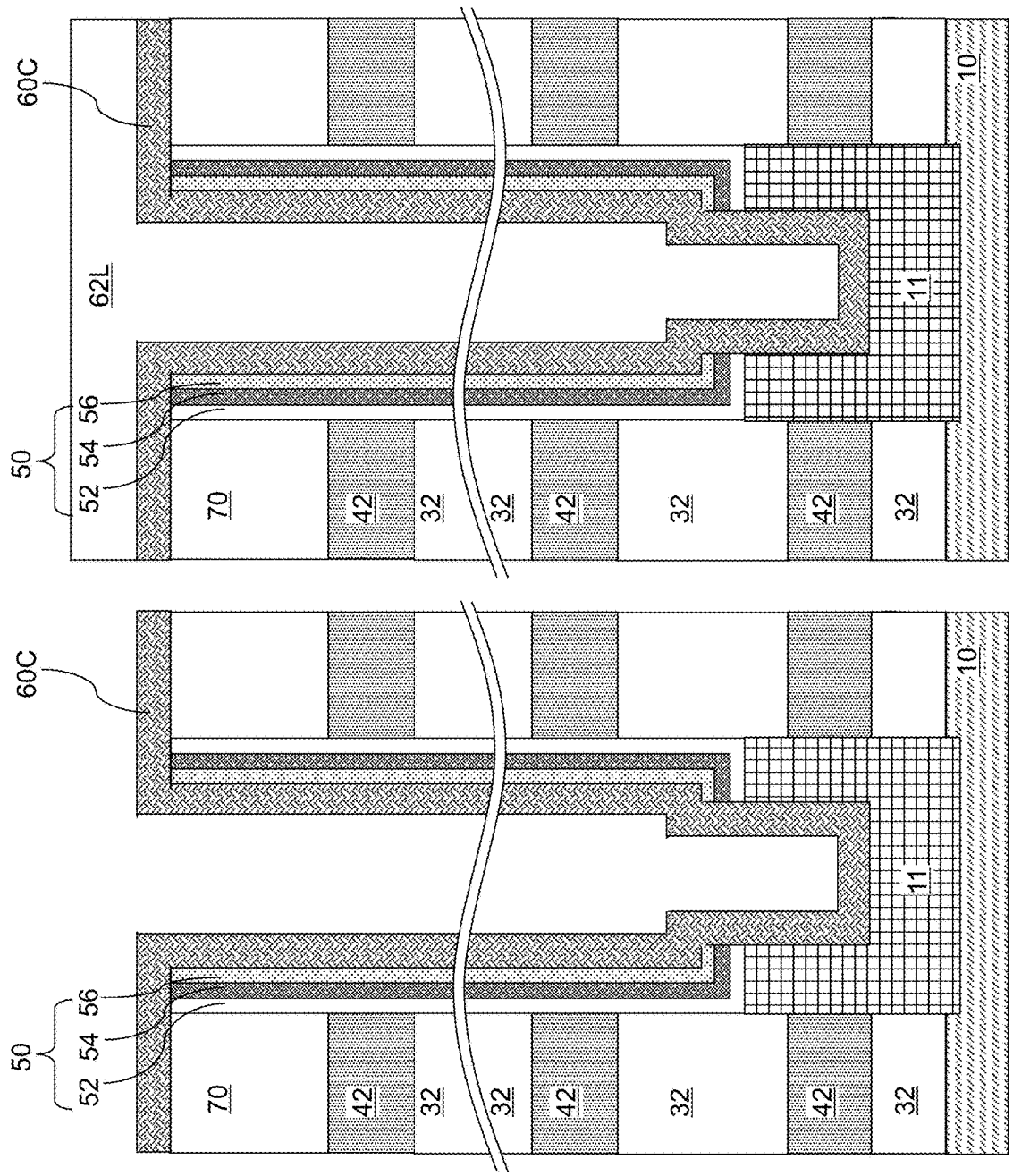

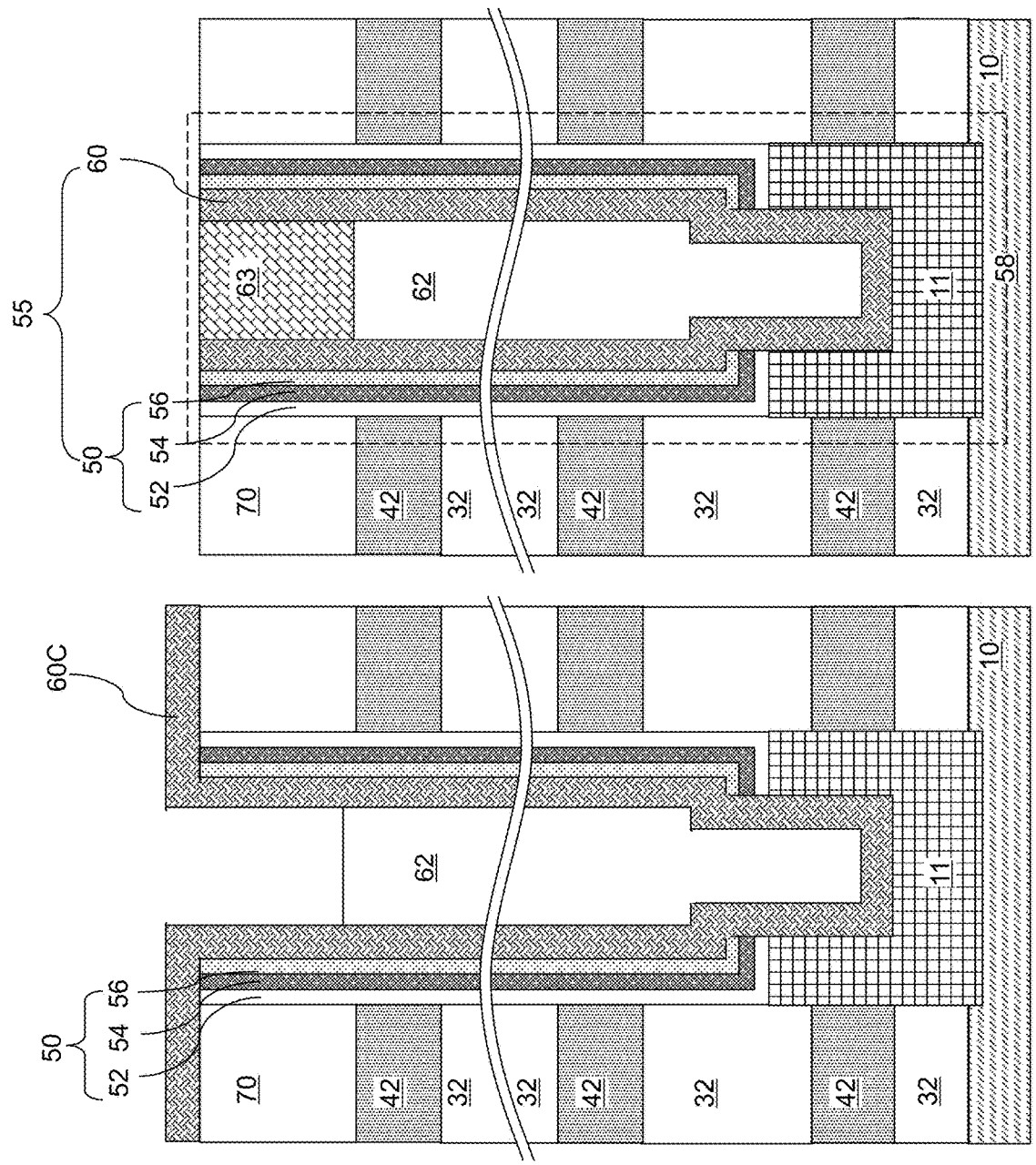

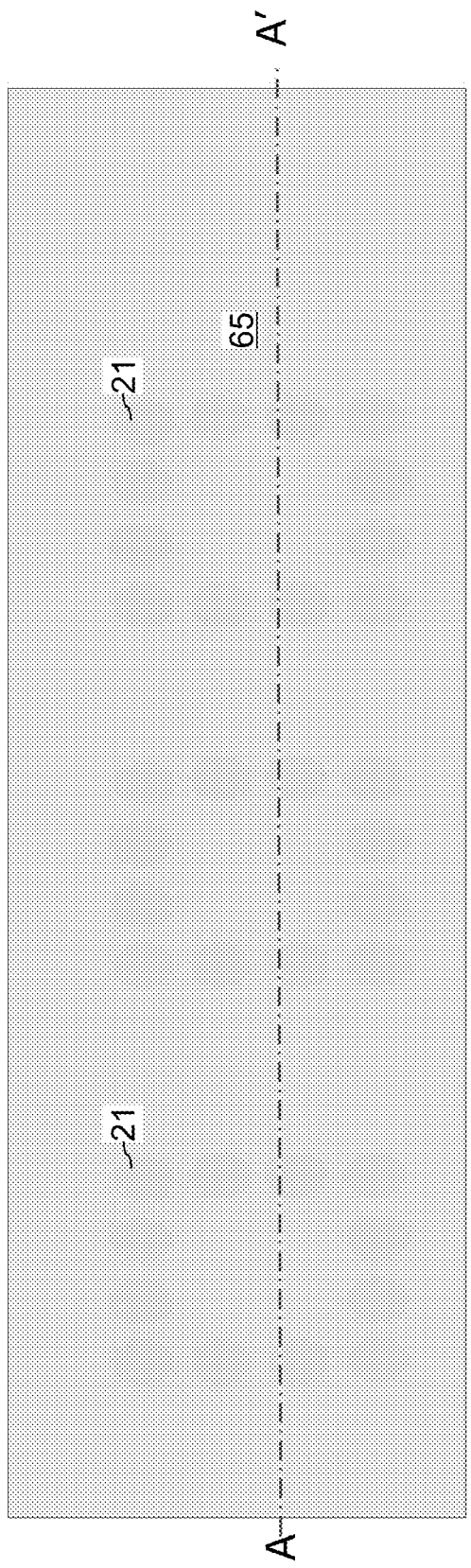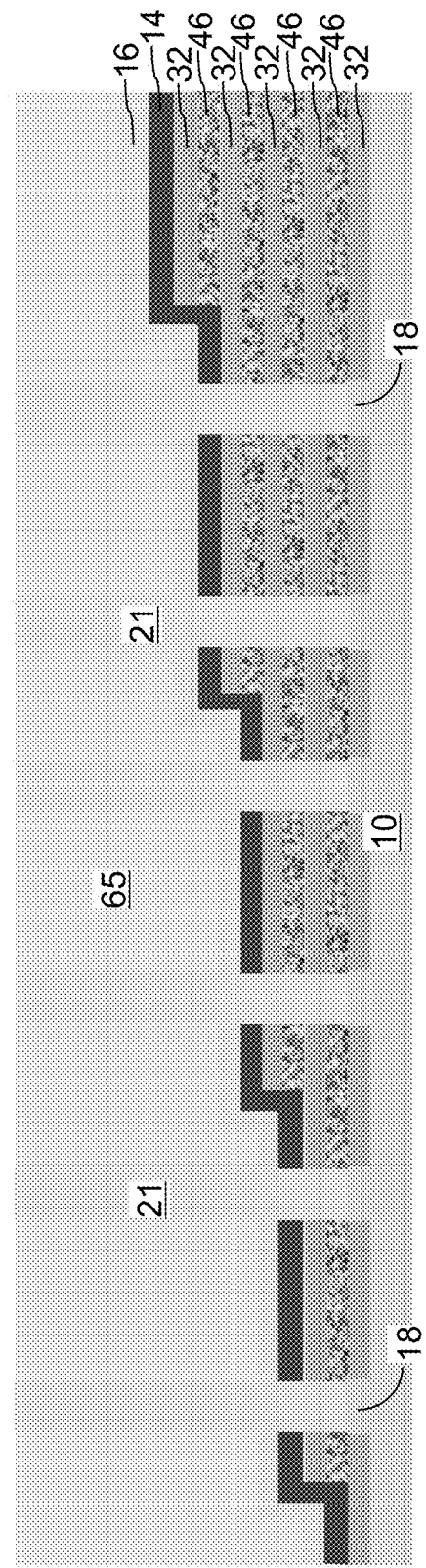
FIG. 19B
FIG. 19A

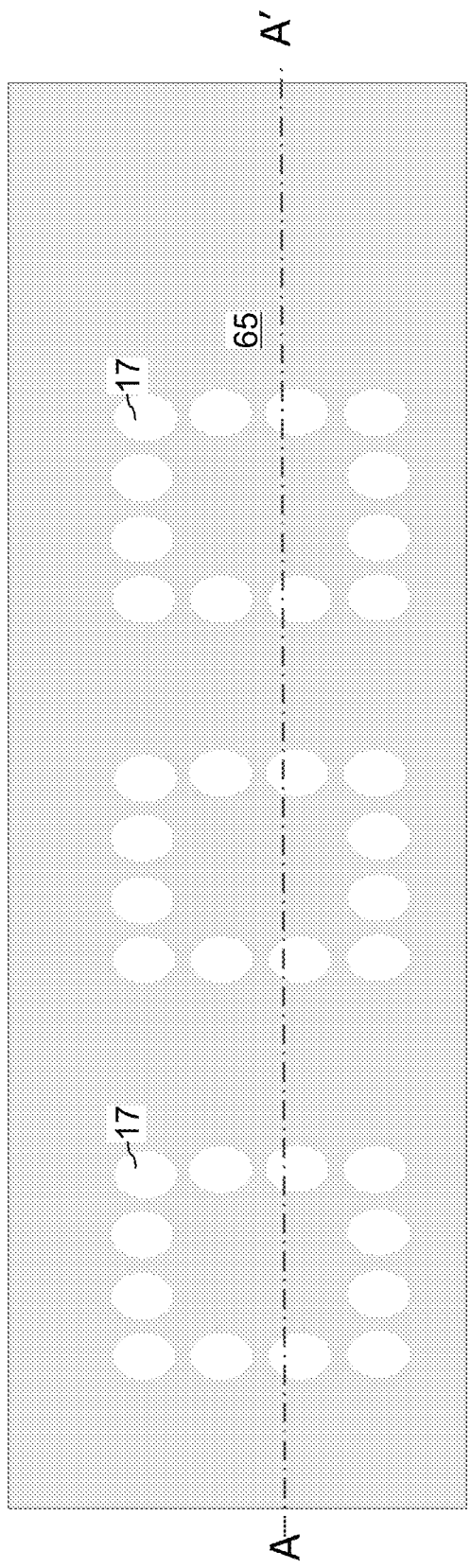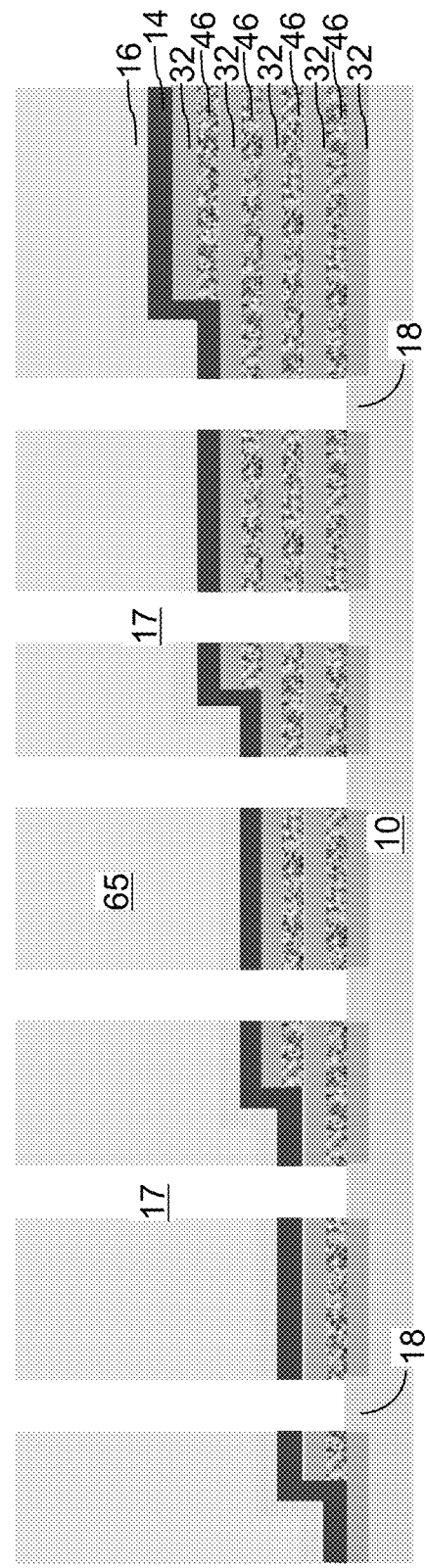
FIG. 20B
FIG. 20A

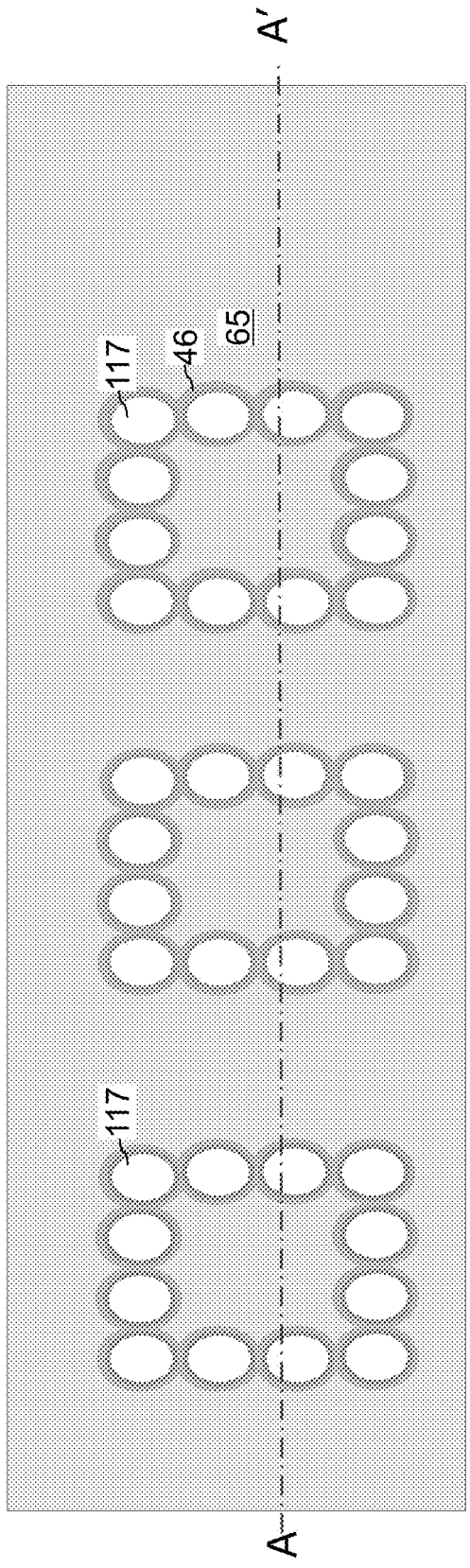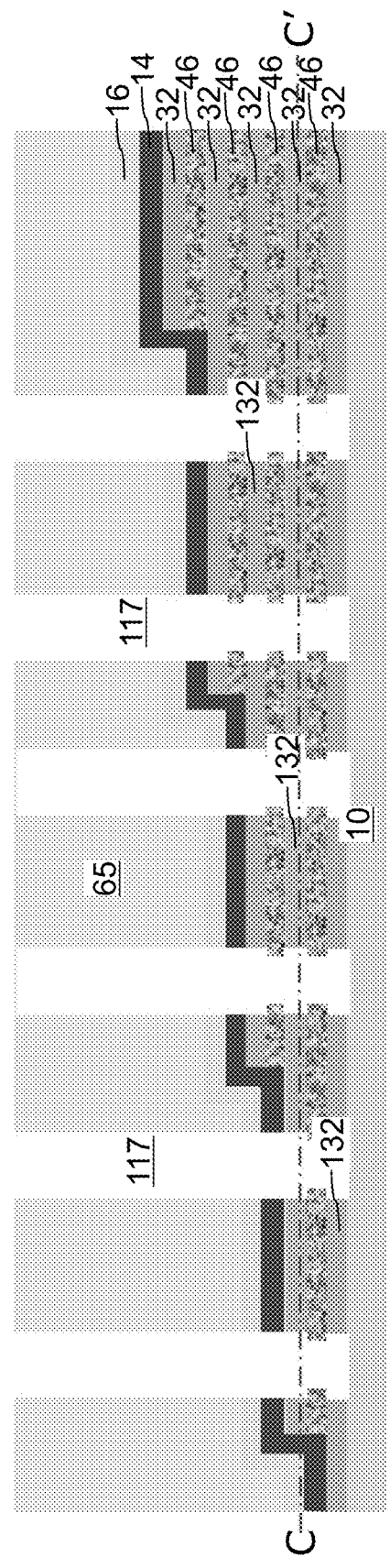
FIG. 21B
FIG. 21A

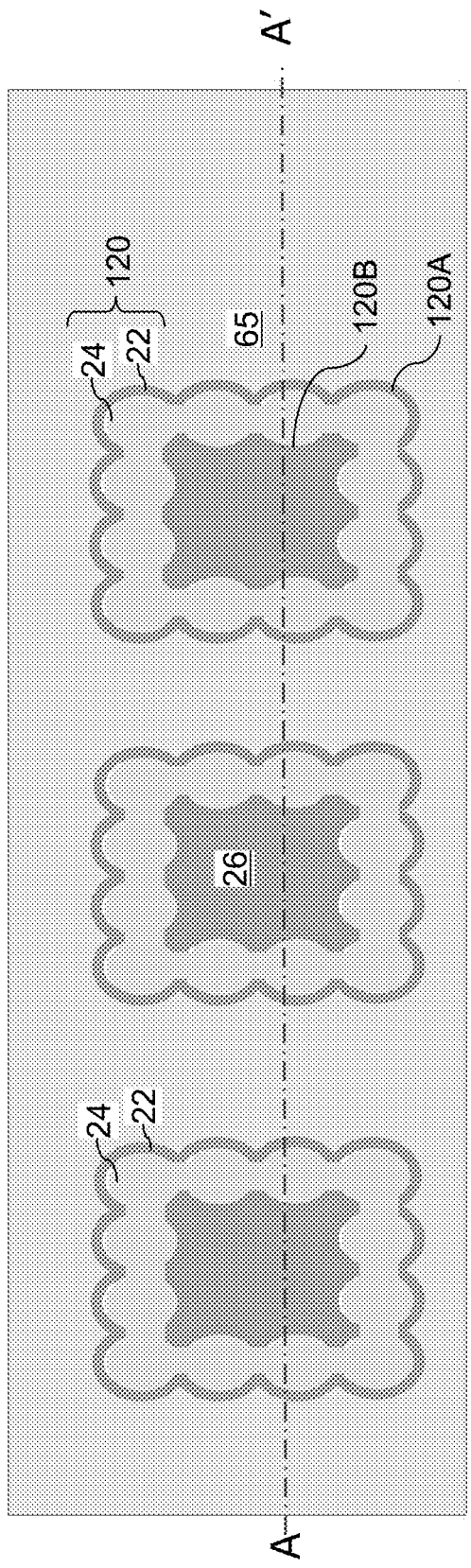
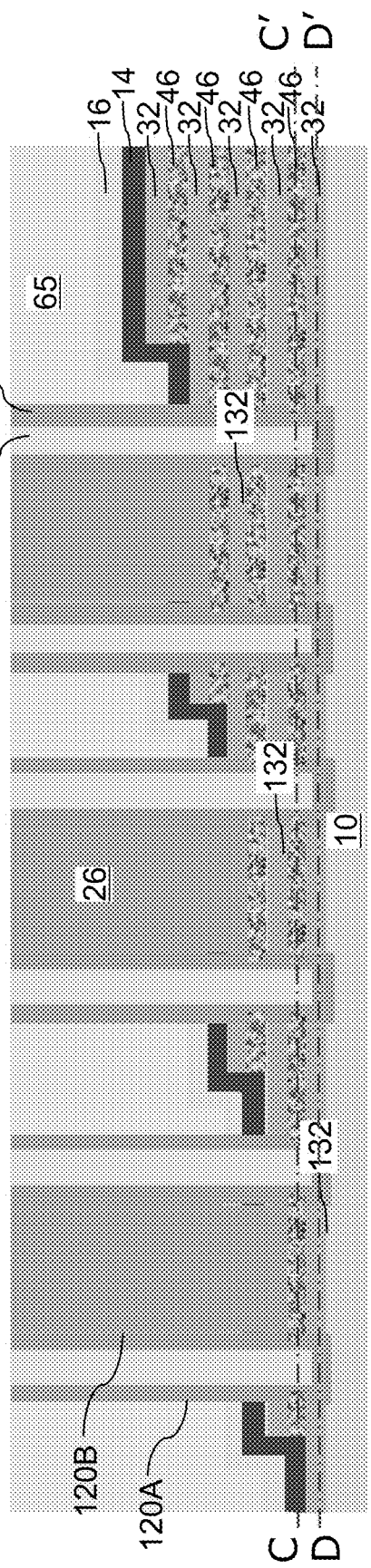
FIG. 29B
FIG. 29A

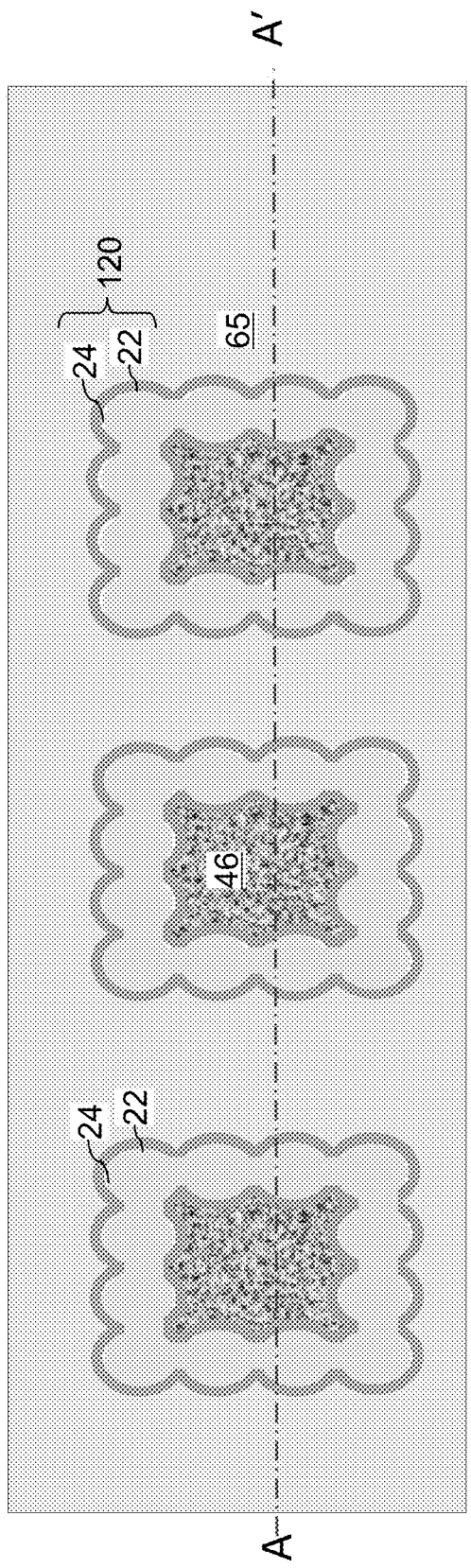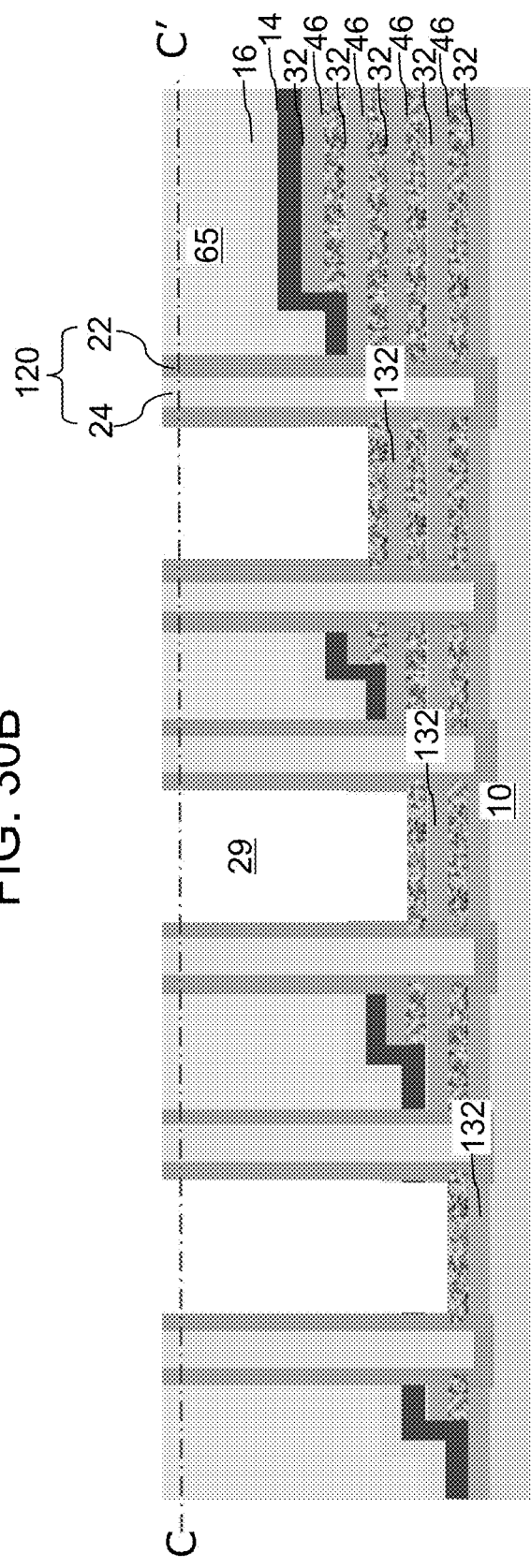

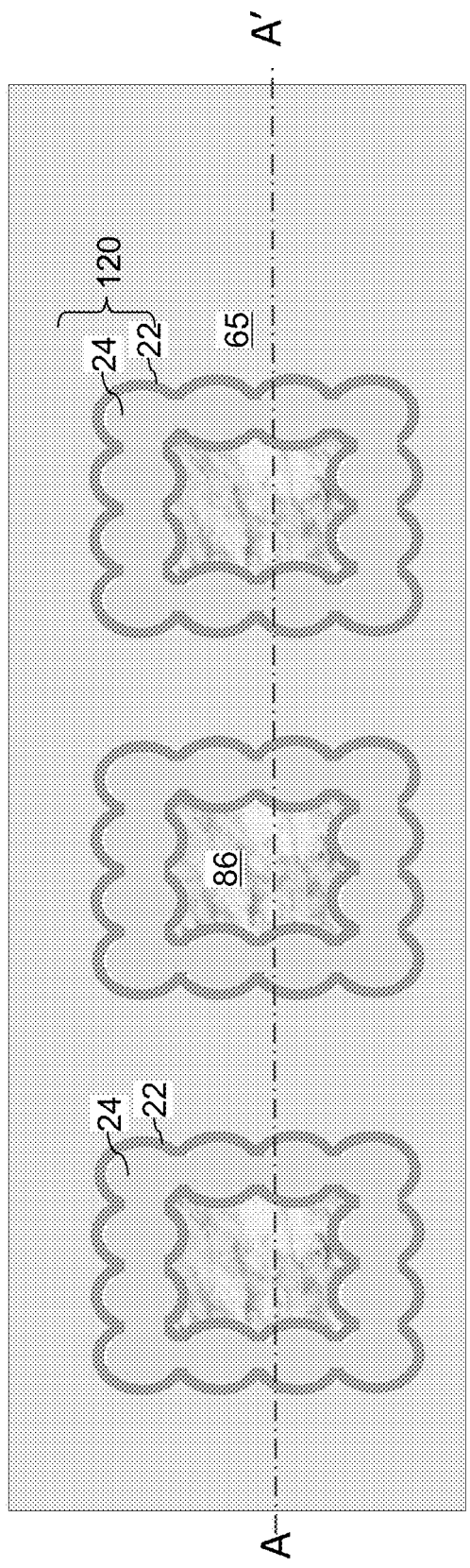
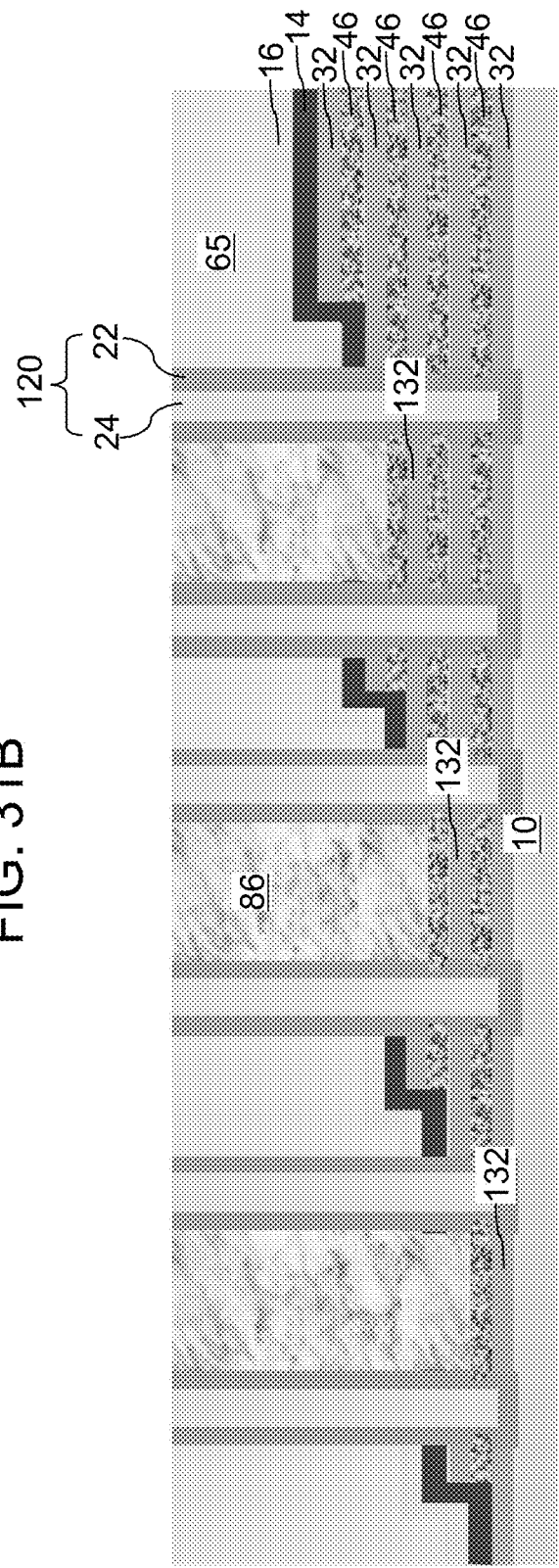
FIG. 31B
FIG. 31A

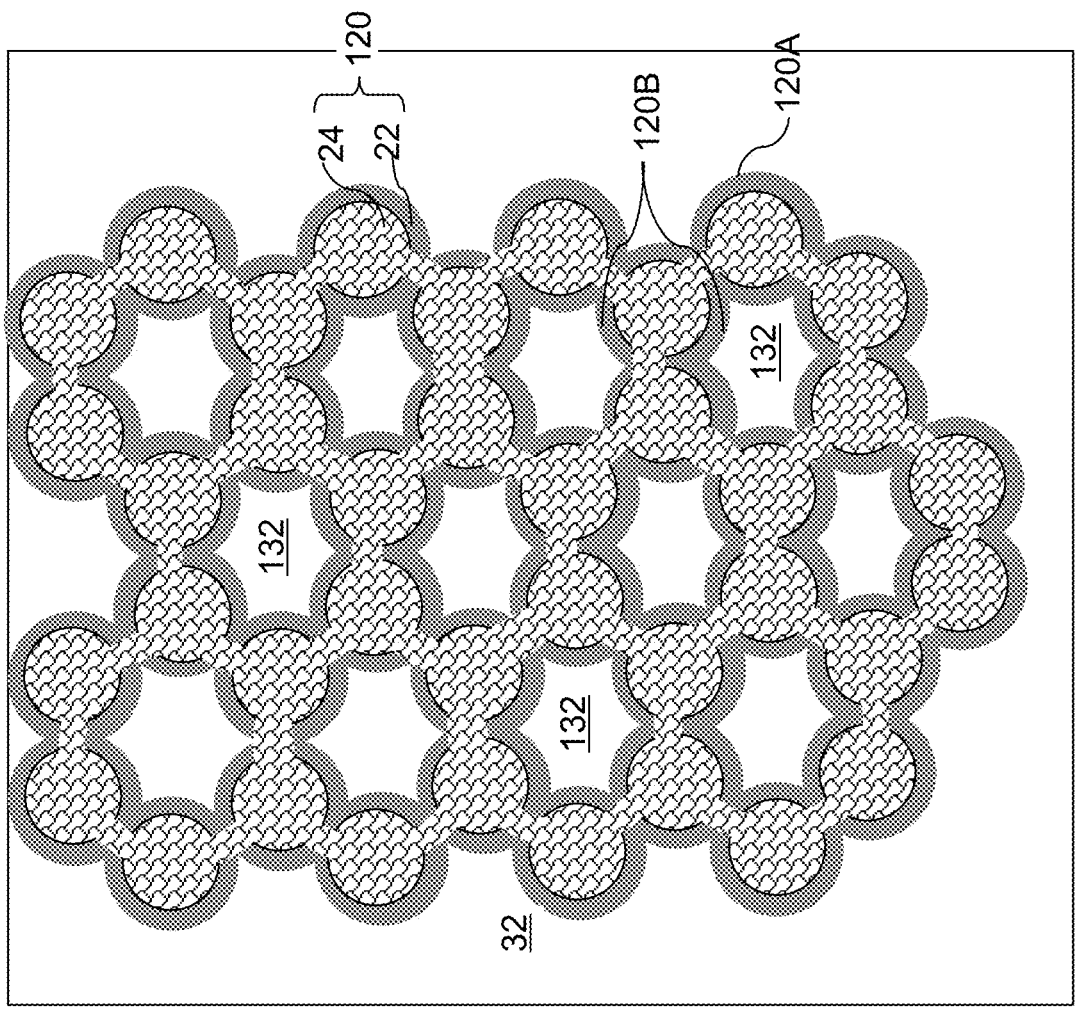

MEMORY DEVICE INCLUDING LATERALLY PERFORATED SUPPORT PILLAR STRUCTURES SURROUNDING CONTACT VIA STRUCTURES AND METHODS FOR FORMING THE SAME

FIELD

The present disclosure relates generally to the field of semiconductor devices, and particularly to a three-dimensional memory device including laterally perforated support pillar structures surrounding layer contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers and comprising stepped surfaces in a staircase region; memory stack structures vertically extending through the alternating stack and comprising a respective vertical stack of memory elements located at levels of the electrically conductive layers; a retro-stepped dielectric material portion overlying the stepped surfaces of the alternating stack; a laterally perforated support pillar structure located in the staircase region and including an outer sidewall, an inner sidewall laterally offset inward from the outer sidewall, and lateral openings at levels of a subset of the electrically conductive layers, wherein each electrically conductive layer within the subset of the electrically conductive layers extends from outside of an area defined by the outer sidewall through a respective subset of lateral openings into an area defined by the inner sidewall; and a layer contact via structure laterally surrounded by laterally perforated support pillar structure and contacting a top surface of a topmost electrically conductive layer of the subset of the electrically conductive layers.

According to another aspect of the present disclosure, a method of forming a three-dimensional memory device is provided, which comprises: forming an alternating stack of insulating layers and spacer material layers, wherein the spacer material layers are formed as, or are subsequently replaced with, electrically conductive layers; forming stepped surfaces by patterning the alternating stack; forming a retro-stepped dielectric material portion over the stepped surfaces; forming a set of sacrificial support pillar structures through the retro-stepped dielectric material portion and an underlying region of the alternating stack; forming memory stack structures comprising a respective vertical stack of memory elements through the alternating stack; forming support openings by removing the set of sacrificial support pillar structures; laterally expanding the support openings at levels of the insulating layers by selectively etching a material of the insulating layers without removing a material of the electrically conductive layers, wherein the support openings are interconnected at levels of a subset of the insulating layers to provide an interconnected support cavity; forming a laterally perforated support pillar structure by filling the interconnected support cavity with at least one fill material; and forming a layer contact via structure within the laterally perforated support pillar structure directly on a topmost electrically conductive layer exposed in a contact cavity in the laterally perforated support pillar structure.

BRIEF DESCRIPTION OF THE DRAWINGS

FIG. 2 is a schematic vertical cross-sectional view of the exemplary structure after formation of an alternating stack of insulating layers and sacrificial material layers according to an embodiment of the present disclosure.

FIG. 5A is a schematic vertical cross-sectional view of a staircase region of the exemplary structure after formation of a retro-stepped dielectric material portion according to an embodiment of the present disclosure.

FIG. 5B is a top-down view along the vertical plane A-A' of FIG. 5A.

FIG. 7B is a top-down view of the exemplary structure of FIG. 7A. The vertical plane A-A' is the plane of the cross-section for FIG. 7A.

FIG. 8A is a schematic vertical cross-sectional view of the exemplary structure after formation of semiconductor oxide plates according to an embodiment of the present disclosure.

FIG. 8B is a top-down view of the exemplary structure of FIG. 8A. The vertical plane A-A' is the plane of the cross-section for FIG. 8A.

FIGS. 11A-11H are sequential schematic vertical cross-sectional views of a memory opening within the exemplary structure during formation of a memory stack structure, an optional dielectric core, and a drain region therein according to an embodiment of the present disclosure.

FIG. 19A is a schematic vertical cross-sectional view of a staircase region of the exemplary structure at the processing steps of FIG. 18.

FIG. 19B is a top-down view of the exemplary structure of FIG. 19A. The vertical plane A-A' is the plane of the cross-section for FIG. 19A.

FIG. 20A is a schematic vertical cross-sectional view of a staircase region of the exemplary structure after removal of the sacrificial support pillar structures according to an embodiment of the present disclosure.

FIG. 20B is a top-down view of the exemplary structure of FIG. 20A. The vertical plane A-A' is the plane of the cross-section for FIG. 20A.

FIG. 21A is a schematic vertical cross-sectional view of a staircase region of the exemplary structure after isotropically recessing the insulating layers, the at least one etch stop liner, and the semiconductor oxide plates according to an embodiment of the present disclosure.

FIG. 21B is a top-down view of the exemplary structure of FIG. 21A. The vertical plane A-A' is the plane of the cross-section for FIG. 21A.

FIG. 29A is a schematic vertical cross-sectional view of a staircase region of the exemplary structure after a planarization process that removes horizontally-extending portions of the fill material layer and the dielectric liner layer according to an embodiment of the present disclosure.

FIG. 29B is a top-down view of the exemplary structure of FIG. 29A. The vertical plane A-A' is the plane of the cross-section for FIG. 29A.

FIG. 30A is a schematic vertical cross-sectional view of a staircase region of the exemplary structure after removal of the sacrificial via fill material portions according to an embodiment of the present disclosure.

FIG. 30B is a top-down view of the exemplary structure of FIG. 30A. The vertical plane A-A' is the plane of the cross-section for FIG. 30A.

FIG. 31A is a schematic vertical cross-sectional view of a staircase region of the exemplary structure after formation of layer contact via structures according to an embodiment of the present disclosure.

FIG. 31B is a top-down view of the exemplary structure of FIG. 31A. The vertical plane A-A' is the plane of the cross-section for FIG. 31A.

FIG. 35A is a horizontal cross-sectional view along the horizontal plane X-X' of FIG. 33C for a second configuration of the exemplary structure according to an embodiment of the present disclosure.

DETAILED DESCRIPTION

Figure 1:
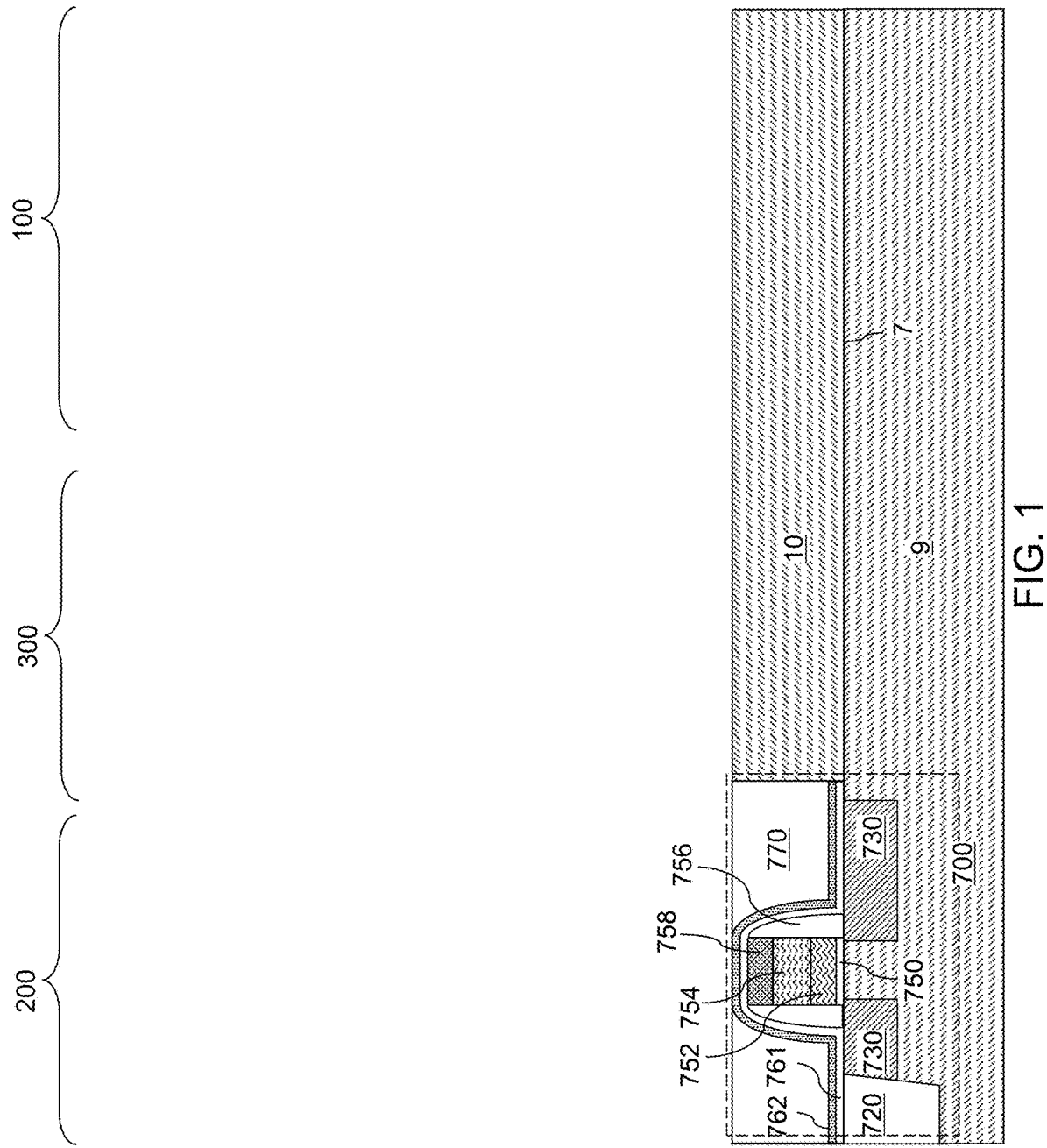
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a three-dimensional memory device including laterally perforated support pillar structures surrounding word line contact via structures and methods of manufacturing the same, the various aspects of which are described below. The embodiments a decreased amount of reactive ion etching used to form the contact cavities for the word line contact via structures. Thus, a higher number of word lines and memory cell layers may be formed in the device, while reducing process cost and contact cavity formation complexity. Furthermore, the word line leakage failure may be decreased or eliminated and the lateral size of the staircase region may be reduced to save chip space and increase device density. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3B:
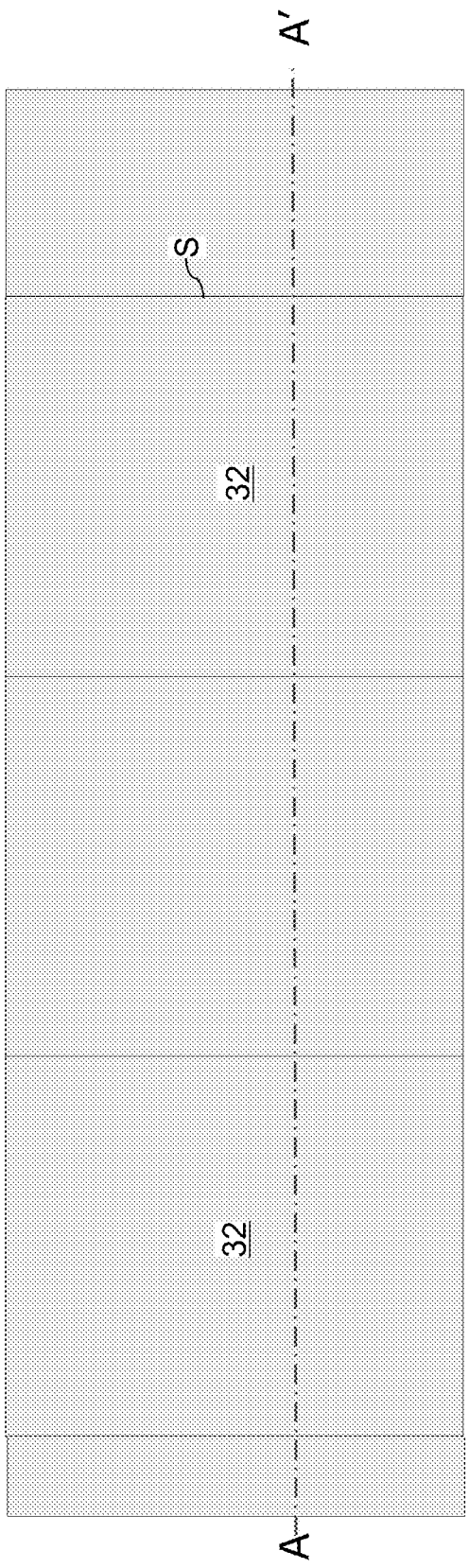
FIG. 3B is a top-down view along the vertical plane A-A' of FIG. 3A.
Figure 3A:
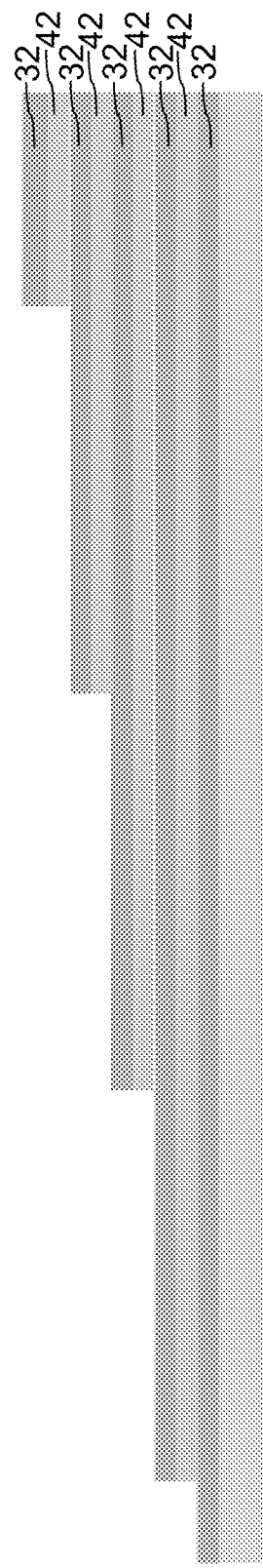
FIG. 3A is a schematic vertical cross-sectional view of a staircase region of the exemplary structure after formation of stepped surfaces according to an embodiment of the present disclosure.

Referring to FIGS. 3A and 3B, stepped surfaces are formed in the staircase region 300 of the exemplary structure. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The staircase region 300 can be located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42). In one embodiment, the stepped surfaces may include horizontal surfaces segments of the insulating layers 32 and sidewall segments of the insulating layers 32 and sacrificial material layers 42. In one embodiment, a vertical step of the stepped surfaces may include a sidewall segment of an insulating layer 32 and a sidewall segment of a sacrificial material layer 42 that are vertically coincident with each other, i.e., located within a same vertical plane.

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300. A stepped cavity is provided over the stepped surfaces. The stepped surfaces include a plurality of vertical steps S that are parallel to each other.

Figure 4B:
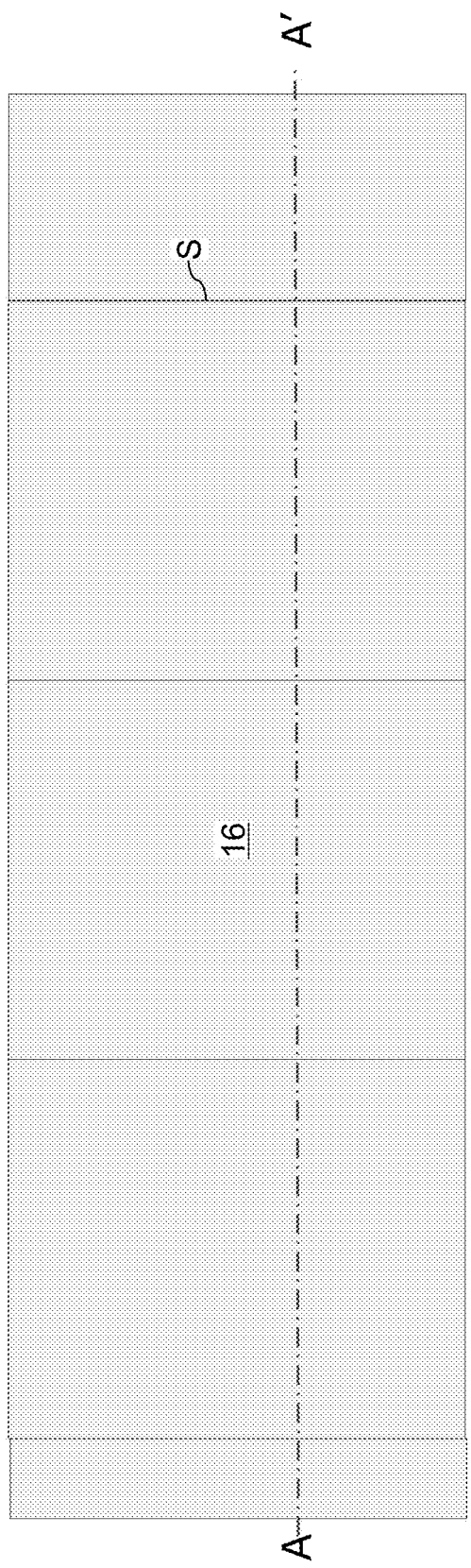
FIG. 4B is a top-down view along the vertical plane A-A' of FIG. 4A.
Figure 4A:
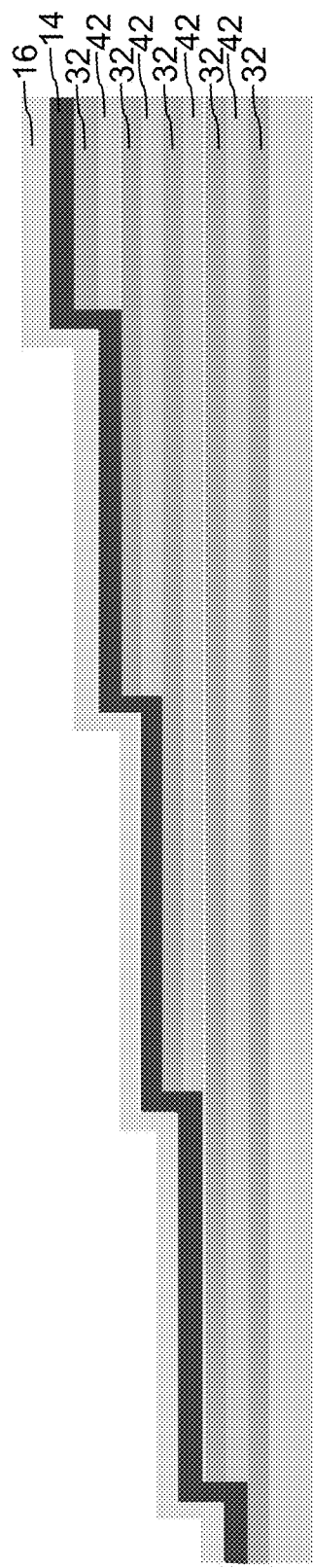
FIG. 4A is a schematic vertical cross-sectional view of a staircase region of the exemplary structure after formation of at least one etch stop liner on the stepped surfaces according to an embodiment of the present disclosure.

Referring to FIGS. 4A and 4B, at least one etch stop liner (14, 16) can be conformally deposited on the stepped surfaces. For example, the at least one etch stop liner (14, 16) may include a stack of a silicon oxide liner as a first etch stop liner 14 and a silicon nitride liner as a second etch stop liner 16. The thickness of each of the at least one etch stop liner (14, 16) may be in a range from 5 nm to 60 nm, although lesser and greater thicknesses may also be employed. The at least one etch stop liner (14, 16) may be employed to provide a self-limiting recess etch process in a subsequently processing step.

Figure 6:
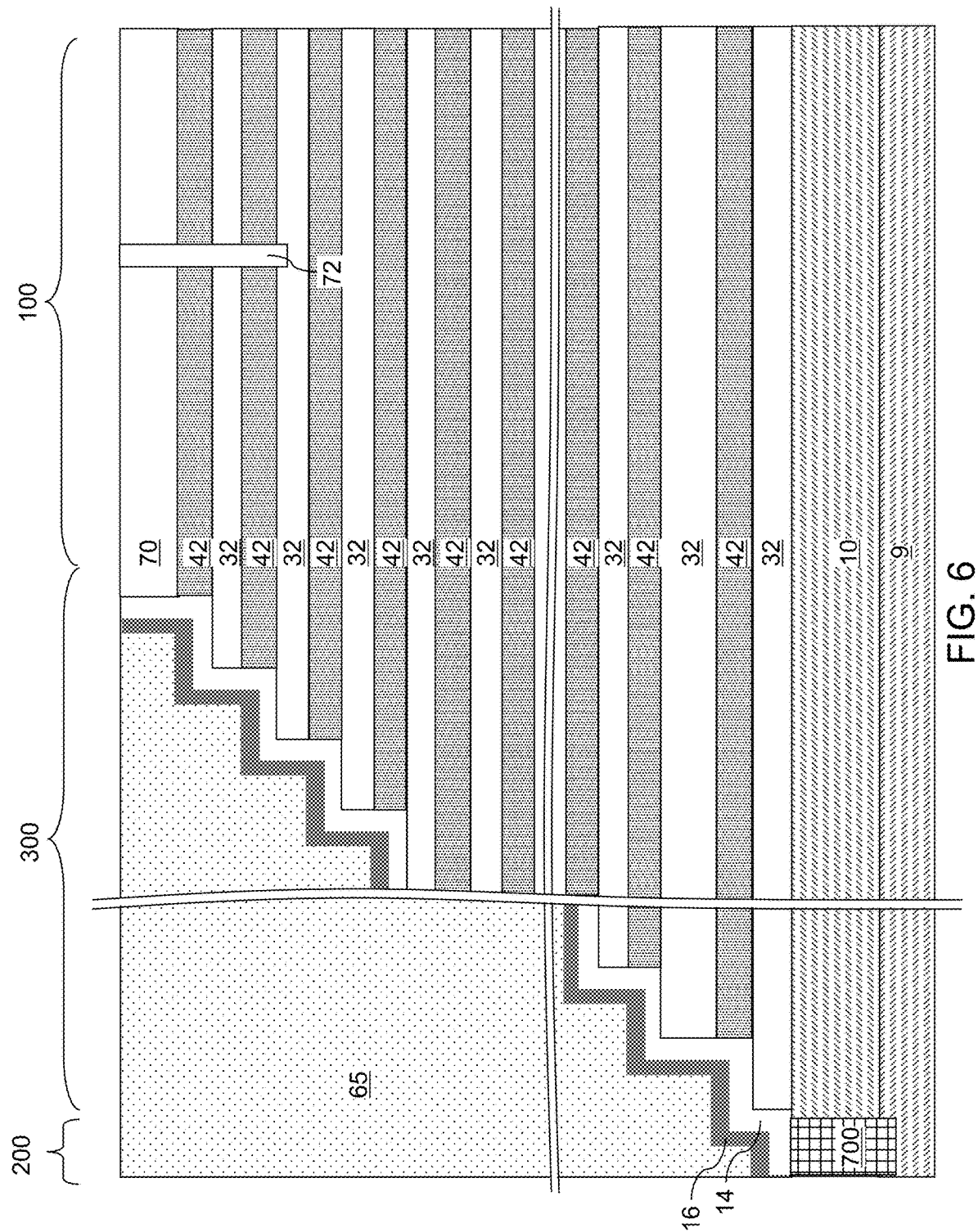
FIG. 6 is a schematic vertical cross-sectional view of the exemplary structure at the processing steps of FIGS. 5A and 5B.

Referring to FIGS. 5A, 5B, and 6, an insulating fill material can be deposited over the at least one etch stop liner (14, 16). The insulating fill material may include a planarizable dielectric material such as undoped silicate glass or a doped silicate glass. Excess portions of the insulating fill material and the at least one etch stop liner (14, 16) can be removed from above the horizontal plane including top surface of the insulating cap layer 70, for example, by chemical mechanical planarization (CMP). A remaining portion of the insulating fill material filling the stepped cavity constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70. Alternatively, the drain-select-level isolation structures 72 can be formed at a later step in the process.

Referring to FIGS. 7A-7D, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 17. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 17 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 17 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 17 can be substantially vertical, or can be tapered. The patterned lithographic material stack can be subsequently removed, for example, by ashing.

The memory openings 49 and the support openings 17 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 17. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 17 can be coplanar with the topmost surface of the semiconductor material layer 10. The lateral dimension, such as a diameter, of each of the memory openings 49 and the support openings 17 may be in a range from 30 nm to 300 nm, such as from 60 nm to 150 nm, although lesser and greater lateral dimensions may also be employed.

Each of the memory openings 49 and the support openings 17 may include a sidewall (or a plurality of sidewalls) that extends substantially perpendicular to the topmost surface of the substrate. A two-dimensional array of memory openings 49 can be formed in the memory array region 100.

According to an aspect of the present disclosure, the support openings 17 can be formed in groups that define a respective contact area. Each group of support openings 17 can be arranged along a periphery of a two-dimensional closed shape such as a square, a rectangle, a circle, an ellipse, or any two-dimensional shape having a closed periphery. The support openings 17 within each group of support openings 17 can be laterally spaced from each other such that each spacing between neighboring pairs of support openings 17 is in a range from 10% to 100%, such as from 20% to 70%, of a maximum lateral dimension of a support opening 17. While FIGS. 7A-7D illustrate a configuration in which the two-dimensional closed shape is a square, and each group of support openings 17 arranged along a periphery of the two-dimensional closed shape includes twelve support openings 17, embodiments are expressly contemplated herein in which the two-dimensional closed shape is any polygon or any curvilinear two-dimensional shape, and the total number of support openings 17 arranged along a periphery of a two-dimensional shape is in a range from 3 to 24, such as from 8 to 12.

Referring to FIGS. 8A and 8B, an oxidation process can be performed to convert physically exposed surface portions of the semiconductor material layer 10 into semiconductor oxide plates 18. The oxidation process may include a thermal oxidation process or a plasma oxidation process. The thickness of each semiconductor oxide plate 18 may be in a range from 4 nm to 30 nm, although lesser and greater thicknesses may also be employed.

Figure 9B:
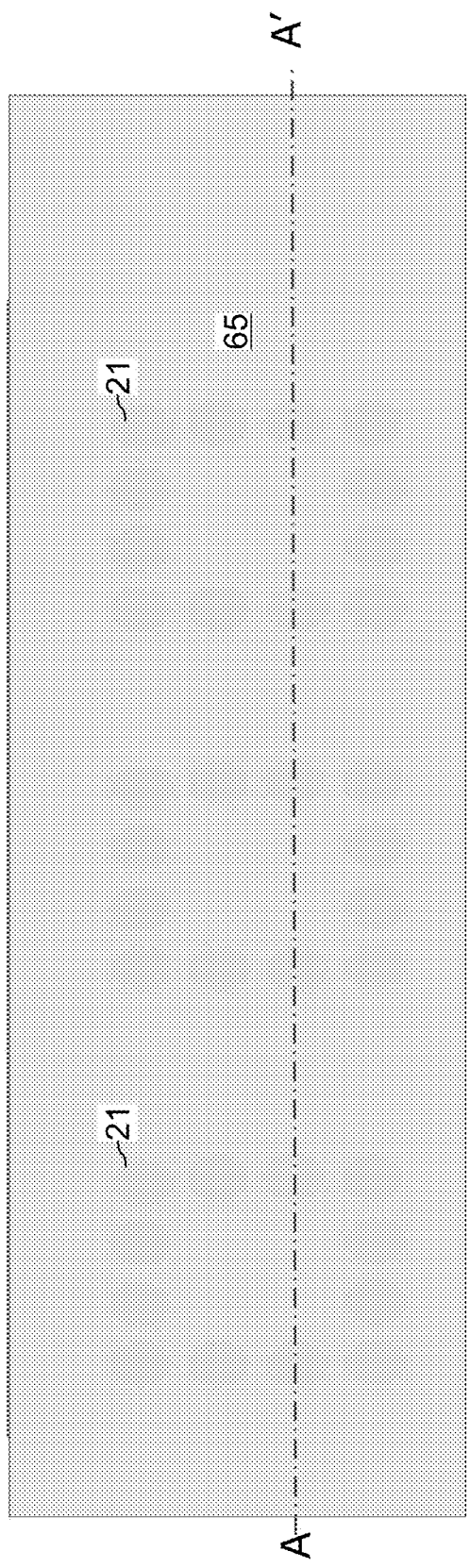
FIG. 9B is a top-down view of the exemplary structure of FIG. 9A. The vertical plane A-A' is the plane of the cross-section for FIG. 9A.
Figure 9A:
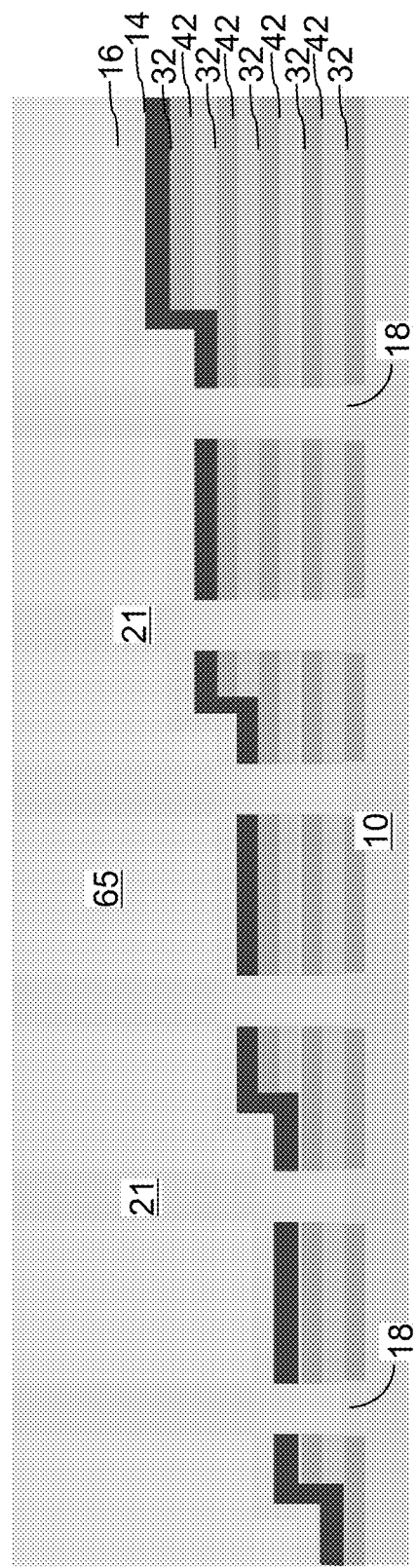
FIG. 9A is a schematic vertical cross-sectional view of a staircase region of the exemplary structure after formation of sacrificial support pillar structures and sacrificial memory opening fill structures according to an embodiment of the present disclosure.

Referring to FIGS. 9A and 9B, a sacrificial fill material can be deposited in the support openings 17 and the memory openings 49. The sacrificial fill material includes a material that can be subsequently removed selective to the materials of the insulating layers 32, the at least one etch stop liner (14, 16), and the retro-stepped dielectric material portion 65. For example, the sacrificial fill material may include a semiconductor material such as amorphous silicon, polysilicon, or a silicon-germanium alloy, or a carbon-based material such as amorphous carbon or diamond-like carbon, or a dielectric material, such as organosilicate glass, or a polymer material. Excess portions of the sacrificial fill material can be removed from above the horizontal plane including the top surface of the insulating cap layer 70 by a planarization process, which may employ a recess etch process or a chemical mechanical polishing (CMP) process. Each remaining portion of the sacrificial fill material filling the support openings 17 constitutes a sacrificial support pillar structure 21. Each remaining portion of the sacrificial fill material filling the memory openings 49 constitutes a sacrificial memory opening fill structure (not illustrated). The sacrificial support pillar structures 21 are discrete structures that do not contact one another. A set of sacrificial support pillar structures 21 can be formed through the retro-stepped dielectric material portion 65 and an underlying region of the alternating stack (32, 42) that underlie the stepped surfaces.

Figure 10A:
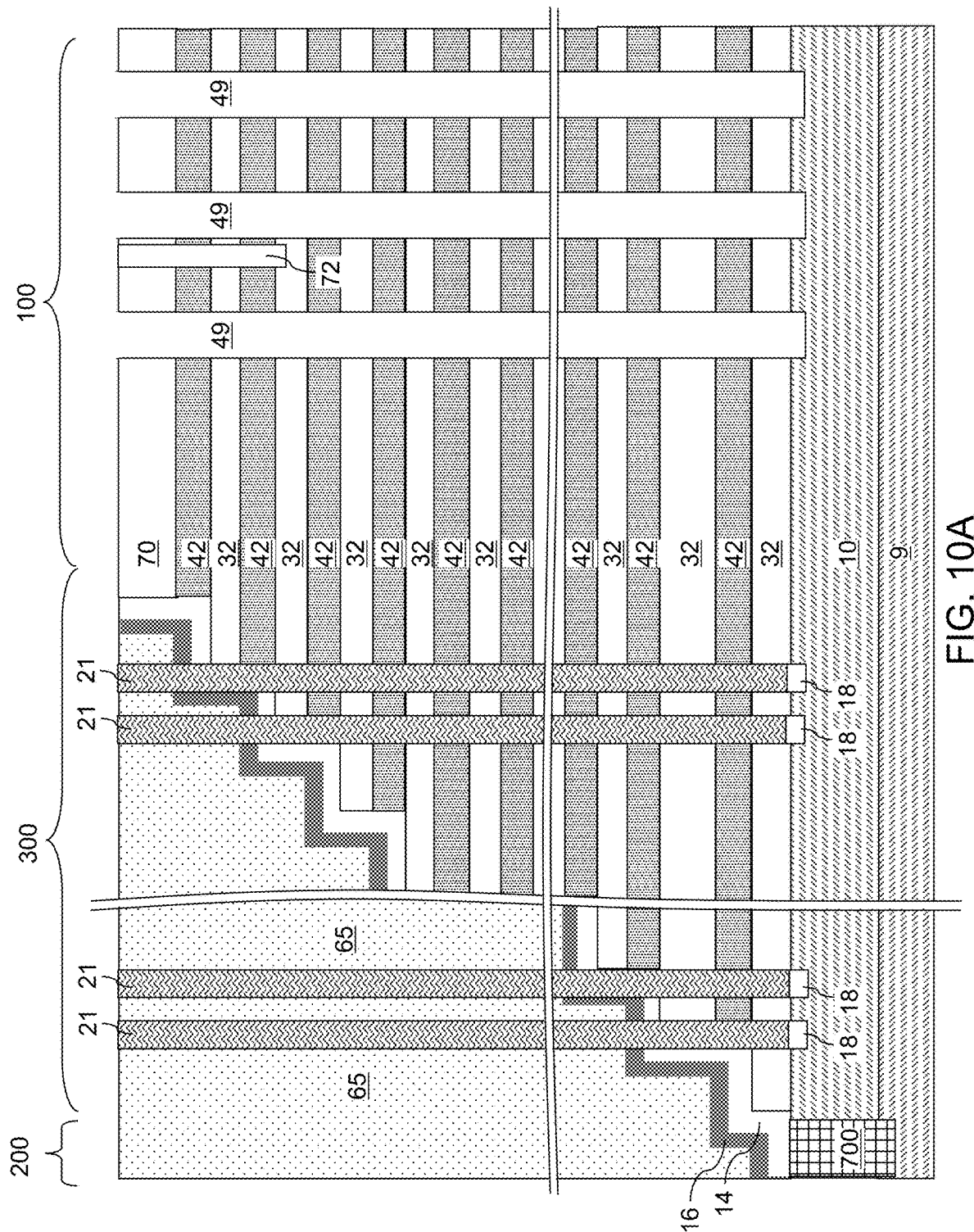
FIG. 10A is a schematic vertical cross-sectional view of the exemplary structure after removal of sacrificial memory opening fill structures from the memory openings according to an embodiment of the present disclosure.
Figure 10B:
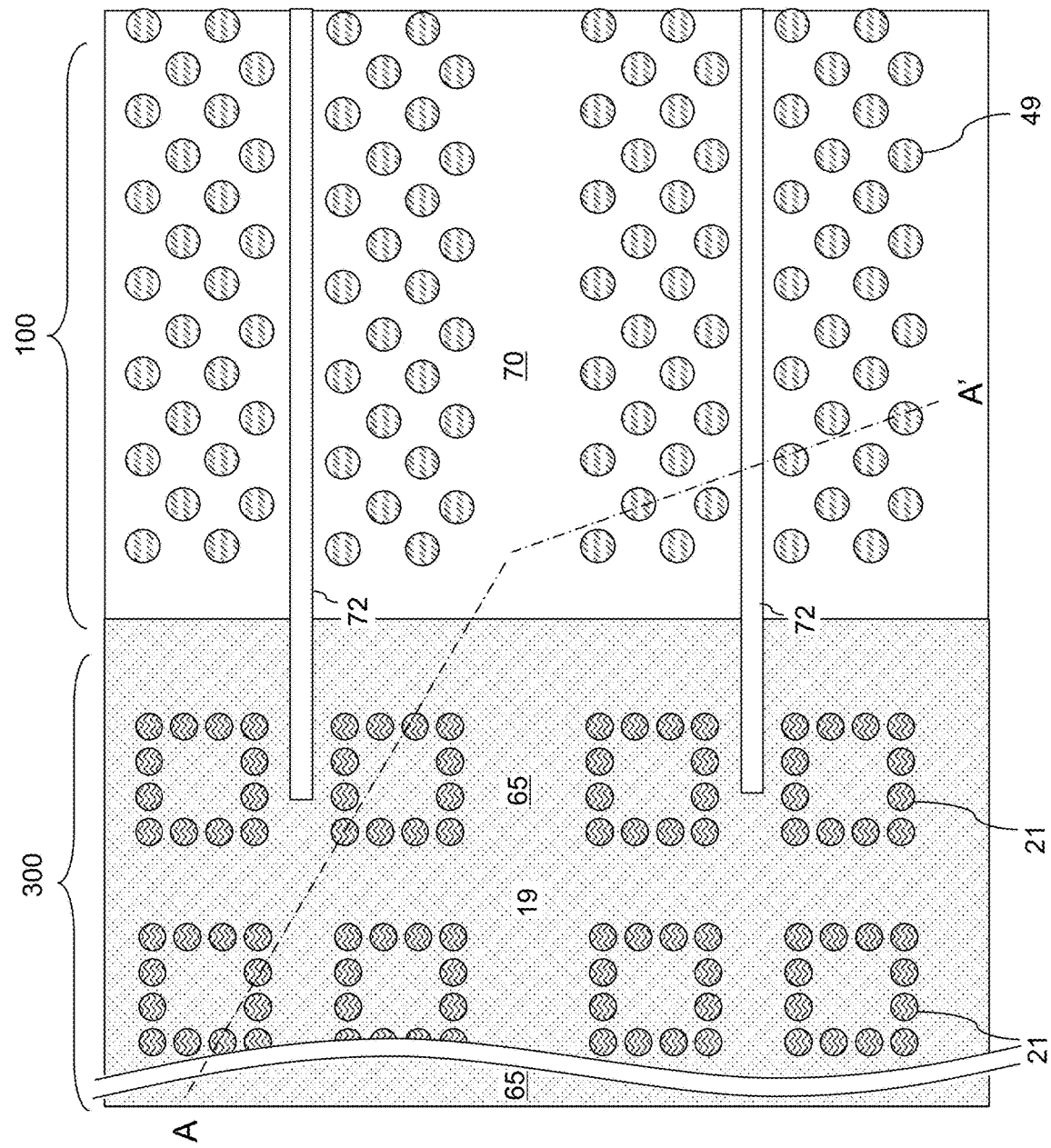
FIG. 10B is a top-down view of the exemplary structure of FIG. 10A. The vertical plane A-A' is the plane of the cross-section for FIG. 10A.

Referring to FIGS. 10A and 10B, a patterned etch mask layer (not shown), such as a patterned photoresist layer, can be formed over the retro-stepped dielectric material portion 65. The patterned etch mask layer can cover each of the sacrificial support pillar structures 21, and does not cover the sacrificial memory opening fill structures. An etch process can be performed, which has an etch chemistry that etches the material of the of the sacrificial memory opening fill structures selective to the materials of the alternating stack (32, 42) and the semiconductor oxide plates 18. For example, if the sacrificial memory opening fill structures comprise amorphous silicon or polysilicon, then a wet etch process using hot trimethyl-2 hydroxyethyl ammonium hydroxide ("hot TMY") or tetramethyl ammonium hydroxide (TMAH) may be performed to remove the sacrificial memory opening fill structures. Subsequently, the semiconductor oxide plates 18 can be removed by performing an isotropic etch process or an anisotropic etch process (such as a reactive ion etch process). The patterned etch mask layer can be subsequently removed, for example, by ashing. Cavities are formed within the volumes of the memory openings 49, and top surfaces of the semiconductor material layer 10 are physically exposed underneath the memory openings 49.

Figure 7A:
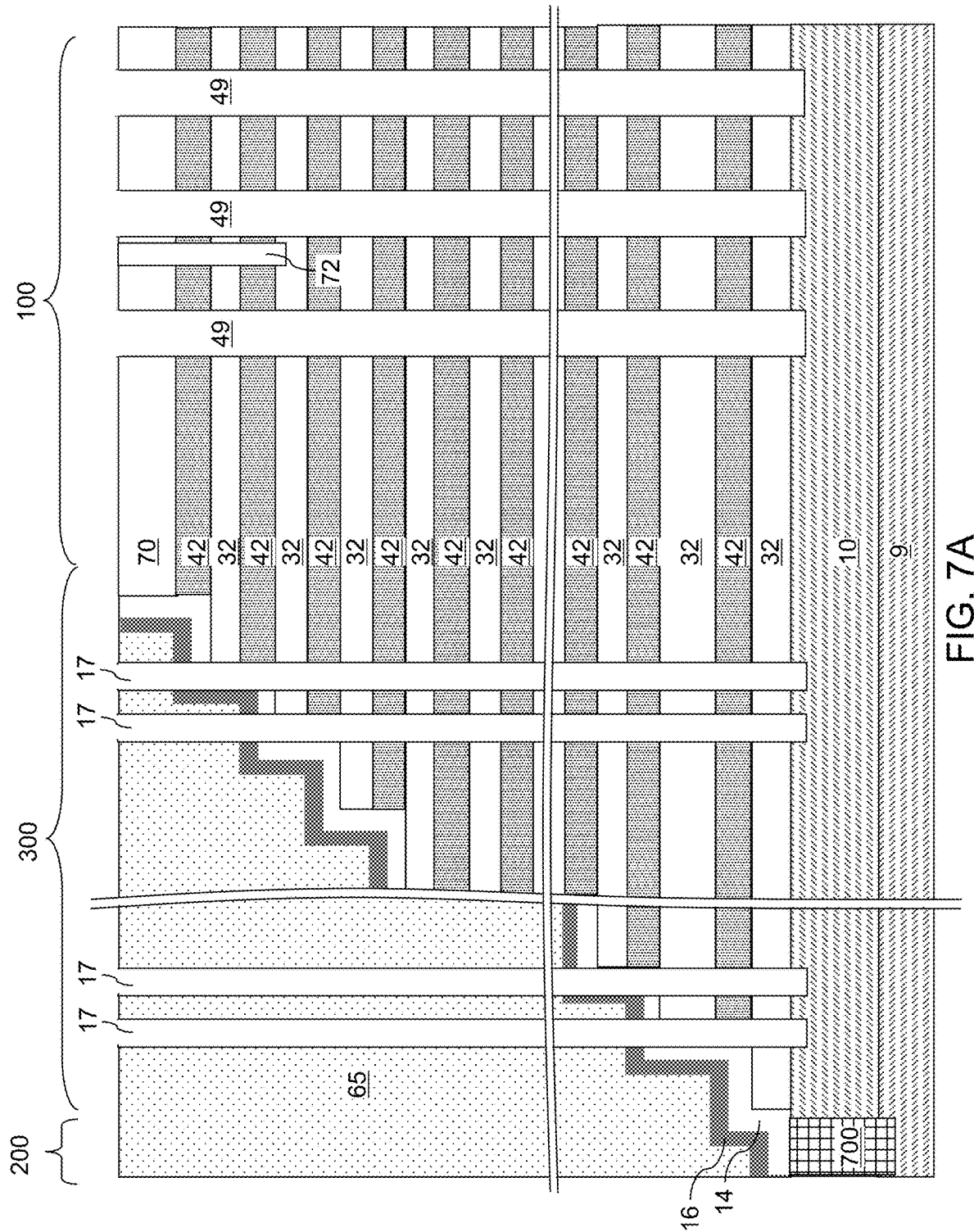
FIG. 7A is a schematic vertical cross-sectional view of the exemplary structure after formation of memory openings and support openings according to an embodiment of the present disclosure.
Figure 7D:
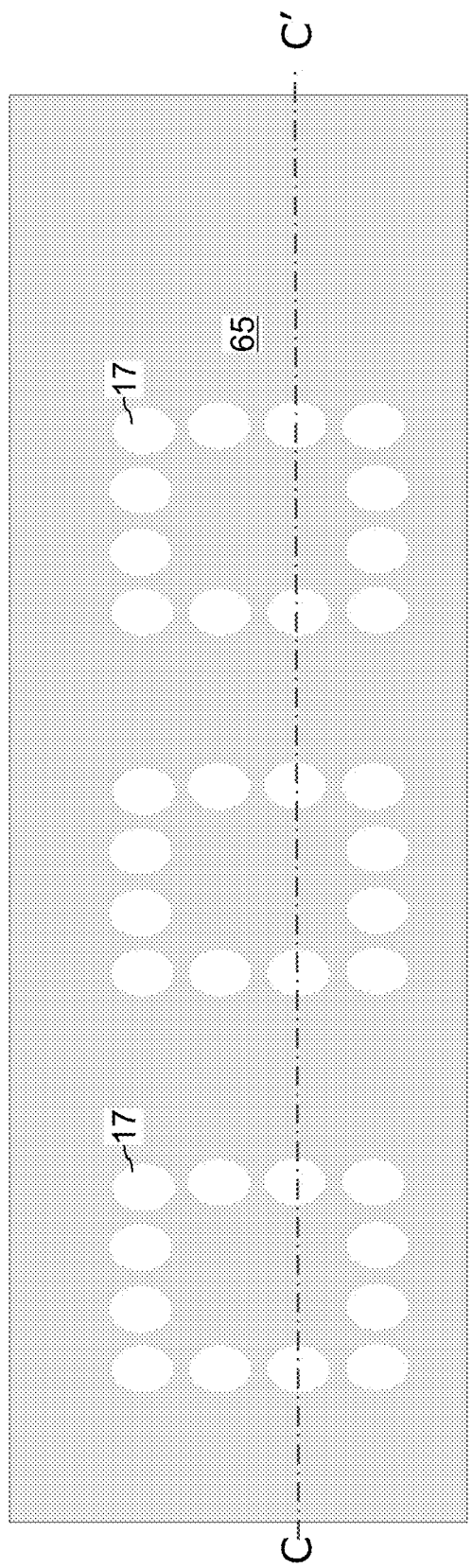
FIG. 7D is a top-down view along the vertical plane C-C' of FIG. 7C.
Figure 7C:
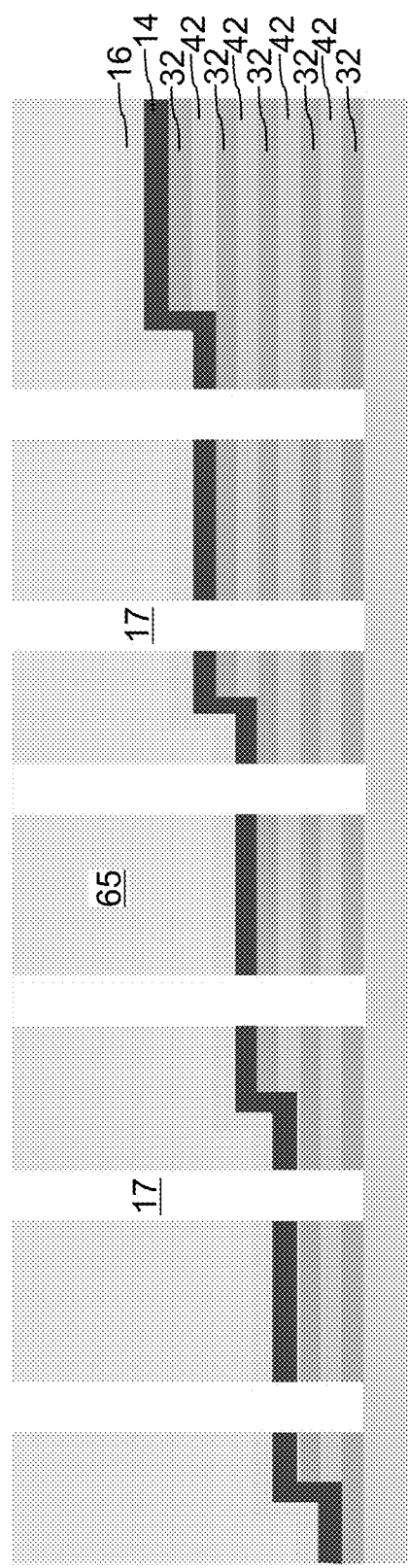
FIG. 7C is a schematic vertical cross-sectional view of a staircase region of the exemplary structure of FIG. 7A.

FIGS. 11A-11H illustrate structural changes in a memory opening 49, which is one of the memory openings 49 in the exemplary structure of FIGS. 7A and 7B.

Referring to FIG. 11A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 11B, an optional pedestal channel portion (e.g., an epitaxial pedestal) 11 can be formed at the bottom portion of each memory opening 49, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 11C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride or a conductive floating gate material, such as polysilicon or a metallic material, a ferroelectric material that can store information in the form of a ferroelectric polarization direction (e.g., non-centrosymmetric orthorhombic phase of hafnium oxide doped with Zr, Si and/or Al), or any other memory material that can store data by altering its electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment in which the memory material layer 54 comprises an insulating charge trapping material, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 11D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 11E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 11F, in case the memory cavity 49' in each memory opening is not completely filled by the semiconductor channel layer 60C, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 11G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 11H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60 and a memory film 50. The memory film 50 may comprise an optional dielectric material liner 56, a plurality of memory elements comprising portions of the memory material layer 54, and an optional blocking dielectric layer 52. An entire set of material portions that fills a memory opening 49 is herein referred to as a memory opening fill structure 58. Generally, the memory opening fill structure 58 comprises the memory stack structure 55, the drain region 62 and the option dielectric core 62. A vertical NAND string can be formed through each memory opening upon subsequent replacement of the sacrificial material layers 42 with electrically conductive layers.

Figure 12:
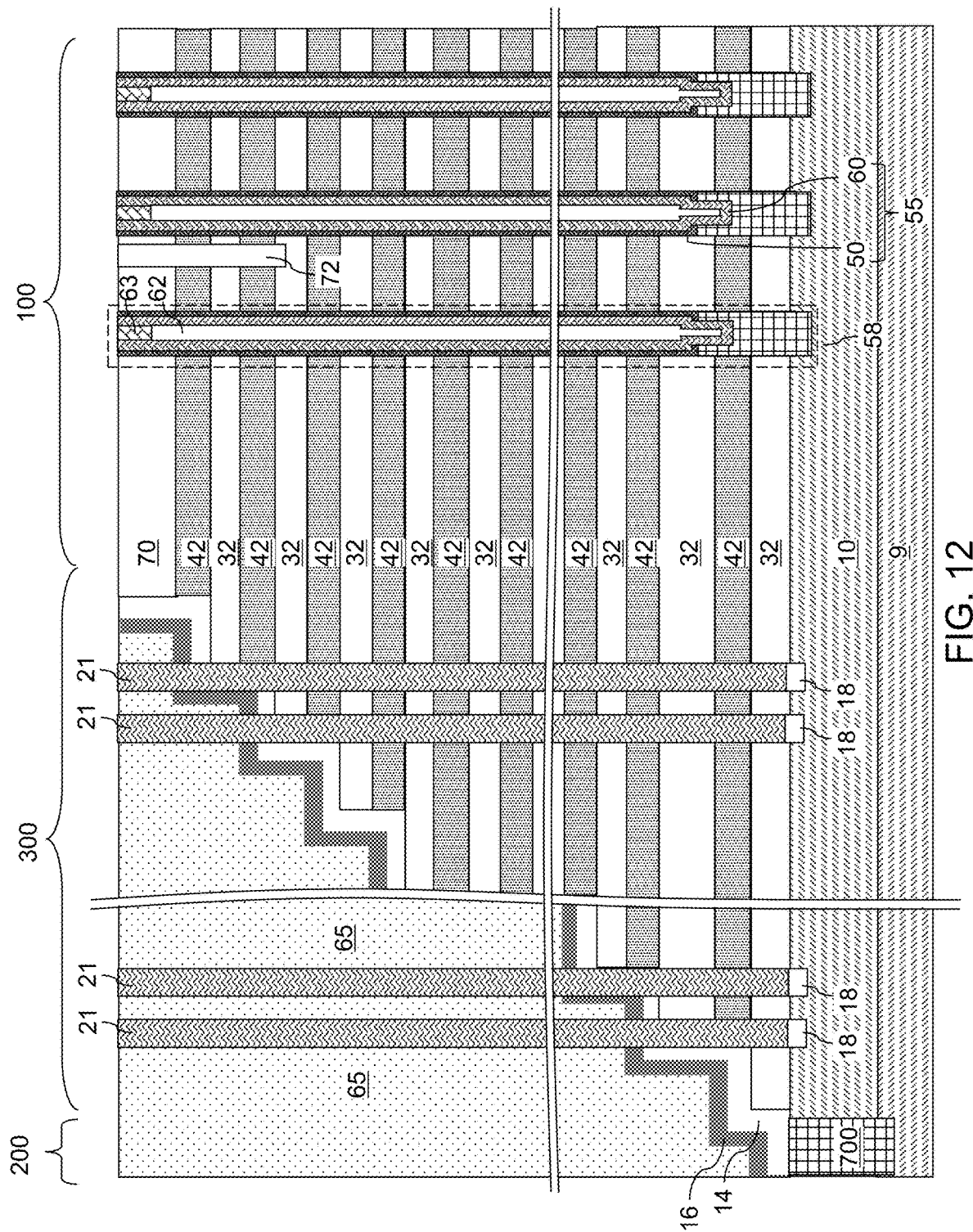
FIG. 12 is a schematic vertical cross-sectional view of the exemplary structure after formation of memory opening fill structures according to an embodiment of the present disclosure.

Referring to FIG. 12, the exemplary structure is illustrated after formation of memory opening fill structures 58 within the memory openings 49. An instance of a memory opening fill structure 58 can be formed within each memory opening 49 of the structure of FIGS. 10A and 10B.

Figure 13A:
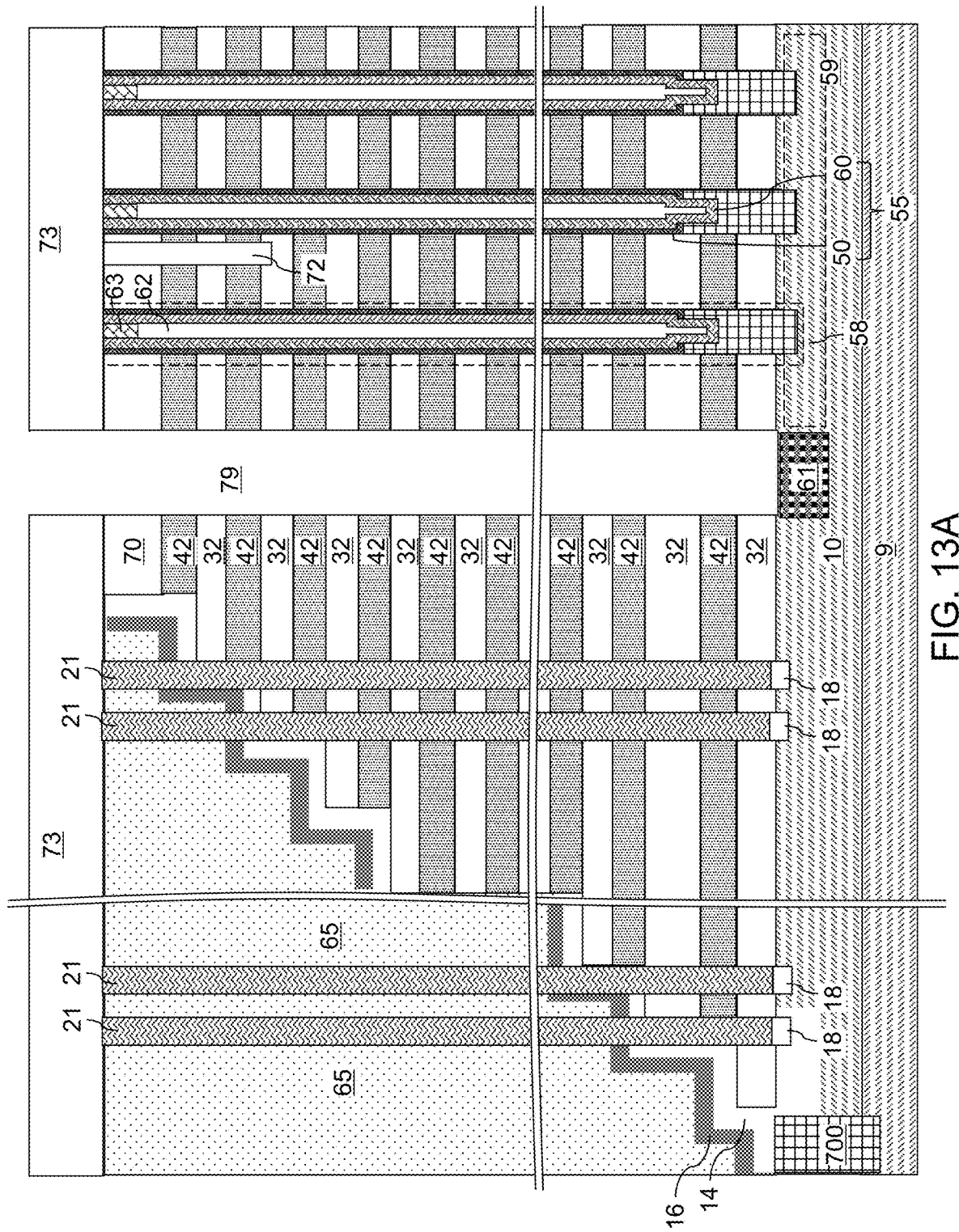
FIG. 13A is a schematic vertical cross-sectional view of the exemplary structure after formation of a sacrificial cover layer and backside trenches according to an embodiment of the present disclosure.
Figure 13B:
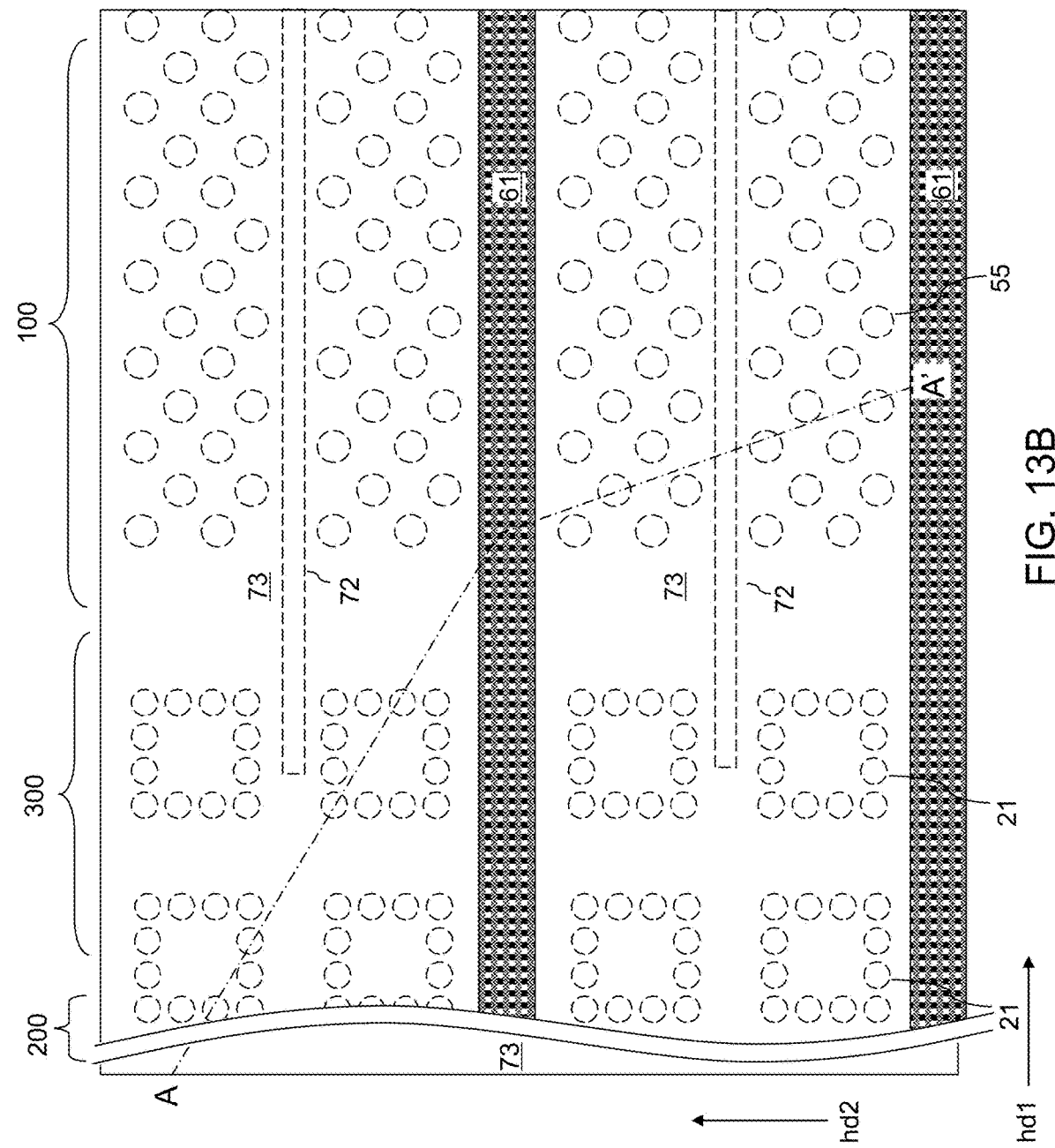
FIG. 13B is a partial see-through top-down view of the exemplary structure of FIG. 13A. The vertical plane A-A' is the plane of the schematic vertical cross-sectional view of FIG. 13A.
Figure 13C:
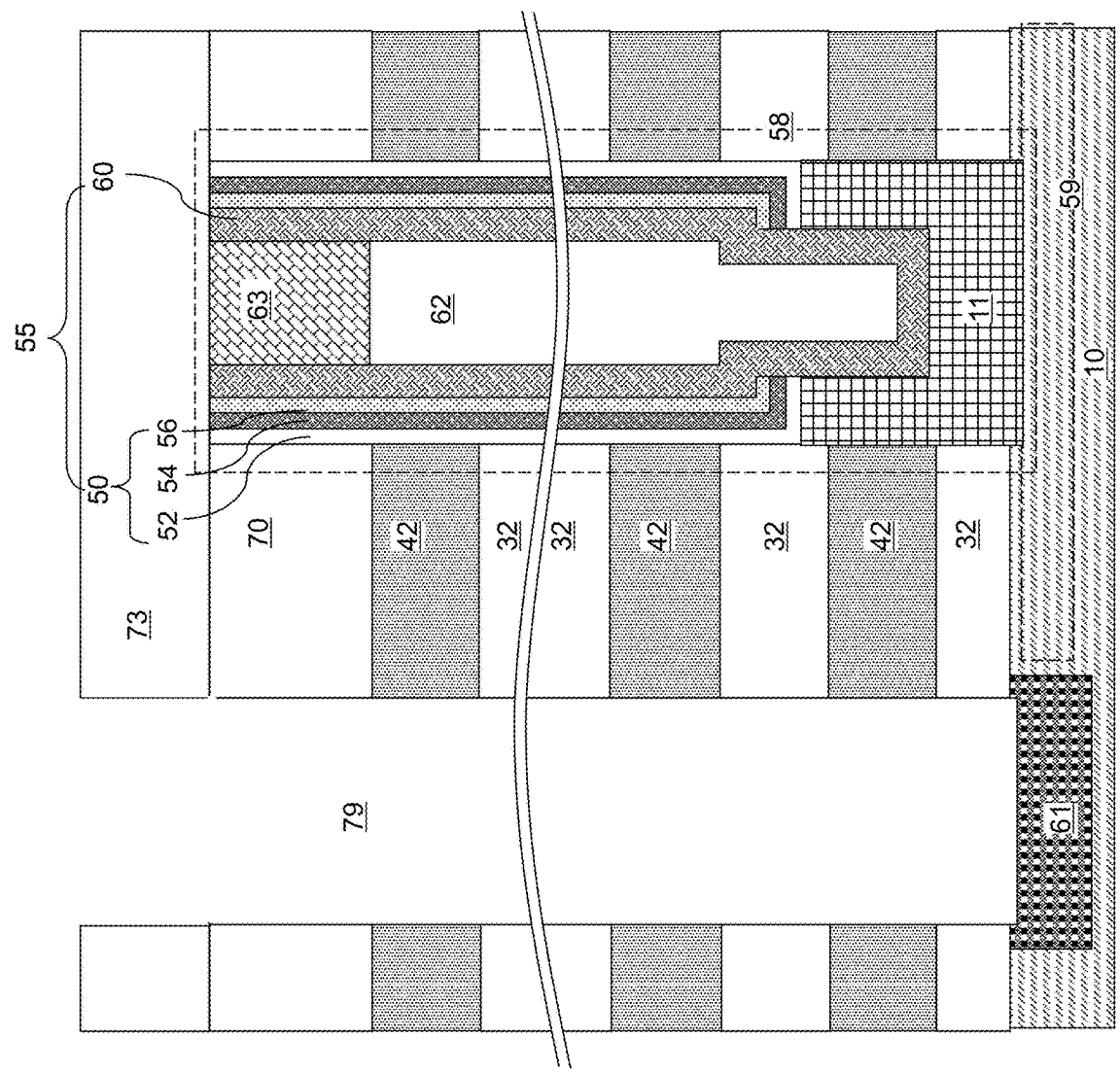
FIG. 13C is a magnified view of the vertical cross-sectional view of FIG. 13A around a backside trench and a memory opening fill structure.

Referring to FIGS. 13A-13C, a sacrificial cover layer 73 can be formed over the alternating stack (32, 42) of insulating layer 32 and sacrificial material layers 42, and over the memory stack structures 55 and the sacrificial support pillar structures 21. The sacrificial cover layer 73 includes a dielectric material that is different from the dielectric material of the sacrificial material layers 42. For example, the sacrificial cover layer 73 can include silicon oxide or organosilicate glass. The sacrificial cover layer 73 can have a thickness in a range from 50 nm to 500 nm, although lesser and greater thicknesses can also be employed.

A photoresist layer (not shown) can be applied over the sacrificial cover layer 73, and is lithographically patterned to form openings in areas between clusters of memory stack structures 55. The pattern in the photoresist layer can be transferred through the sacrificial cover layer 73, the alternating stack (32, 42) and/or the retro-stepped dielectric material portion 65 employing an anisotropic etch to form backside trenches 79, which vertically extend from the top surface of the sacrificial cover layer 73 at least to the top surface of the substrate (9, 10), and laterally extend through the memory array region 100 and the staircase region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the substrate (9, 10) that underlies a respective backside trench 79. An upper portion of the semiconductor material layer 10 that extends between each source region 61 and an adjacent plurality of pedestal channel portions 11 constitutes a horizontal semiconductor channel 59. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 14A:
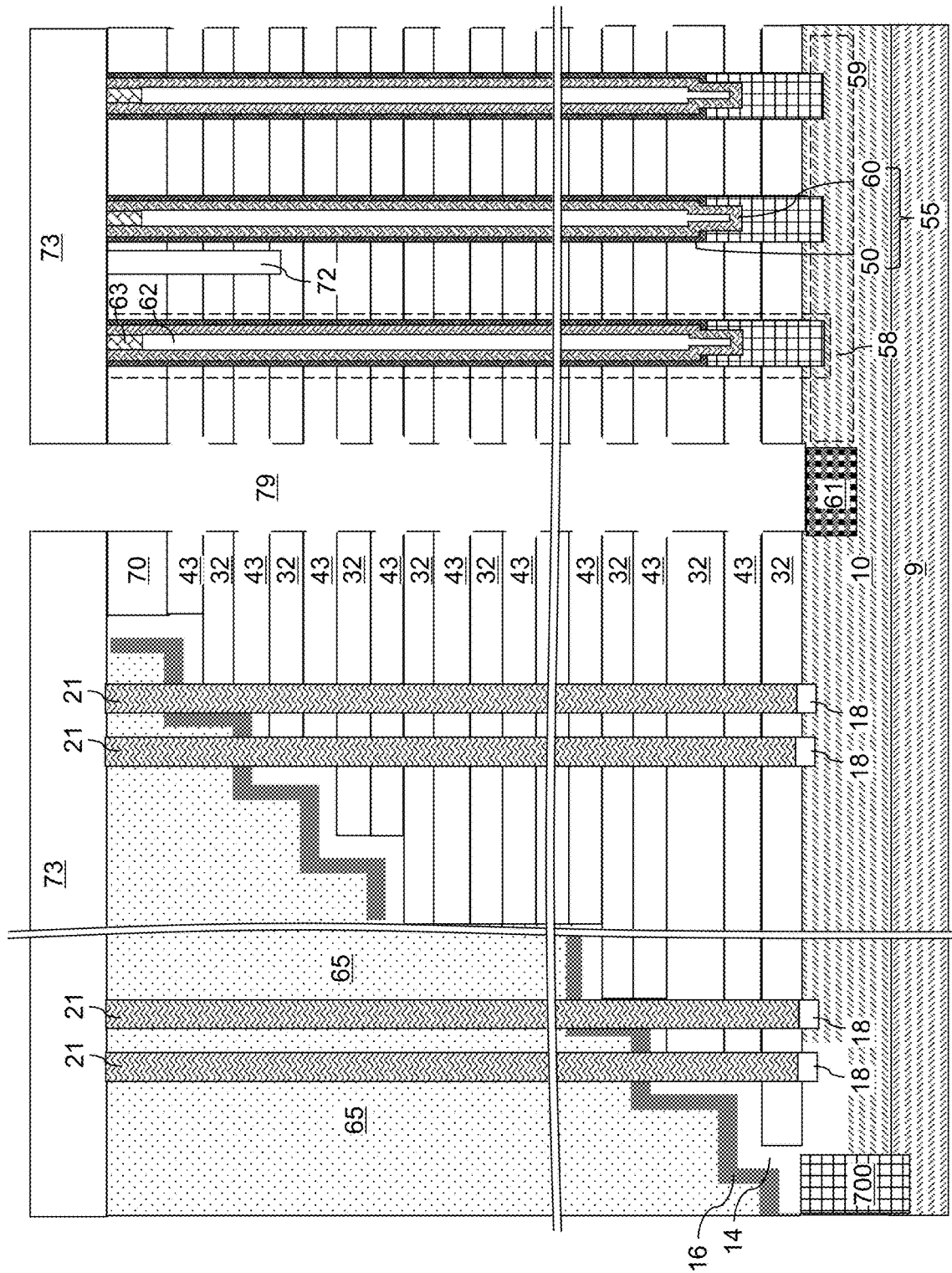
FIG. 14A is a schematic vertical cross-sectional view of the exemplary structure after formation of backside recesses according to an embodiment of the present disclosure.
Figure 14B:
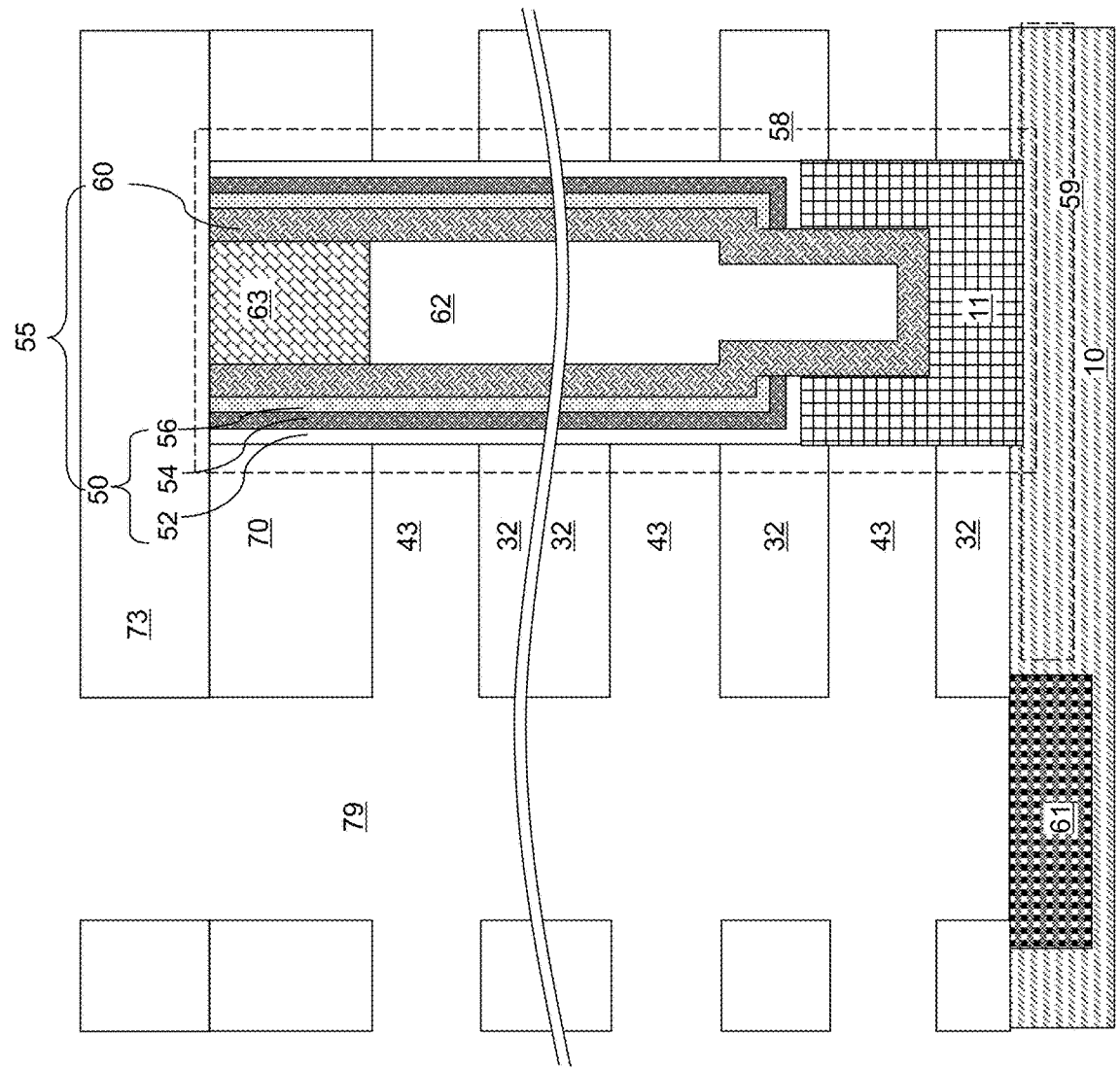
FIG. 14B is a magnified view of the vertical cross-sectional view of FIG. 14A around a backside trench and a memory opening fill structure.

Referring to FIGS. 14A and 14B, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The sacrificial support pillar structure 21, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 15A:
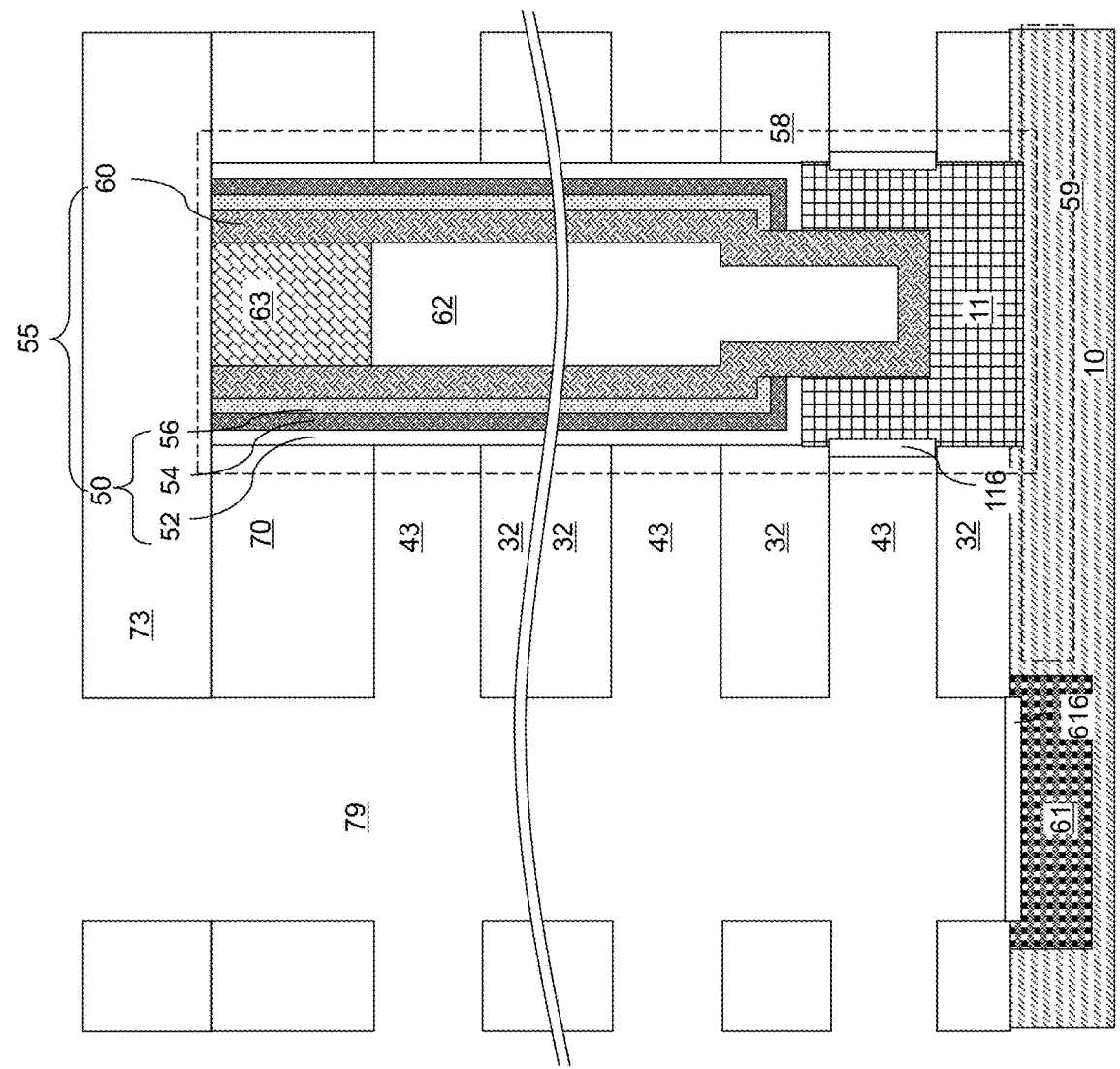
FIGS. 15A-15C are sequential vertical cross-sectional views of a region of the exemplary structure during formation of electrically conductive layers according to an embodiment of the present disclosure.
Figure 16A:
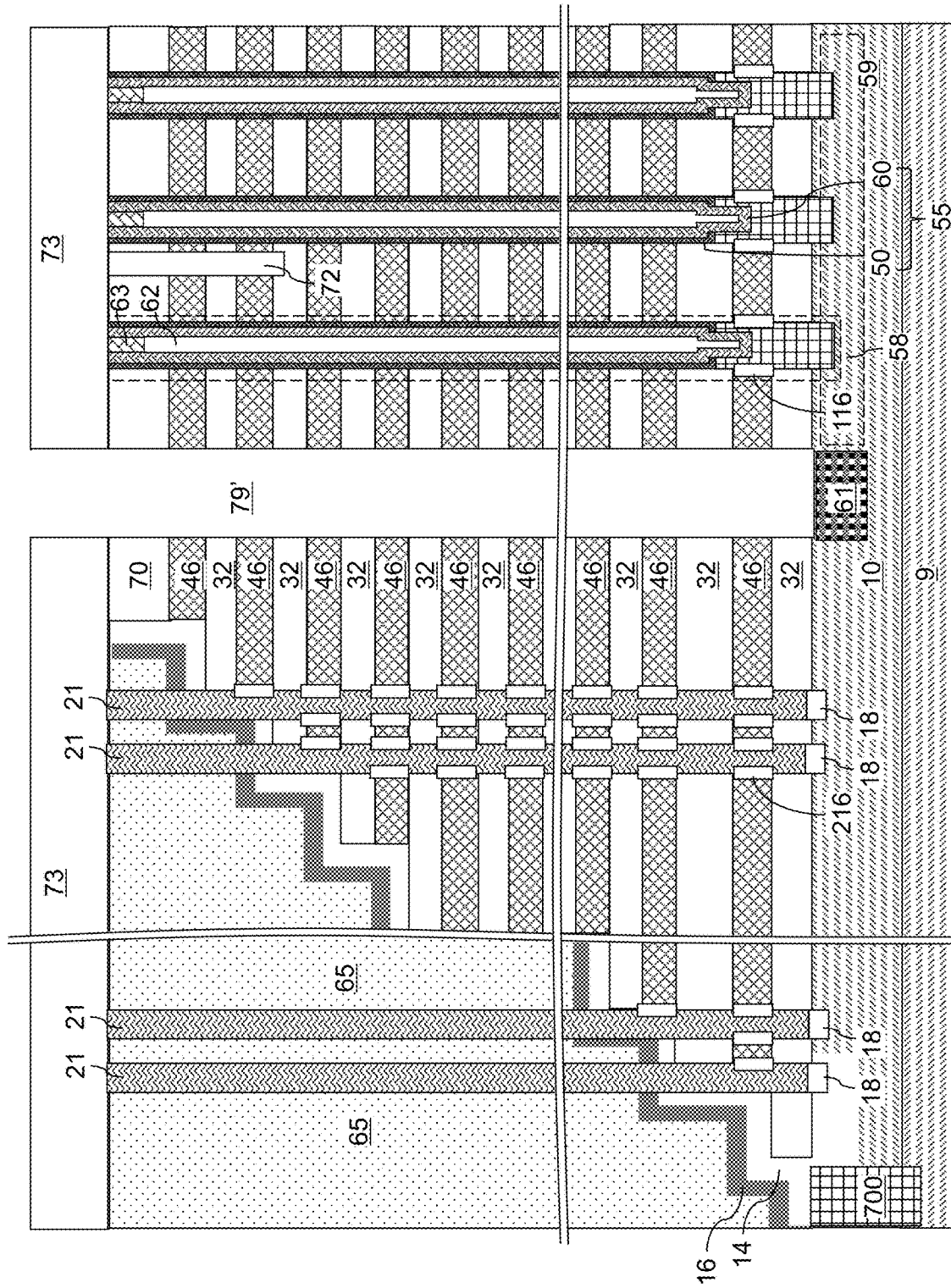
FIG. 16A is a schematic vertical cross-sectional view of the exemplary structure after removal of electrically conductive materials from the backside trenches according to an embodiment of the present disclosure.

Referring to FIG. 15A, physically exposed surface portions of the optional pedestal channel portions 11 and the source regions 61 can be converted into dielectric material portions by thermal conversion and/or plasma conversion of the semiconductor materials into dielectric materials. For example, thermal conversion and/or plasma conversion can be employed to convert an exposed surface portion of each pedestal channel portion 11 into a tubular dielectric spacer 116, to convert an exposed sidewall surface portion of sacrificial support pillar structures 21 into a tubular dielectric spacer 216 (as shown in FIG. 16A), and to convert each physically exposed surface portion of the semiconductor material layer 10 into a planar dielectric portion 616. In one embodiment, each tubular dielectric spacer (116, 216) can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers (116, 216) include a dielectric material that includes the same semiconductor element as the pedestal channel portions 11 or sacrificial support pillar structures 21 and additionally includes at least one non-metallic element such as oxygen and/or nitrogen such that the material of the tubular dielectric spacers 116 is a dielectric material. In one embodiment, the tubular dielectric spacers (116, 216) can include a dielectric oxide, a dielectric nitride, or a dielectric oxynitride of the semiconductor material of the pedestal channel portions 11 or the sacrificial support pillar structures 21, respectively. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 15B:
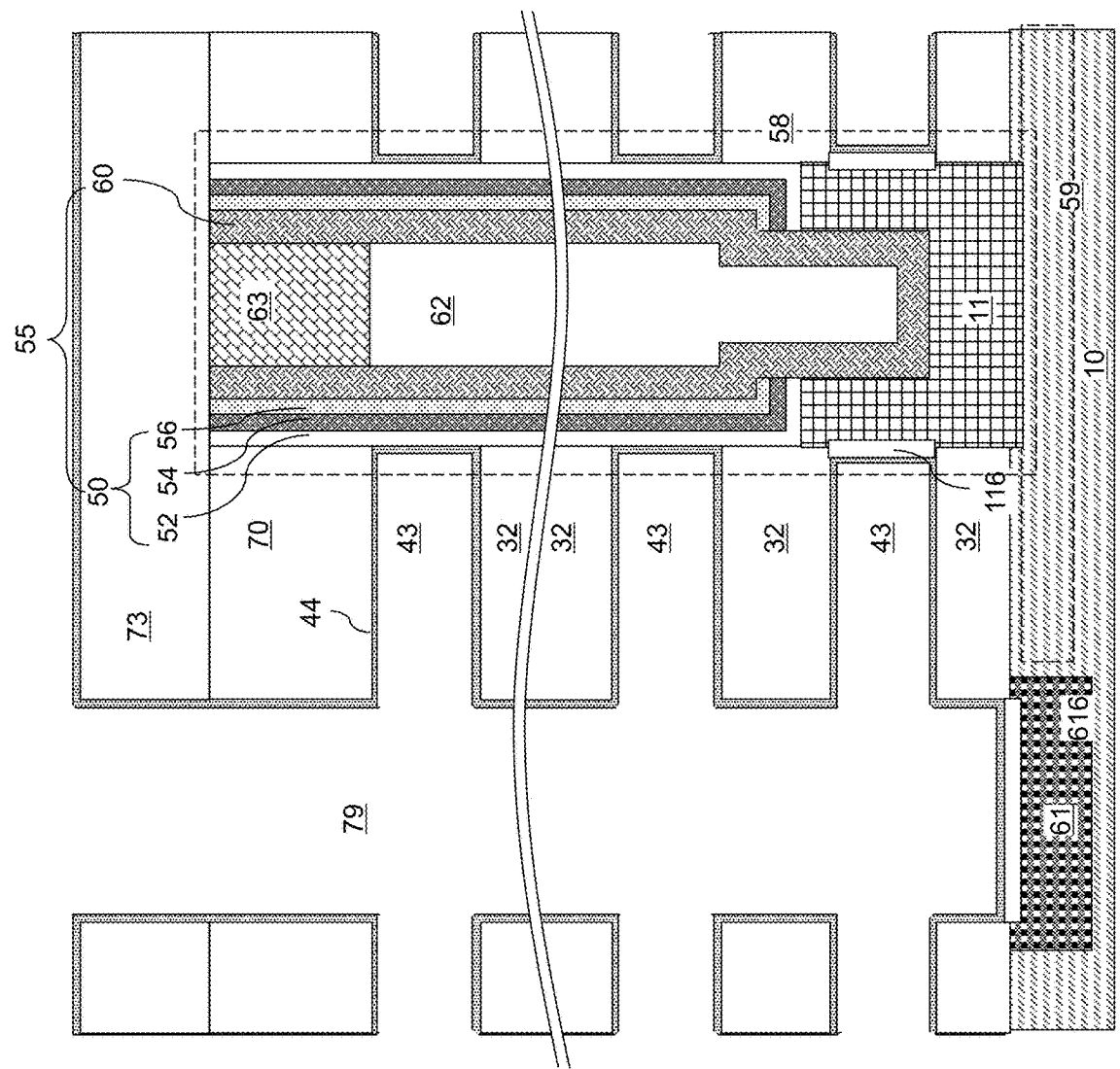

Referring to FIG. 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 15C:
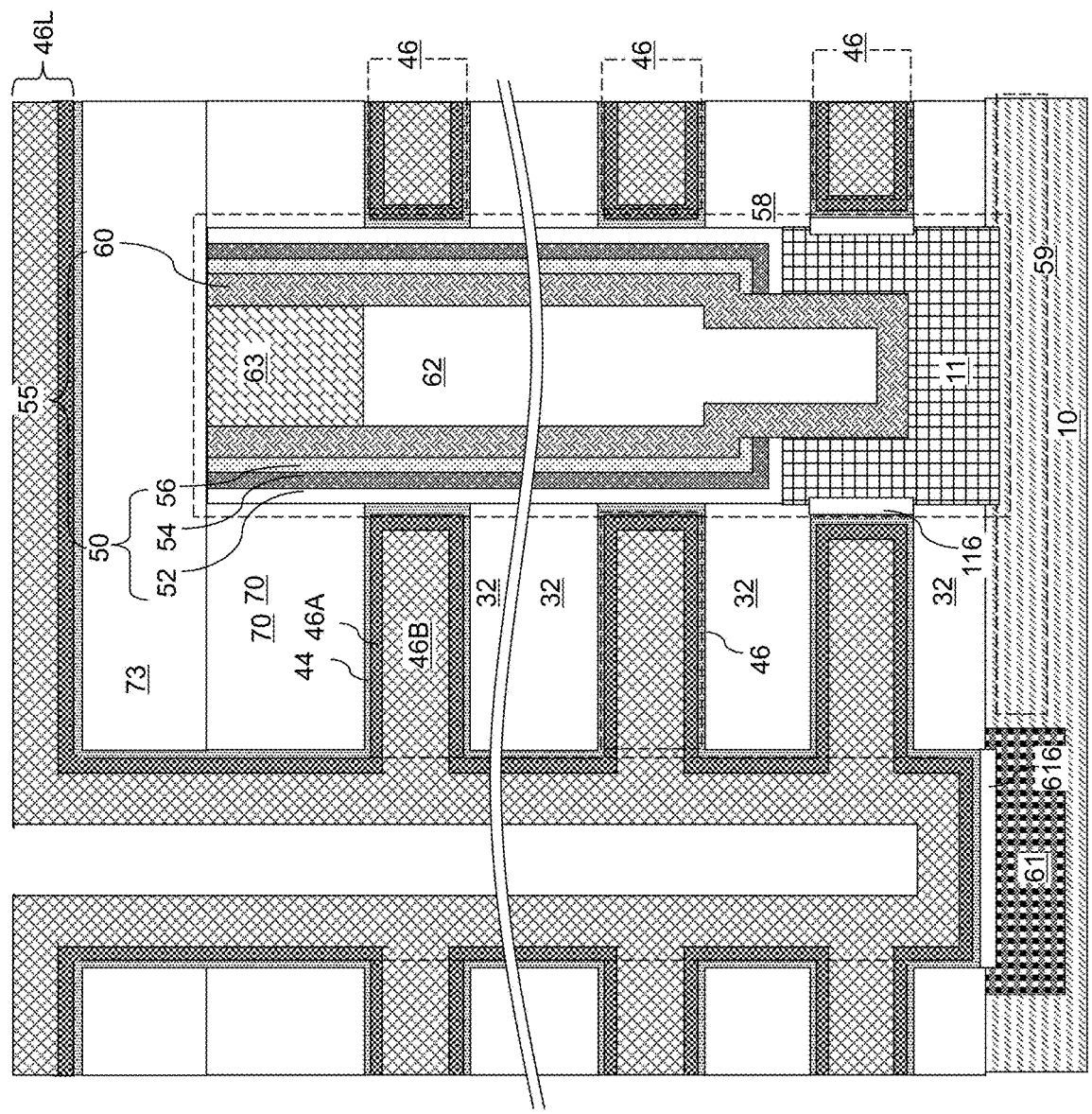

Referring to FIG. 15C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the sacrificial cover layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the sacrificial cover layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the sacrificial cover layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 16B:
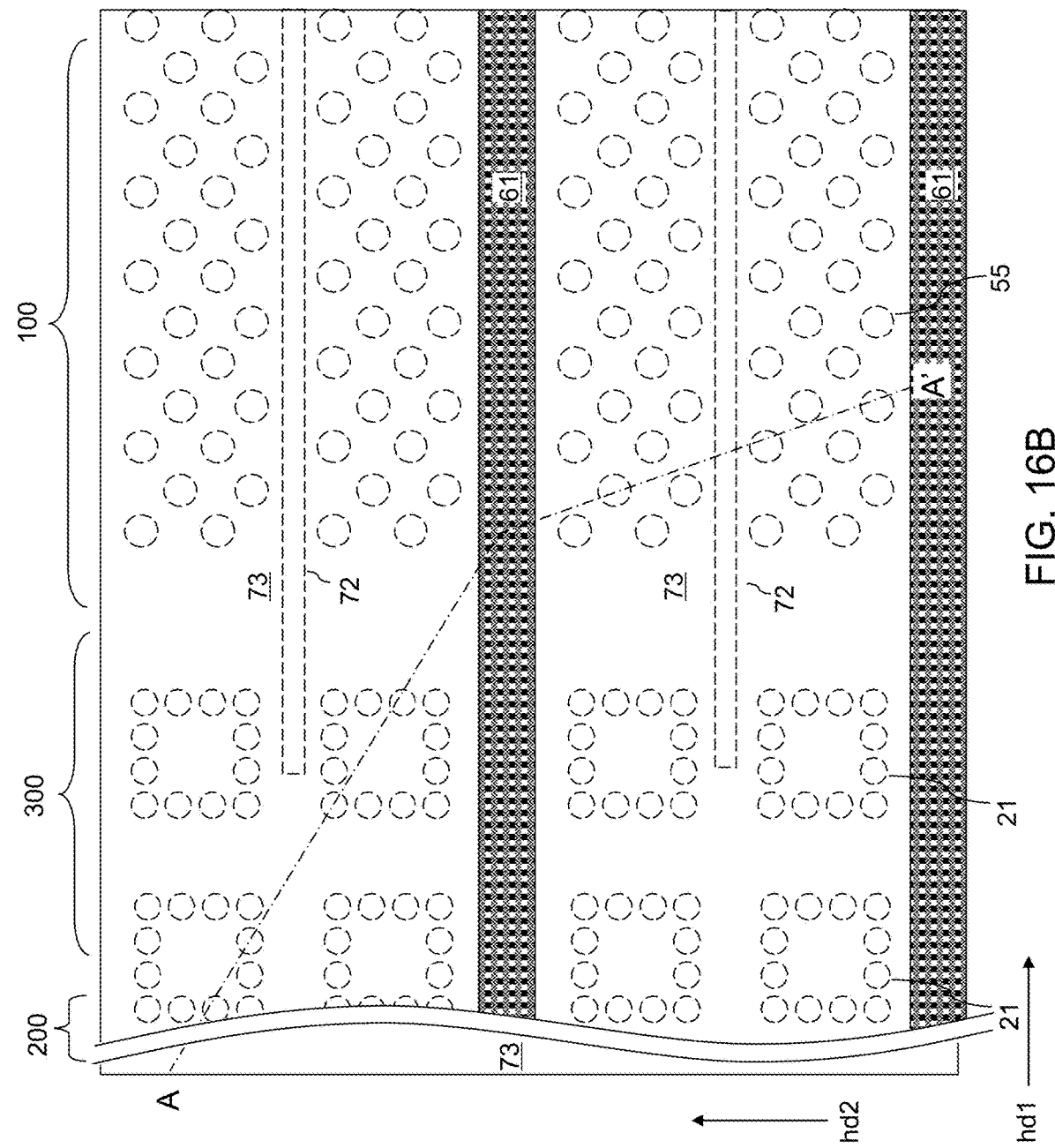
FIG. 16B is a partial see-through top-down view of the exemplary structure of FIG. 16A. The vertical plane A-A' is the plane of the schematic vertical cross-sectional view of FIG. 16A.
Figure 16C:
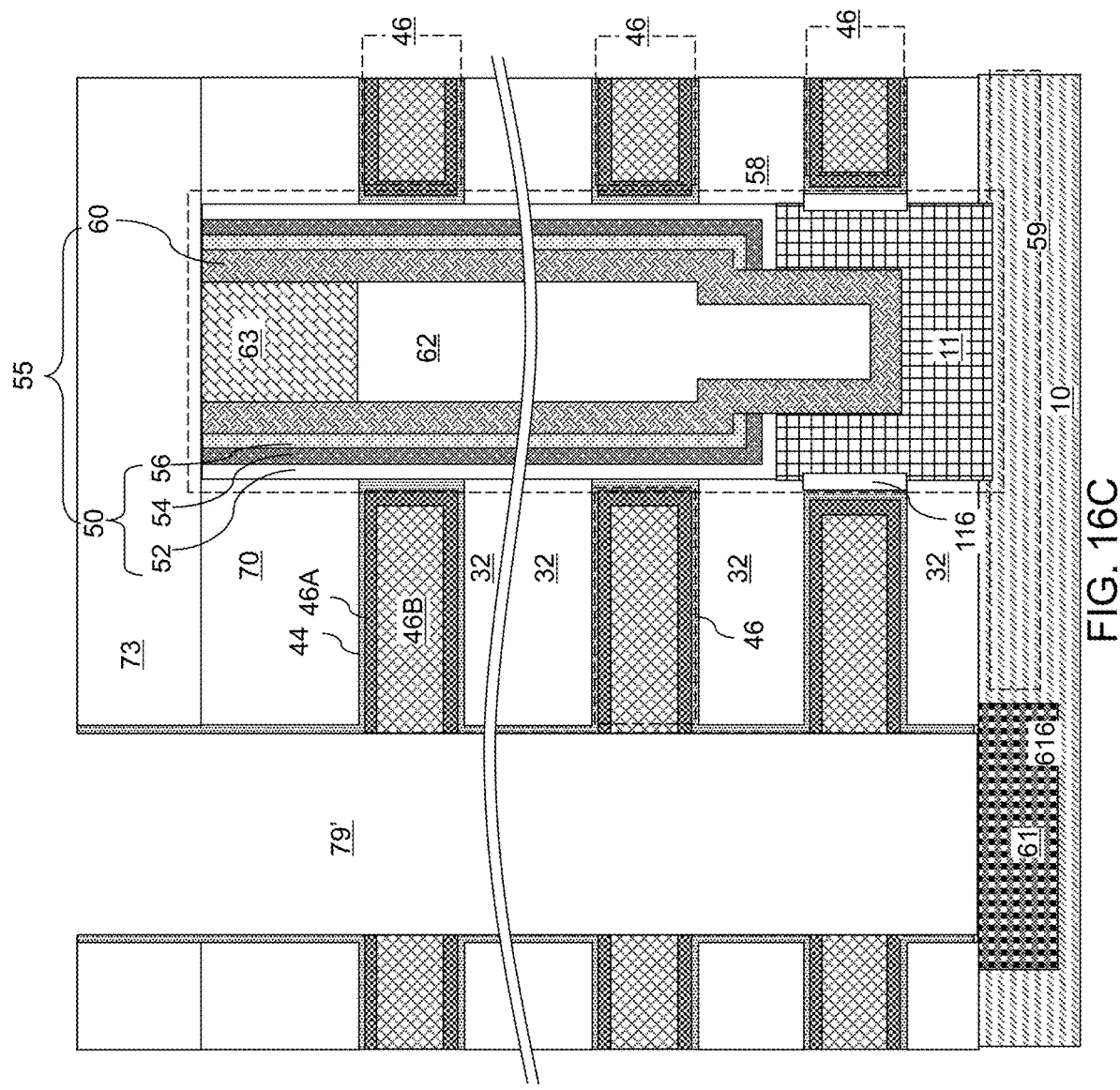
FIG. 16C is a magnified view of the vertical cross-sectional view of FIG. 16A around a backside trench and a memory opening fill structure.

Referring to FIGS. 16A-16C, the deposited metallic material of the continuous electrically conductive material layer 46L is etched back from the sidewalls of each backside trench 79 and from above the sacrificial cover layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 17:
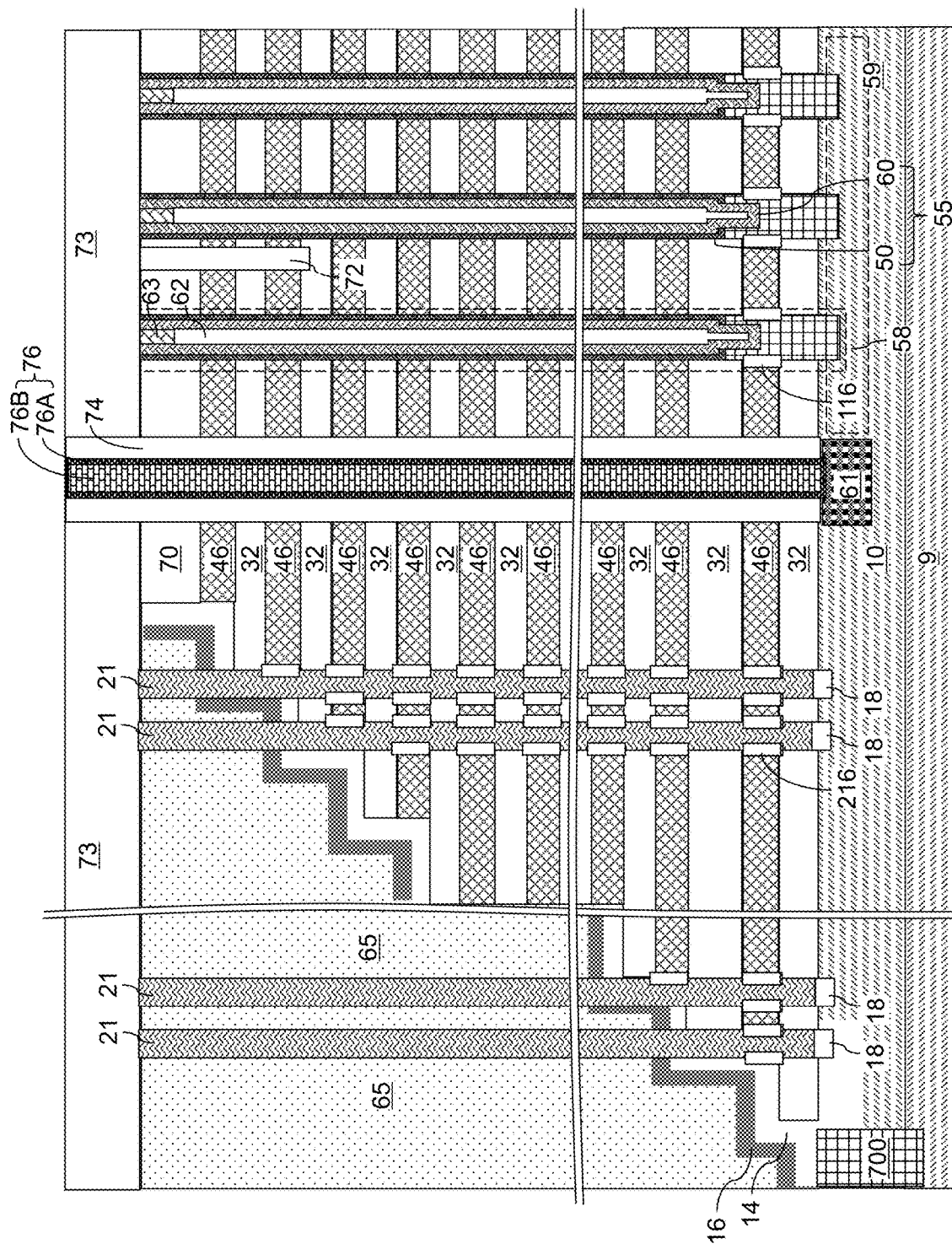
FIG. 17 is a schematic vertical cross-sectional view of the exemplary structure after formation of backside trench fill structures according to an embodiment of the present disclosure.

Referring to FIG. 17, an insulating material layer can be formed in the backside trenches 79 and over the sacrificial cover layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the sacrificial cover layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the sacrificial cover layer 73 overlying the alternating stack (32, 46) as a stopping layer. If chemical mechanical planarization (CMP) process is employed, the sacrificial cover layer 73 can be employed as a CMP stopping layer. Each remaining continuous portion of the at least one conductive material in the backside trenches 79 constitutes a backside contact via structure 76. Each backside contact via structure 76 extends through the alternating stack (32, 46), and contacts a top surface of a source region 61. If a backside blocking dielectric layer 44 is employed, the backside contact via structure 76 may contact a sidewall of the backside blocking dielectric layer 44. The combination of an insulating spacer 74 and a backside contact via structure 76 that fills a backside trench 79 is herein referred to as a backside trench fill structure (74, 76).

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 18:
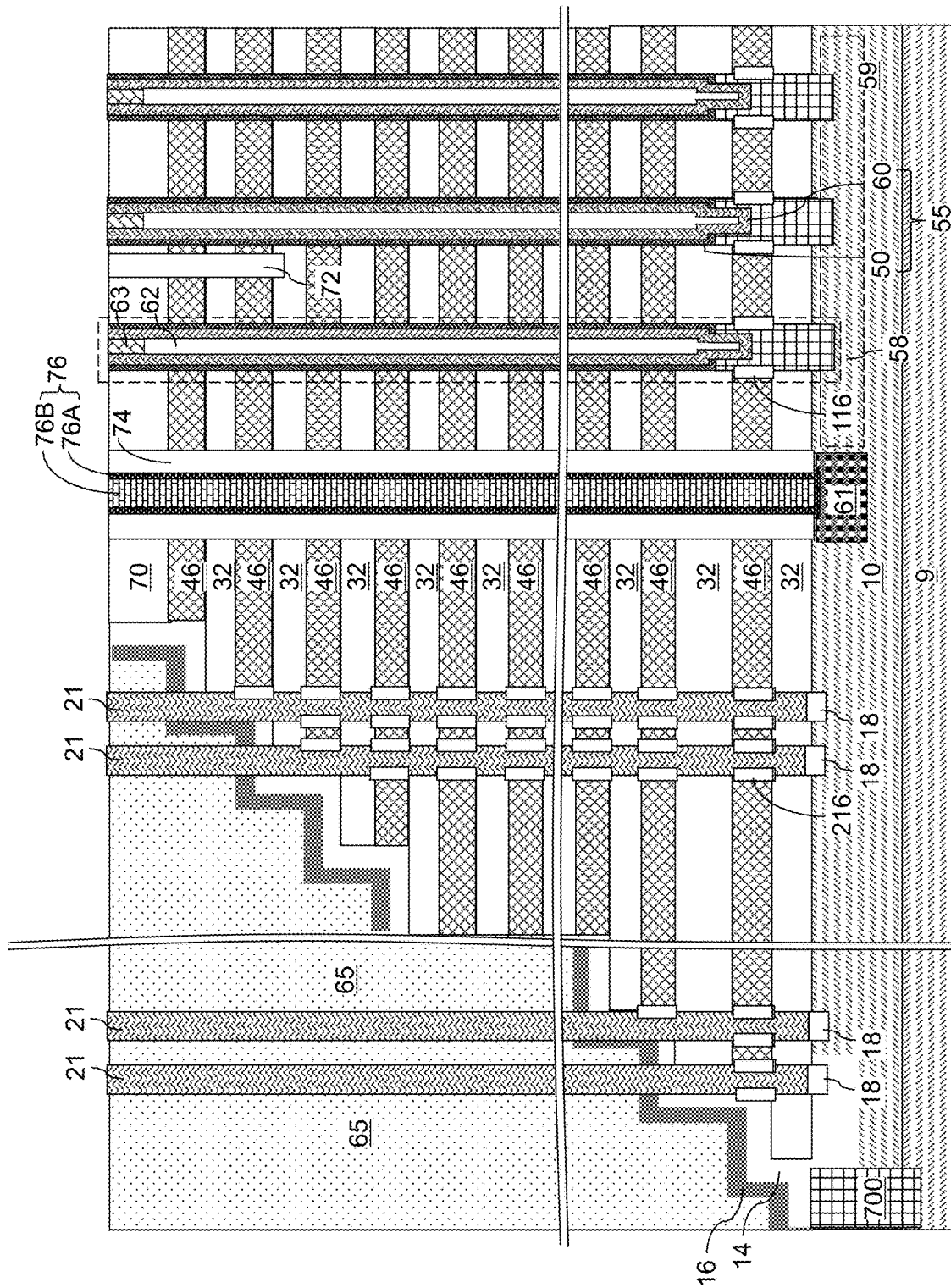
FIG. 18 is a schematic vertical cross-sectional view of the exemplary structure after recessing the backside trench fill structures and removing the sacrificial cover layer according to an embodiment of the present disclosure.

Referring to FIGS. 18, 19A, and 19B, portions of the backside trench fill structures (74, 76) and the sacrificial cover layer 73 overlying a horizontal plane including the top surface of the insulating cap layer 70 can be removed by a planarization process. In one embodiment, the planarization process may include a chemical mechanical polishing process. Alternatively, recess etch processes may be performed to vertically recess portions of the backside trench fill structures (74, 76) and the sacrificial cover layer 73 from above the horizontal plane including the top surface of the insulating cap layer 70.

Referring to FIGS. 20A and 20B, a patterned etch mask layer (such as a patterned photoresist layer) may be formed over the insulating cap layer 70 to cover the memory opening fill structures 58 without covering the sacrificial support pillar structures 21. A first isotropic etch process can be performed, which has an etch chemistry that etches the material of the of the sacrificial support pillar structures 21 selective to the materials of the retro-stepped dielectric material portion 65, the alternating stack (32, 46), and the semiconductor oxide plates 18. For example, if the sacrificial support pillar structures 21 comprise amorphous silicon or polysilicon, a wet etch process using hot trimethyl-2 hydroxyethyl ammonium hydroxide ("hot TMY") or tetramethyl ammonium hydroxide (TMAH) may be performed to remove the sacrificial memory opening fill structures. Cavities are formed within the volumes of the support openings 17. The cavities formed within the volumes of the support openings 17 are herein referred to as support cavities. The support cavities are formed as discrete cavities that are not merged among one another.

Figure 21C:
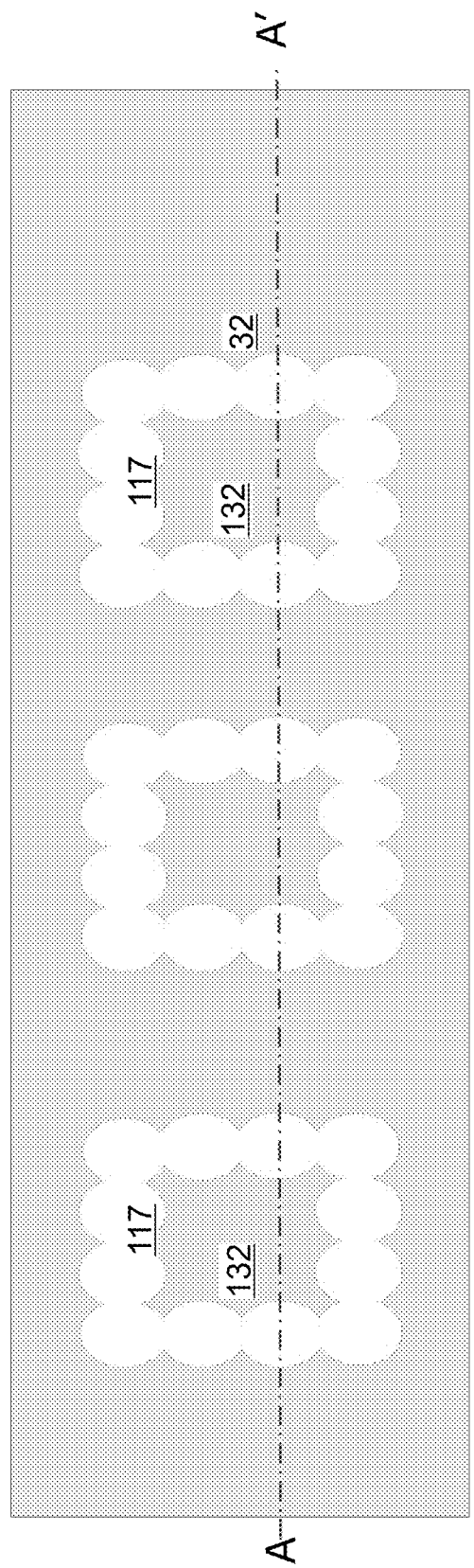
FIG. 21C is a horizontal cross-sectional view along the horizontal plane C-C' of the exemplary structure of FIG. 21A.

Referring to FIGS. 21A-21C, a second isotropic etch process can be performed to isotropically recess the insulating layers 32, the at least one etch stop liner (14, 16), the retro-stepped dielectric material portion 65, the tubular dielectric spacers 216 and the semiconductor oxide plates 18 selective to the material of the electrically conductive layers 46. The tubular dielectric spacers 216 and the semiconductor oxide plates 18 may be completely removed, or may be partially removed. The material of the insulating layers 32 is etched without removing the material of the electrically conductive layers 46.

According to an aspect of the present disclosure, the support openings are laterally expanded at levels of the insulating layers 32 such that the discrete support openings 17 become interconnected with each other at levels of a subset of the insulating layers 32 that are physically exposed to the support openings 17. Each set of support openings that are interconnected with each other forms an interconnected support cavity 117. In an illustrative example, if the retro-stepped dielectric material portion 65 and the insulating layers 32 comprise silicon oxide, the second isotropic etch process may comprise a wet etch process employing dilute hydrofluoric acid.

In one embodiment, each group of support openings 17 that are laterally spaced apart from each other by less than twice a lateral recess distance of the second isotropic etch process within the retro-stepped dielectric material portion 65 becomes interconnected among one another within the retro-stepped dielectric material portion 65 to form the respective support cavity 117. Likewise, each group of support cavities that are laterally spaced apart from each other by less than twice a lateral recess distance of the second isotropic etch process at levels of the insulating layers 32 becomes interconnected among one another at levels of the insulating layers 32 that underlie the retro-stepped dielectric material portion 65 form the respective support cavity 117. Each interconnected support cavity 117 can be continuously interconnected throughout a portion that vertically extends through the retro-stepped dielectric material portion 65, at levels of the insulating layers 32 that underlie the retro-stepped dielectric material portion 65, and optionally at levels of the at least one etch stop liner (14, 16). However, the electrically conductive layers 46 are not laterally recessed by the second isotropic etch process. Thus, each interconnected support cavity 117 may comprise multiple disjoined volumes at levels of the subset of electrically conductive layers 46 that underlie the retro-stepped dielectric material portion 65.

In one embodiment, each interconnected support cavity 117 is laterally interconnected through volumes of multiple support openings 17 at each level of an insulating layer 32 through which the interconnected support cavity 117 vertically extends, and each interconnected support cavity 117 comprise multiple disjoined volumes of the respective support openings 17 at each level of an electrically conductive layer 46 through which the interconnected support cavity 117 vertically extends. Each interconnected support cavity 117 can laterally surround at least one insulating plate 132, each of which is a patterned portion of a respective insulating layer 32. Each insulating plate 132 is disjoined from an insulating layer 32 located at a same level by a respective interconnected support cavity 117. Further, each interconnected support cavity 117 may laterally surround a patterned portion of the retro-stepped dielectric material portion 65.

Figure 22B:
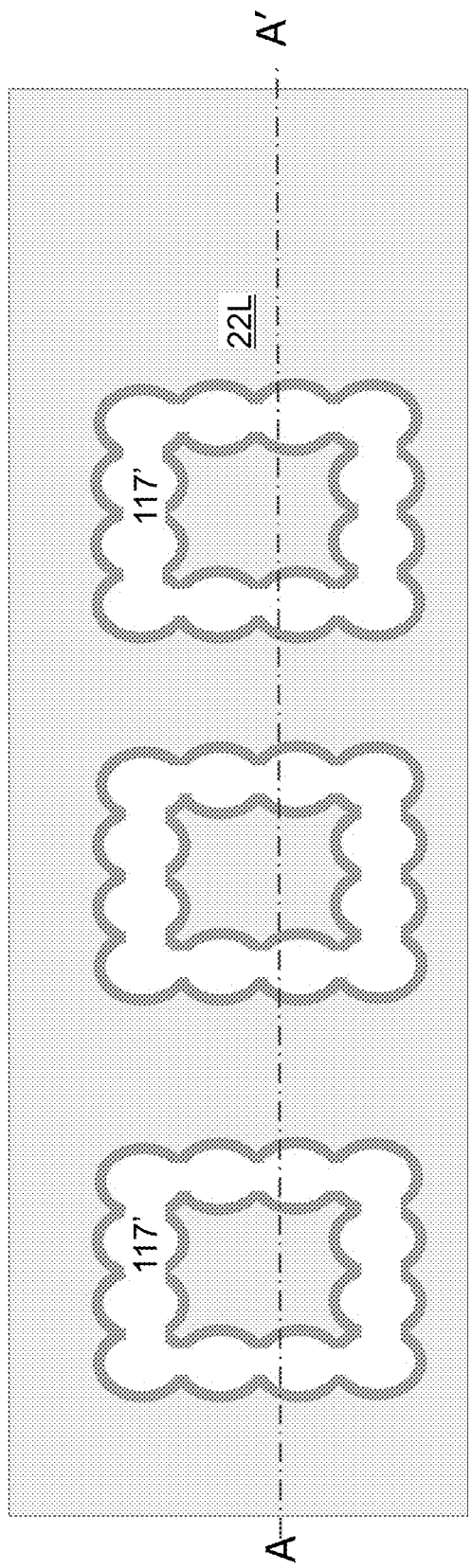
FIG. 22B is a top-down view of the exemplary structure of FIG. 22A. The vertical plane A-A' is the plane of the cross-section for FIG. 22A.
Figure 22A:
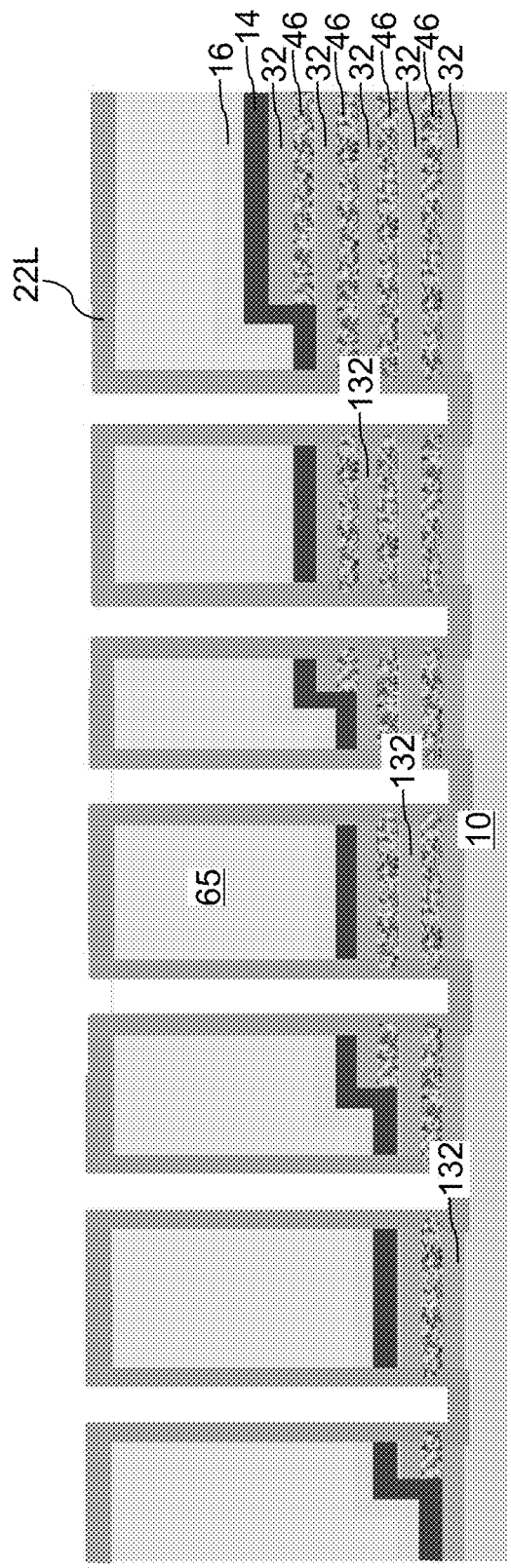
FIG. 22A is a schematic vertical cross-sectional view of a staircase region of the exemplary structure after formation of a dielectric liner layer according to an embodiment of the present disclosure.

Referring to FIGS. 22A and 22B, a dielectric liner layer 22L can be deposited in the interconnected support cavities 117 and over the retro-stepped dielectric material portion 65 and the insulating cap layer 70. The dielectric liner layer 22L includes a dielectric material such as silicon nitride, silicon oxide, silicon oxynitride, silicon carbide nitride (i.e., silicon carbonitride), and/or a dielectric metal oxide, such as aluminum oxide. In one embodiment, the dielectric liner layer 22L may comprise silicon nitride. In one embodiment, the dielectric liner layer 22L may be deposited by a conformal deposition, such as a chemical vapor deposition.

Figure 23B:
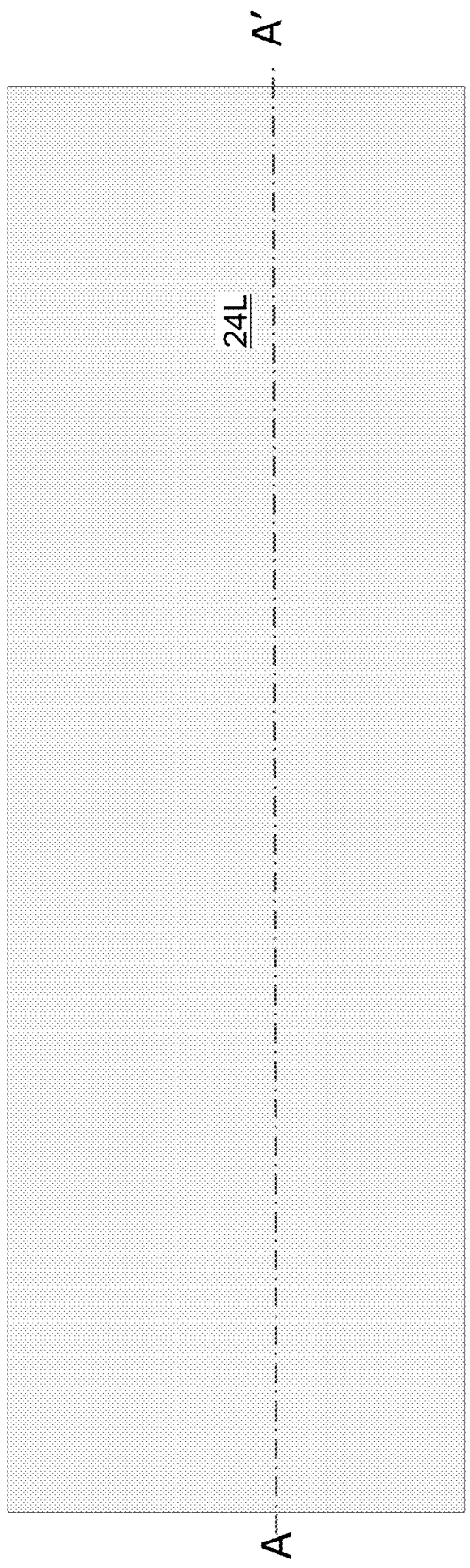
FIG. 23B is a top-down view of the exemplary structure of FIG. 23A. The vertical plane A-A' is the plane of the cross-section for FIG. 23A.
Figure 23A:
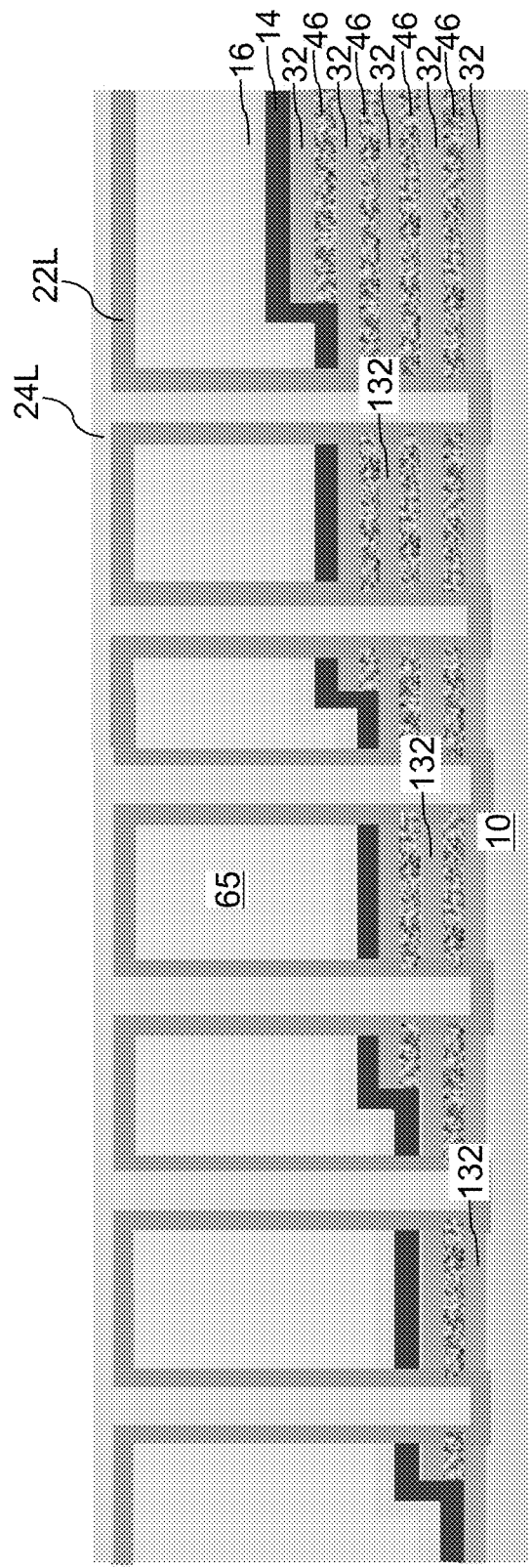
FIG. 23A is a schematic vertical cross-sectional view of a staircase region of the exemplary structure after formation of a fill material layer according to an embodiment of the present disclosure.

Referring to FIGS. 23A and 23B, a fill material layer 24L can be conformally deposited in remaining volumes of the interconnected support cavities 117. The fill material layer 24L includes a fill material, which may include a semiconductor material such as amorphous silicon, polysilicon, or a silicon-germanium alloy, or a dielectric material such as silicon nitride, silicon oxide, or a dielectric metal oxide. In one embodiment, the fill material layer 24L may include undoped amorphous silicon or undoped polysilicon.

Figure 24B:
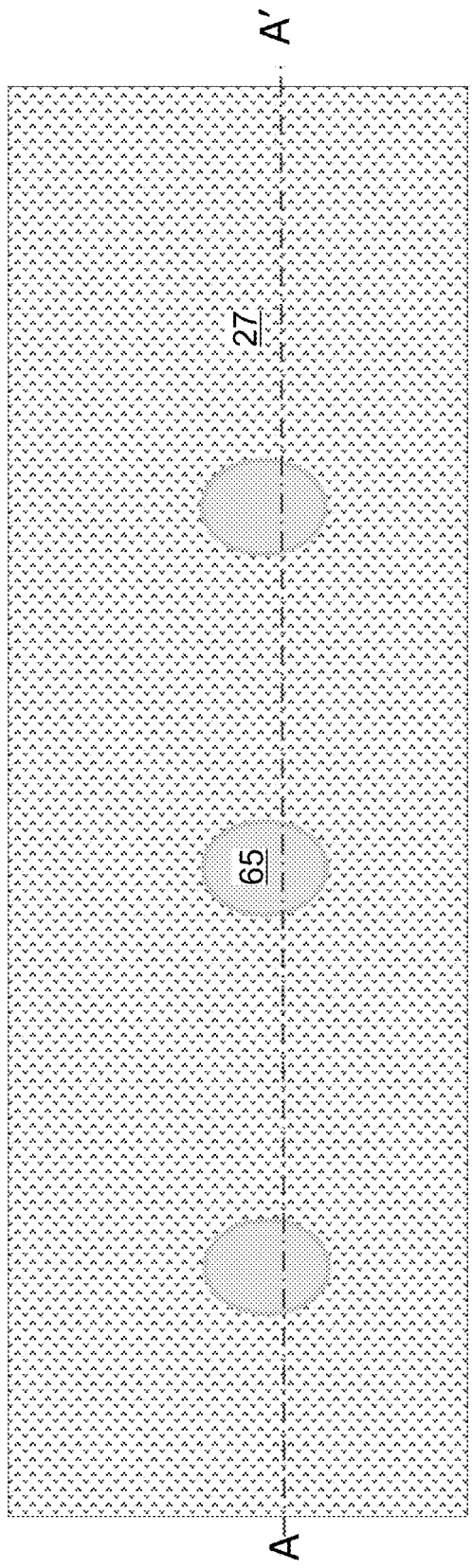
FIG. 24B is a top-down view of the exemplary structure of FIG. 24A. The vertical plane A-A' is the plane of the cross-section for FIG. 24A.
Figure 24A:
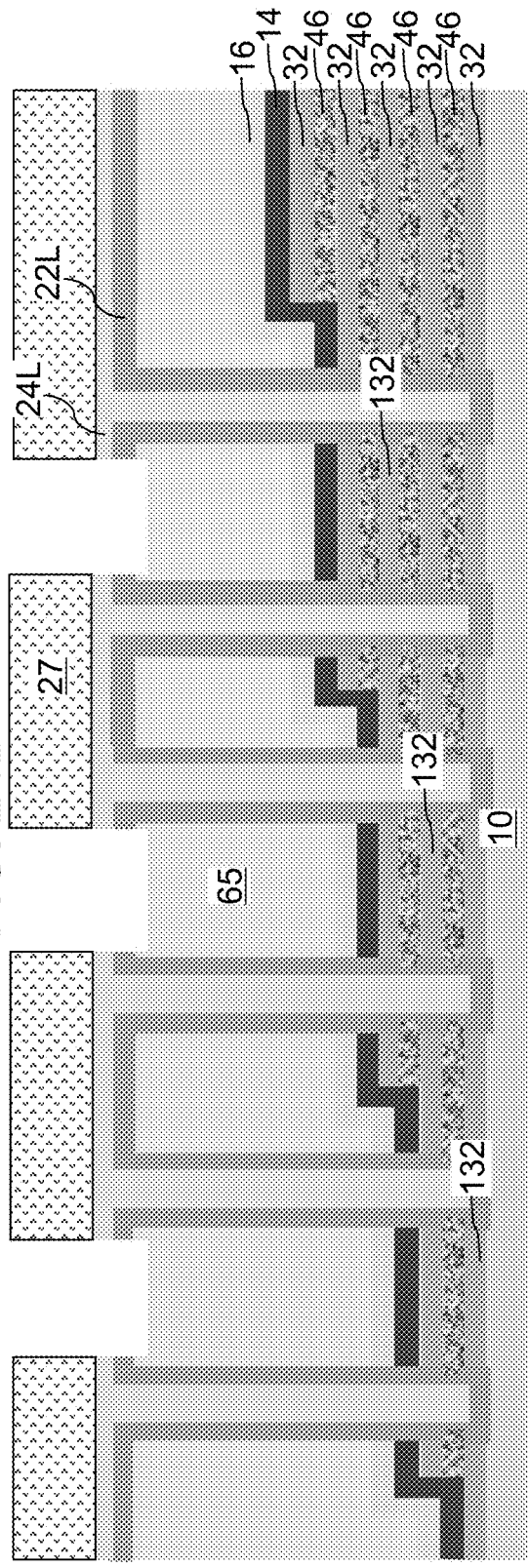
FIG. 24A is a schematic vertical cross-sectional view of a staircase region of the exemplary structure after formation of a patterned photoresist layer and openings through the fill material layer and the dielectric liner layer according to an embodiment of the present disclosure.

Referring to FIGS. 24A and 24B, a photoresist layer 27 can be applied over the fill material layer 24L, and can be lithographically patterned to form openings within areas that are laterally surrounded by a respective interconnected support cavity 117 (as filled by a combination of the dielectric liner layer 22L and the fill material layer 24L). An anisotropic etch process can be performed to etch unmasked portions of the fill material layer 24L and the dielectric liner layer 22L. A top surface of each patterned portion of the retro-stepped dielectric material portion 65 that is laterally surrounded by a respective interconnected support cavity 117 can be physically exposed underneath each opening through the horizontally-extending portions of the dielectric liner layer 22L and the fill material layer 24L.

Figure 25B:
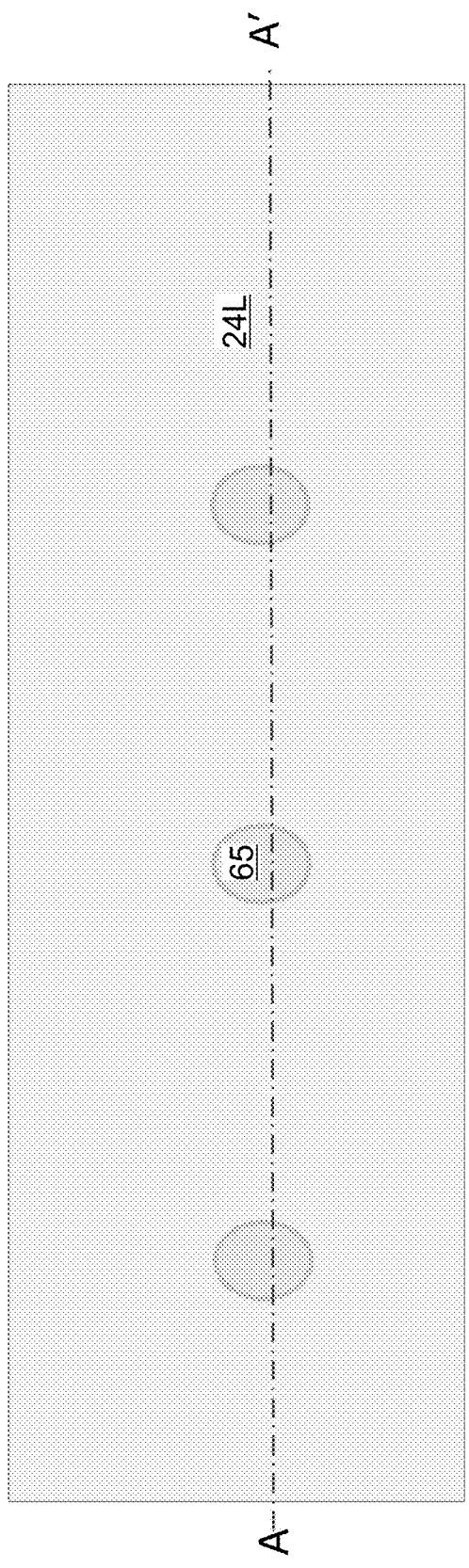
FIG. 25B is a top-down view of the exemplary structure of FIG. 25A. The vertical plane A-A' is the plane of the cross-section for FIG. 25A.
Figure 25A:
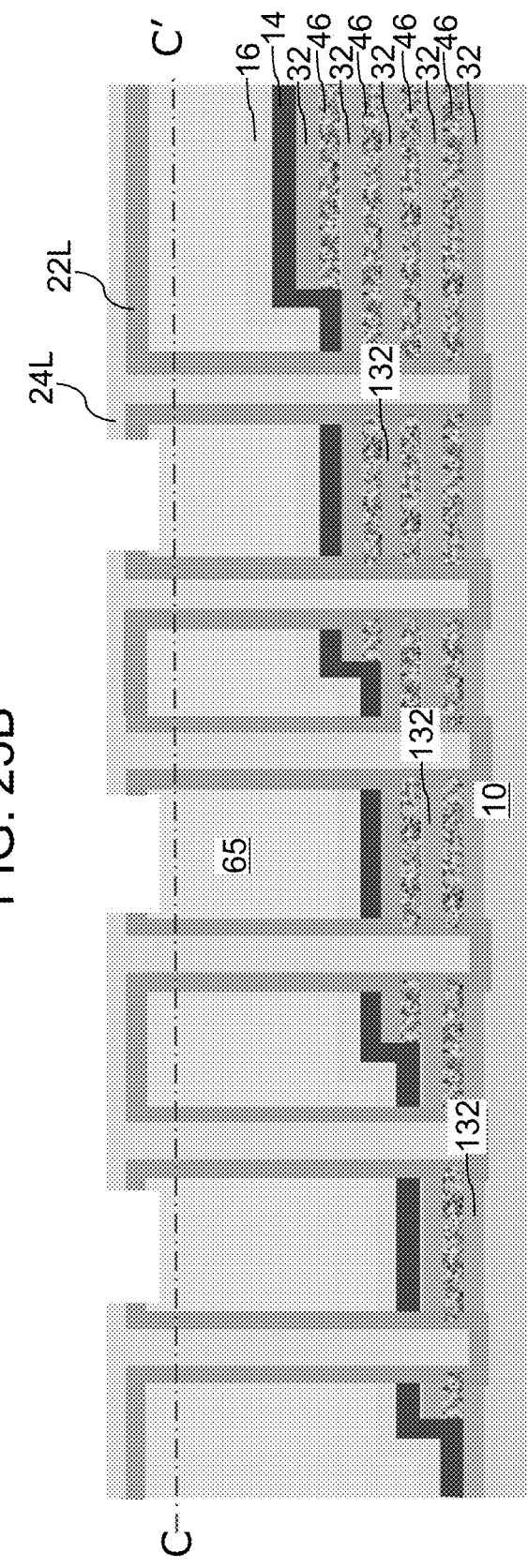
FIG. 25A is a schematic vertical cross-sectional view of a staircase region of the exemplary structure after removal of the patterned photoresist layer according to an embodiment of the present disclosure.
Figure 25C:
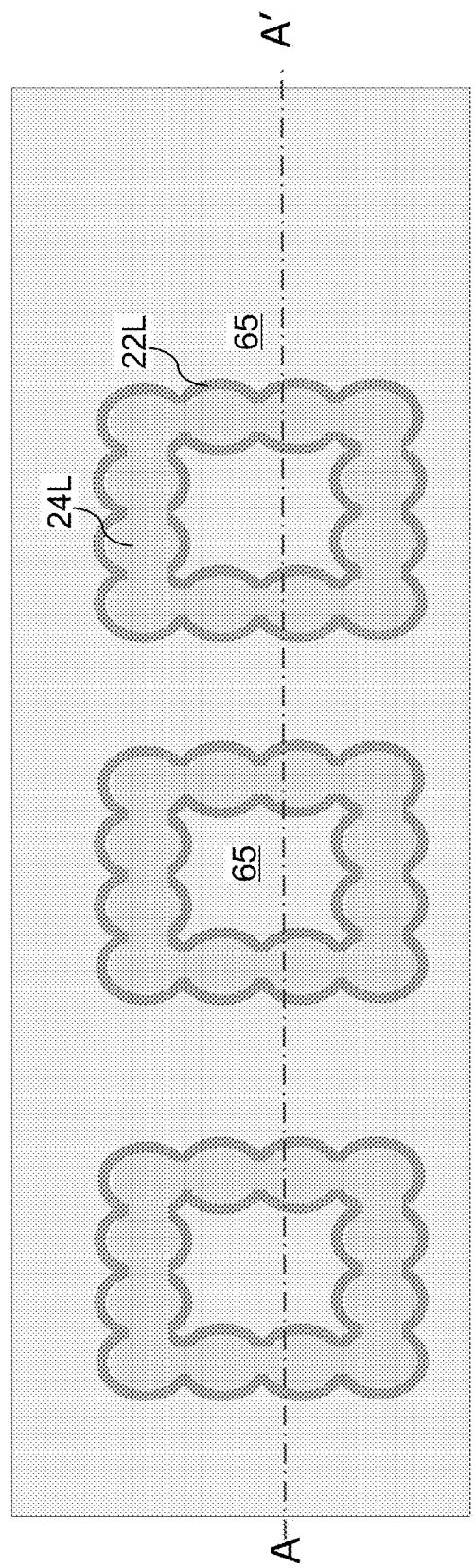
FIG. 25C is a horizontal cross-sectional view along the horizontal plane C-C' of the exemplary structure of FIG. 25A.

Referring to FIGS. 25A-25C, the patterned photoresist layer 27 can be removed, for example, by ashing.

Figure 26B:
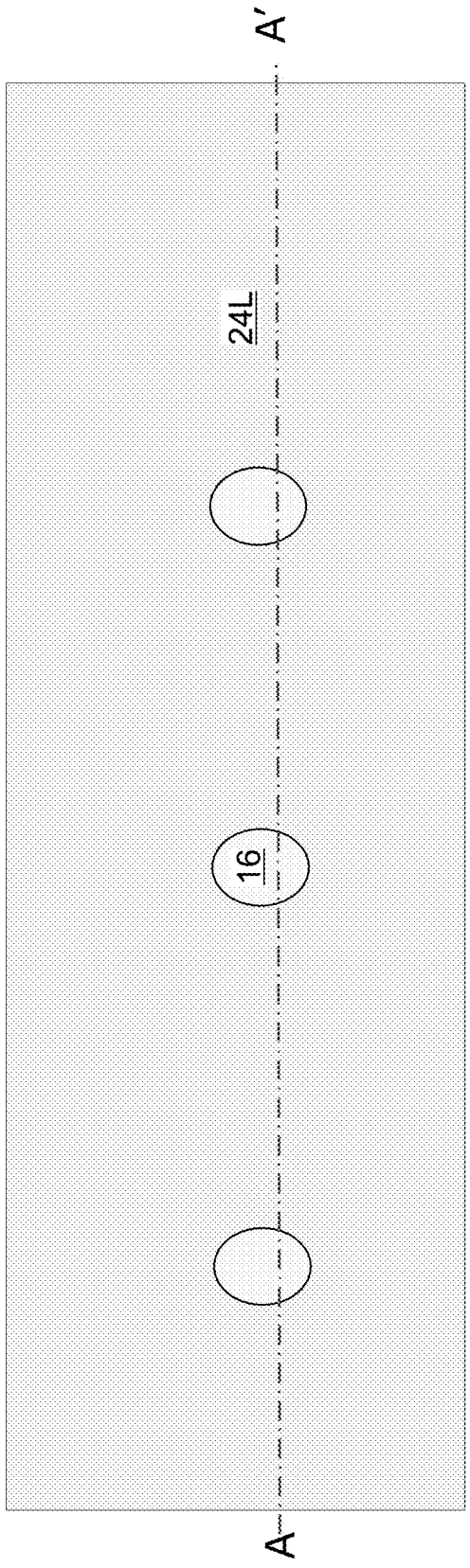
FIG. 26B is a top-down view of the exemplary structure of FIG. 26A. The vertical plane A-A' is the plane of the cross-section for FIG. 26A.
Figure 26A:
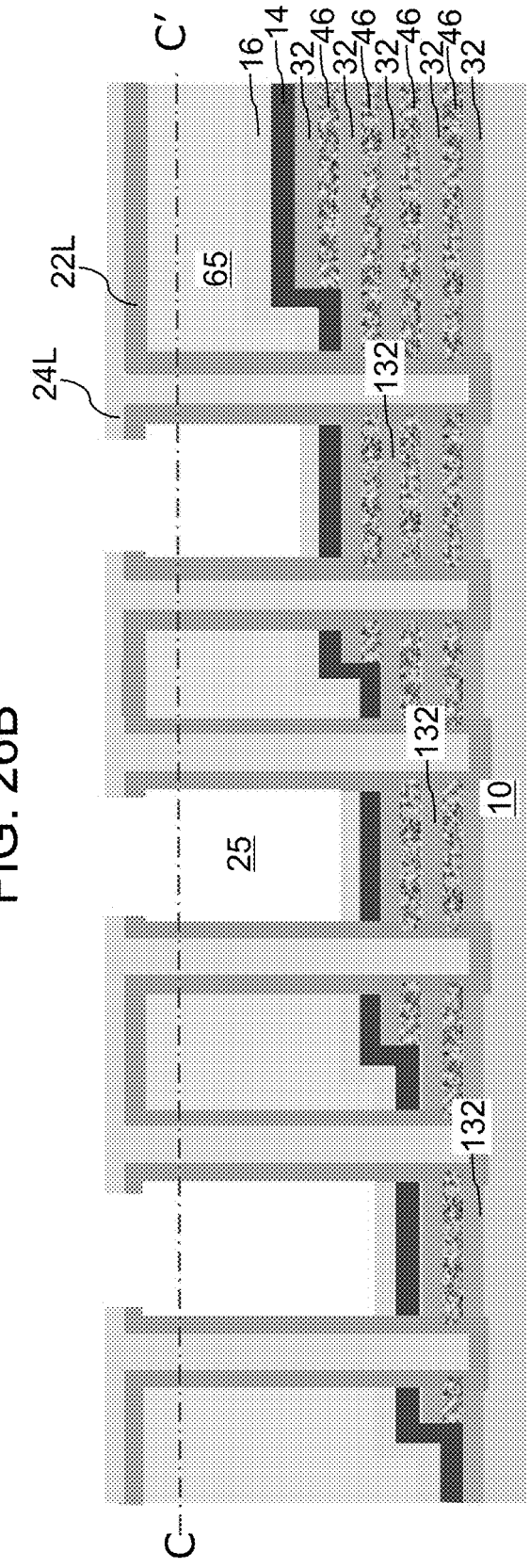
FIG. 26A is a schematic vertical cross-sectional view of a staircase region of the exemplary structure after removal of unmasked portions of a dielectric material according to an embodiment of the present disclosure.
Figure 26C:
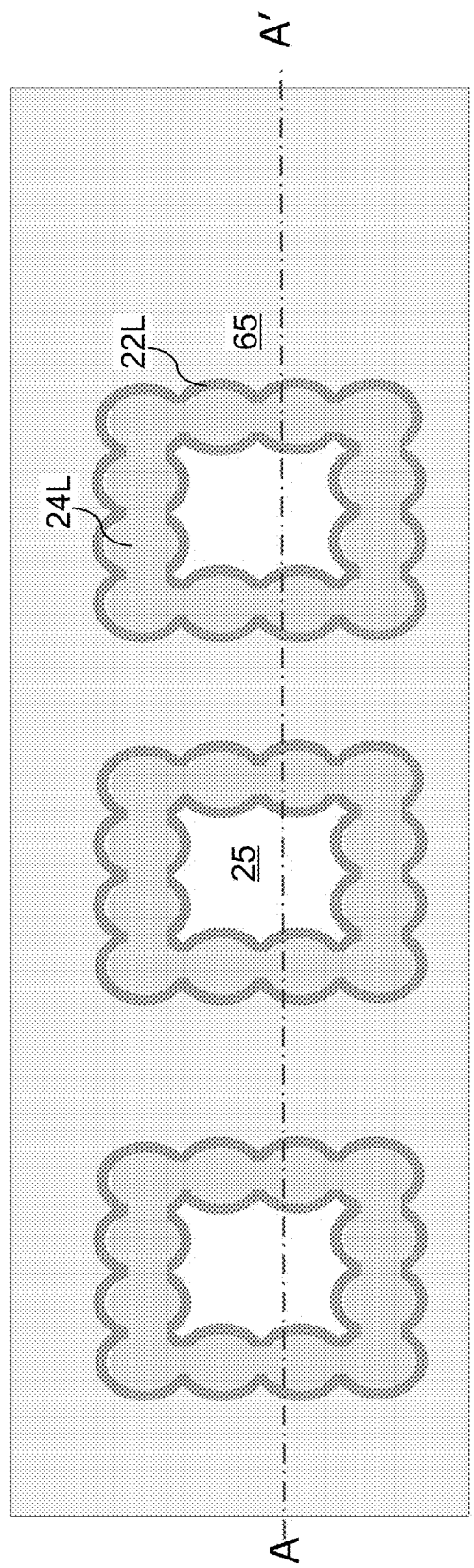
FIG. 26C is a horizontal cross-sectional view along the horizontal plane C-C' of the exemplary structure of FIG. 26A.

Referring to FIGS. 26A-26C, discrete patterned regions of the retro-stepped dielectric material portion 65 laterally surrounded by a respective interconnected support cavity 117 (as filled by a combination of the dielectric liner layer 22L and the fill material layer 24L) can be removed by performing an isotropic etch process. For example, if the retro-stepped dielectric material portion 65 comprises silicon oxide, a wet etch process employing dilute hydrofluoric acid can be performed to remove each discrete patterned region of the retro-stepped dielectric material portion 65 laterally surrounded by a respective interconnected support cavity 117. A contact cavity 25 can be formed within each volume from which a discrete patterned region of the retro-stepped dielectric material portion 65 is removed. The at least one etch stop liner (14, 16) can be used as a self-aligned etch stop structure. For example, if the first etch stop liner 14 includes silicon oxide and if the second etch stop liner 16 includes silicon nitride, the wet etch process employing dilute hydrofluoric acid can stop on the silicon nitride material of the second etch stop liner 16.

Figure 27B:
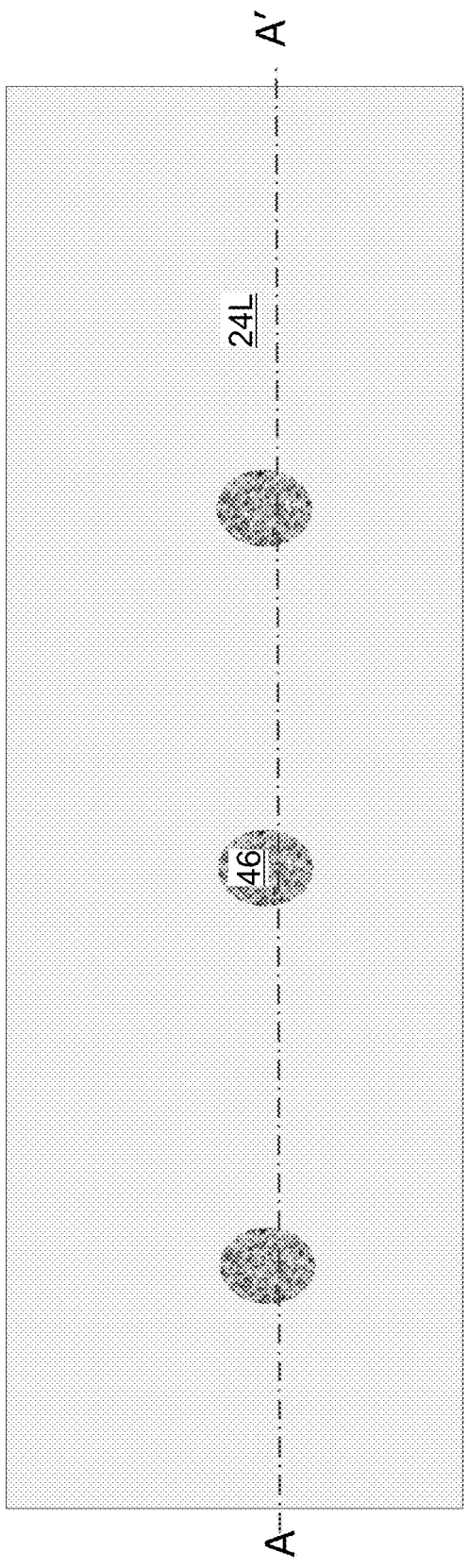
FIG. 27B is a top-down view of the exemplary structure of FIG. 27A. The vertical plane A-A' is the plane of the cross-section for FIG. 27A.
Figure 27A:
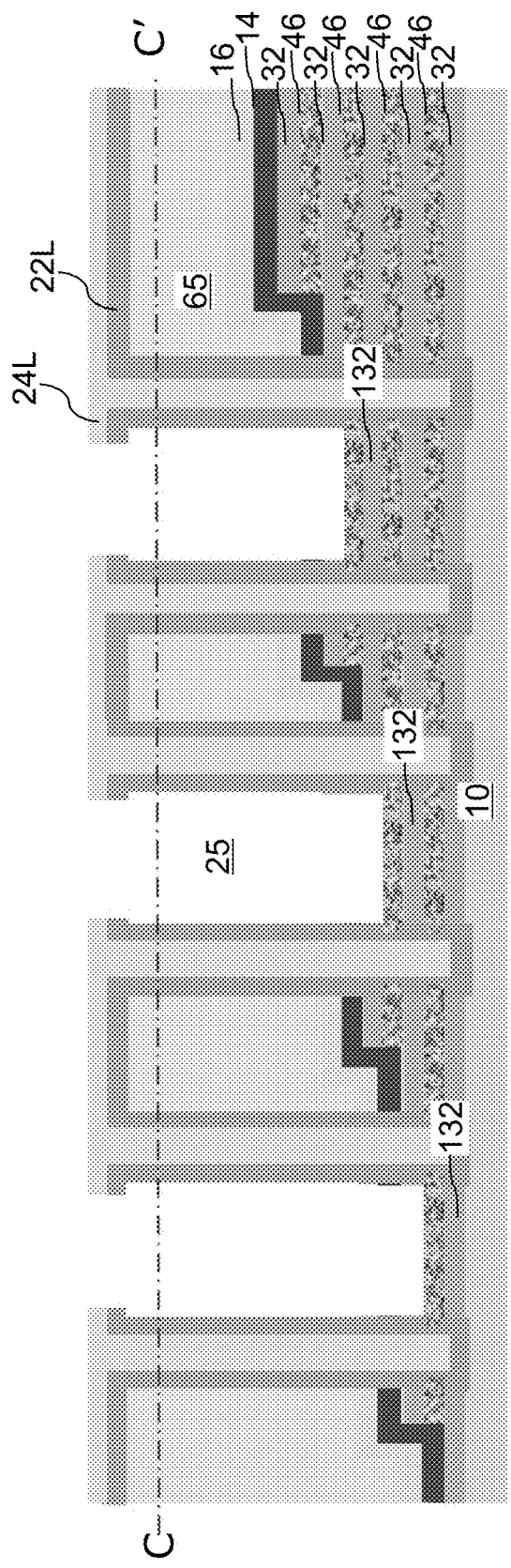
FIG. 27A is a schematic vertical cross-sectional view of a staircase region of the exemplary structure after removal of physically exposed portions of the at least one etch stop liner and the insulating layers according to an embodiment of the present disclosure.
Figure 27C:
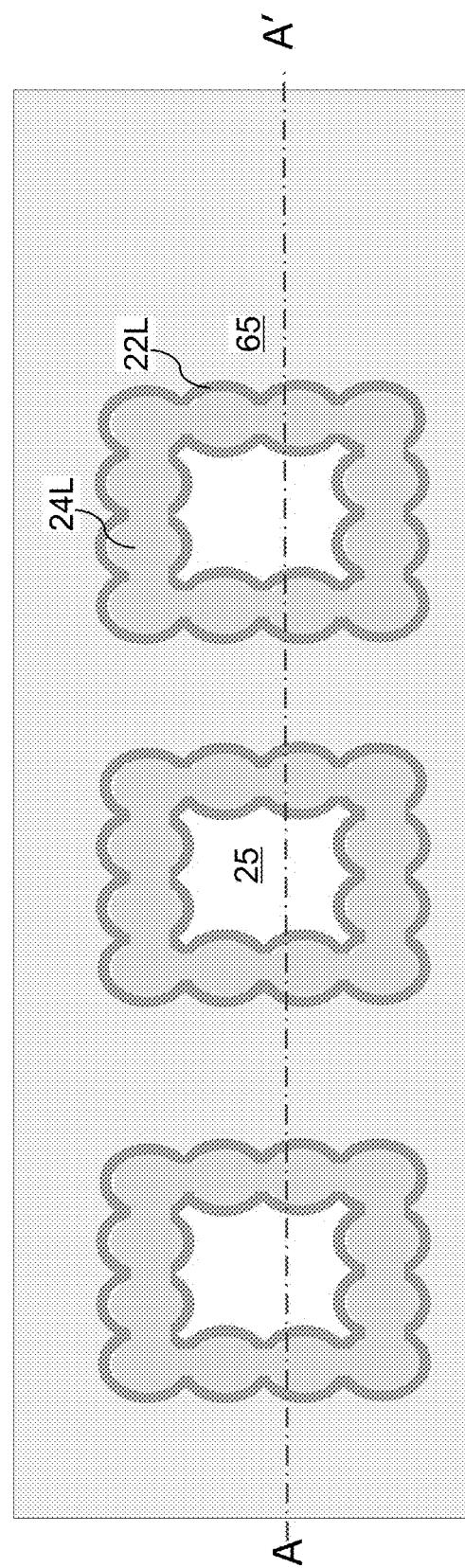
FIG. 27C is a horizontal cross-sectional view along the horizontal plane C-C' of the exemplary structure of FIG. 27A.

Referring to FIGS. 27A-27C, patterned portions of the at least one etch stop dielectric layer (14, 16) and a topmost insulating plate 132 underlying the contact cavities 25 can be removed by performing at least one etch process. In one embodiment, the at least one etch process may comprise at least one anisotropic etch process that employs the fill material layer 24L and/or the dielectric liner layer 22L as an etch mask. Alternatively or additionally, the at least one etch process may comprise an isotropic etch process. A top surface of an electrically conductive layer 46 can be physically exposed at the bottom of each contact via cavity 25.

Generally, each contact cavity 25 can be formed by removing a region of the retro-stepped dielectric material portion 65 that is laterally surrounded a respective interconnected support cavity 117 that is filled by a combination of the fill material layer 24L and the dielectric liner layer 22L. Each volume of the combination of the fill material layer 24L and the dielectric liner layer 22L that fills a respective interconnected support cavity 117 constitutes a laterally perforated support pillar structure, which includes lateral perforations at levels of the electrically conductive layers 46 that underlie a respective contact cavity 25. Each portion of the at least one etch stop liner (14, 16) that underlie the contact cavities 25 are removed, and a topmost insulating plate 132 can be removed from underneath each contact cavity 25. For each contact cavity 25, a top surface of a topmost electrically conductive layer 46 of a subset of electrically conductive layers 46 that underlie the contact cavity 25 can be physically exposed.

Figure 28B:
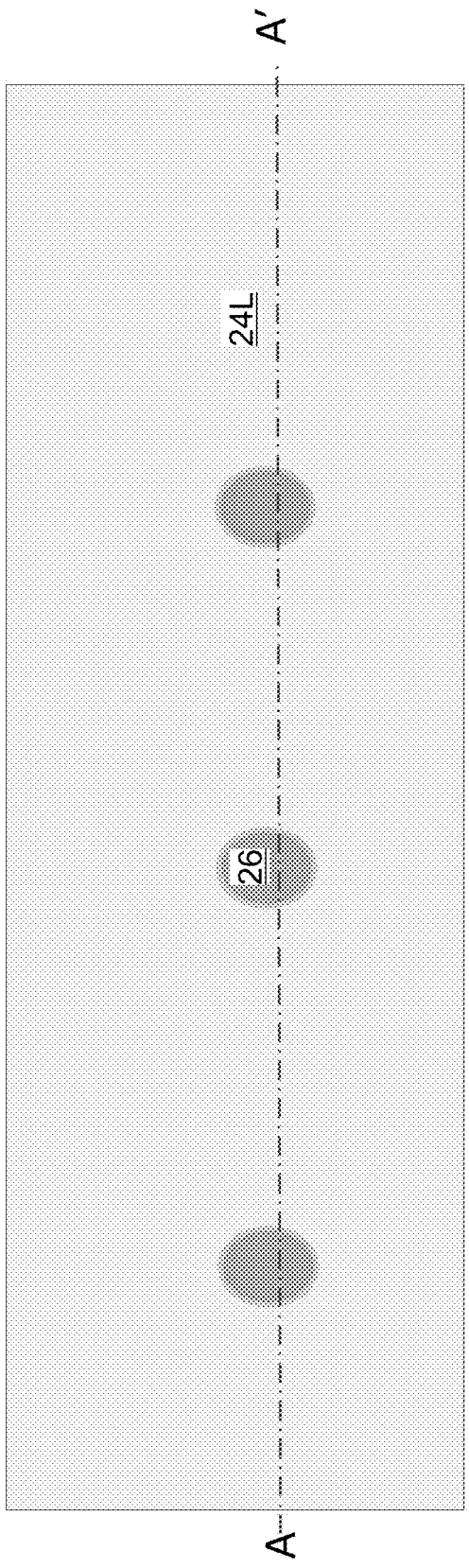
FIG. 28B is a top-down view of the exemplary structure of FIG. 28A. The vertical plane A-A' is the plane of the cross-section for FIG. 28A.
Figure 28A:
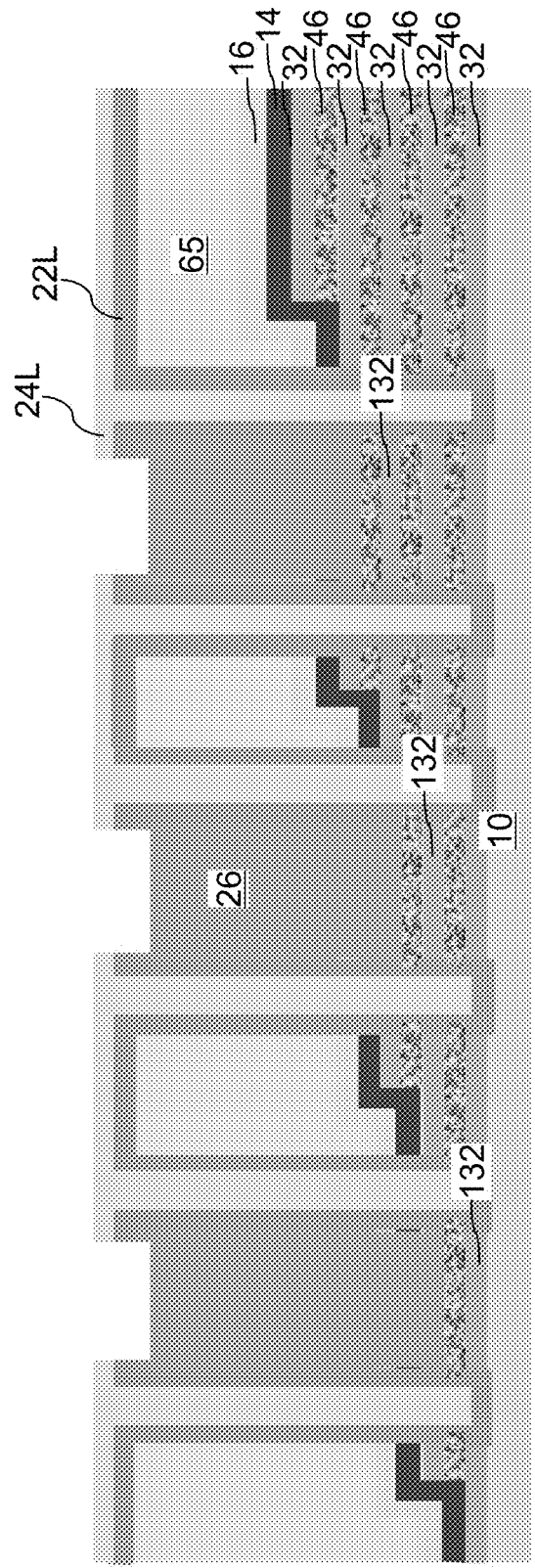
FIG. 28A is a schematic vertical cross-sectional view of a staircase region of the exemplary structure after formation of sacrificial via fill material portions according to an embodiment of the present disclosure.

Referring to FIGS. 28A and 28B, a sacrificial fill material such as a photoresist material or amorphous carbon may be deposited in the contact cavities 25 to form sacrificial contact cavity fill structures 26.

Referring to FIGS. 29A-29D, a planarization process such as a chemical mechanical polishing process can be performed to remove portions of the fill material layer 24L and the dielectric liner layer 22L that overlie the horizontal plane including the top surface of the insulating cap layer 70. Each remaining contiguous portion of the fill material layer 24L and the dielectric liner layer 22L that fills a respective interconnected support cavity 117 constitutes a laterally perforated support pillar structure 120. Generally, each interconnected support cavity 117 can be filled with at least one fill material having an inner dielectric sidewall and an outer sidewall to form a laterally perforated support pillar structure 120. In the illustrated example, each remaining patterned portion of the dielectric liner layer 22L comprises a dielectric liner 22, and each patterned portion of the fill material layer 24L comprises a fill material portion 24. Each laterally perforated support pillar structure 120 can include a respective combination of a dielectric liner 22 and a fill material portion 24. The dielectric liner 22 that is formed on sidewalls of the alternating stack (32, 46) and the retro-stepped dielectric material portion 65, and a fill material portion 24 that is formed within the dielectric liner 22.

Each laterally perforated support pillar structure 120 can be located in the staircase region 300, and can include an outer sidewall 120A (for example, as illustrated in FIG. 29B) and an inner sidewall 120B laterally offset inward from the outer sidewall (for example, as illustrated in FIG. 29B) at levels of a subset of the electrically conductive layers 46.

Figure 29C:
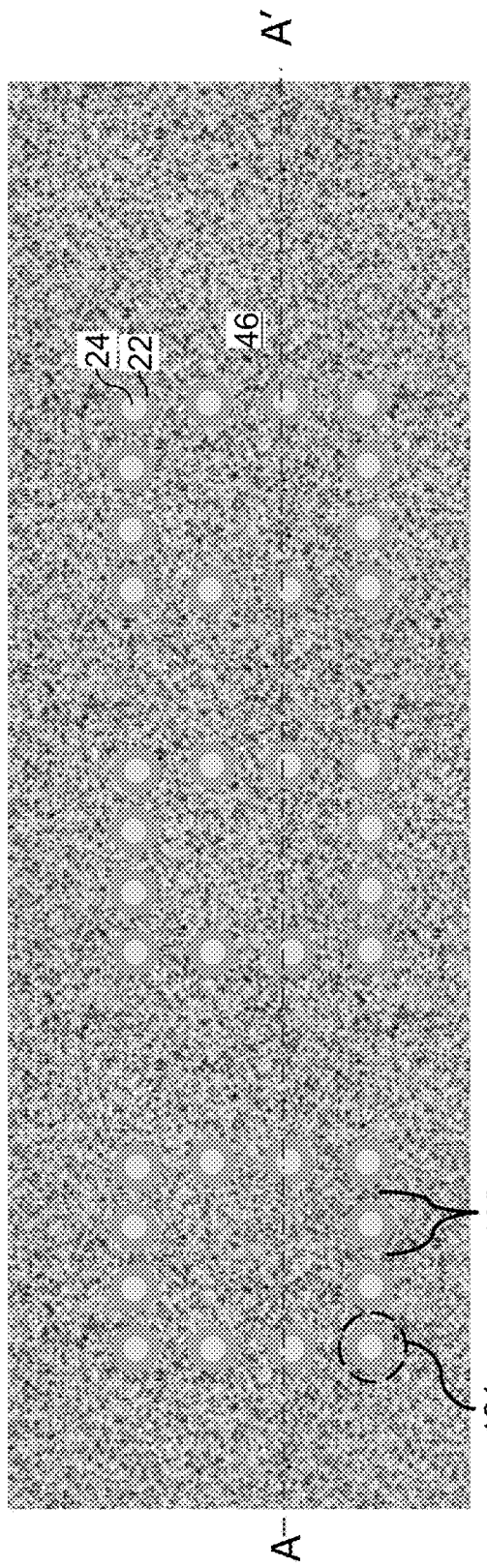
FIG. 29C is a horizontal cross-sectional view along the horizontal plane C-C' of the exemplary structure of FIG. 29A.

Each of the laterally perforated support pillar structure 120 may comprise an array of pedestals 121 that are laterally spaced apart at each level of the subset of the electrically conductive layers 46, as illustrated in FIG. 29C. Each of the laterally perforated support pillar structures 120 may also have lateral openings 122 (for example, as illustrated in FIG. 29C) between an array of pedestals 121 at each level of the subset of the electrically conductive layers 46. The lateral openings 122 can comprise gaps between neighboring pairs of the pedestals 121 of the laterally perforated support pillar structure 120. In one embodiment, the array of pedestals 121 may be arranged in a pattern in which the pedestals 121 are spaced along four sides of a rectangular shape in the plan view as illustrated in FIG. 29C. Alternatively, the array of pedestals 121 may be spaced along six sides of a hexagonal shape in the plan view.

Thus, the openings 122 are laterally spaced apart by the pedestals 121 at each level of the subset of the electrically conductive layers 46, as illustrated in FIG. 29C. Thus, the openings 122 are located at levels of a subset of the electrically conductive layers 46 having a respective lateral boundary (i.e., an outer periphery located below or above the outer sidewall 120A) that encloses an area of the laterally perforated support pillar structure 120 in a plan view, which is a view along a vertical direction that is perpendicular to the top surface of the semiconductor material layer 10. Each electrically conductive layer 46 within the subset of the electrically conductive layers 46 extends from outside an area defined by the outer sidewall 120A through a respective subset of lateral openings 122 into an area defined by (i.e., located inside as well as above or below) the inner sidewall 120B, as illustrated in FIG. 29C.

In one embodiment, each of the outer sidewall and the inner sidewall vertically extends through the retro-stepped dielectric material portion 65. Each of the lateral opening within the laterally perforated support pillar structure 120 has a respective height that is the same as a height of a respective electrically conductive layer 46 that laterally extends therethrough.

Figure 29D:
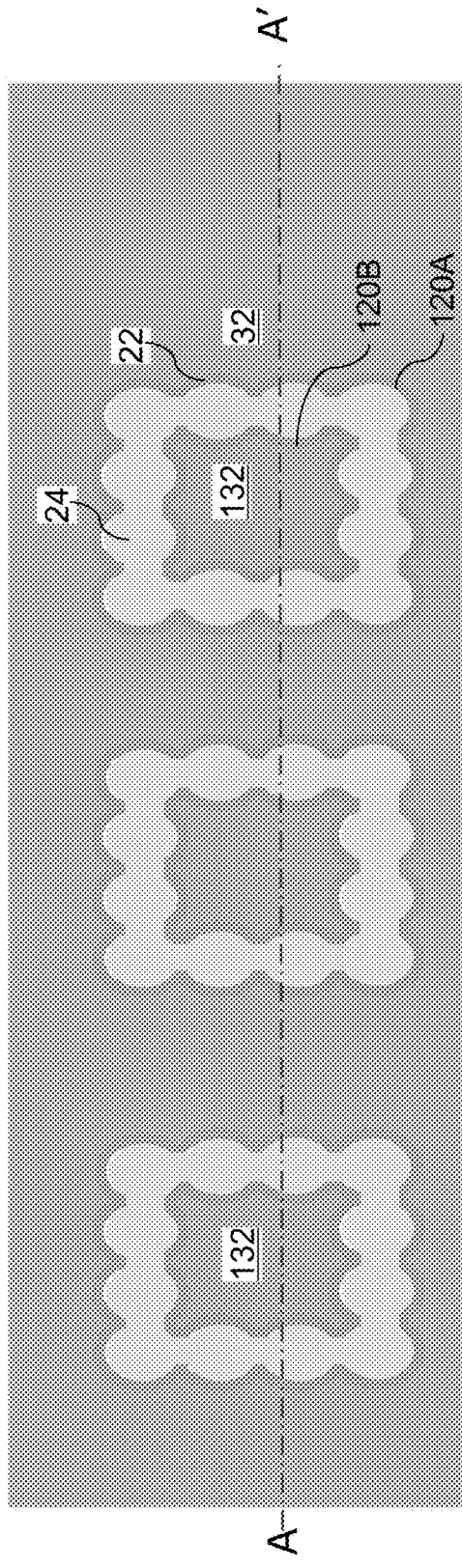
FIG. 29D is a horizontal cross-sectional view along the horizontal plane D-D' of the exemplary structure of FIG. 29A.

In one embodiment, a subset of the insulating layers 32 has a respective lateral boundary corresponding to the outer sidewall 120A that encloses the area of a laterally perforated support pillar structure 120 in the plan view, and each insulating layer 32 of the subset of the insulating layers 32 comprises a respective opening having a set of sidewall segments that contact a respective contiguous set of vertically-straight and laterally-convex outer sidewall 120A segments of the laterally perforated support pillar structure 120 as illustrated in FIG. 29D. In one embodiment, the set of sidewall segments of each insulating layer 32 of the subset of the insulating layers 32 comprises a plurality of concave sidewall segments that are adjoined to each other at vertical edges and defines a continuous surface having a closed top periphery and a closed bottom periphery and not having any lateral opening therethrough. The vertical distance between the closed top periphery and the closed bottom periphery is the same as the height of the respective insulating layer 32.

At least one insulating plate 132 can be laterally surrounded by the inner sidewall 120B of the laterally perforated support pillar structure 120, and can comprise a same material as the insulating layers 32, and can be located at the levels of the subset of the insulating layers 32.

Figure 30C:
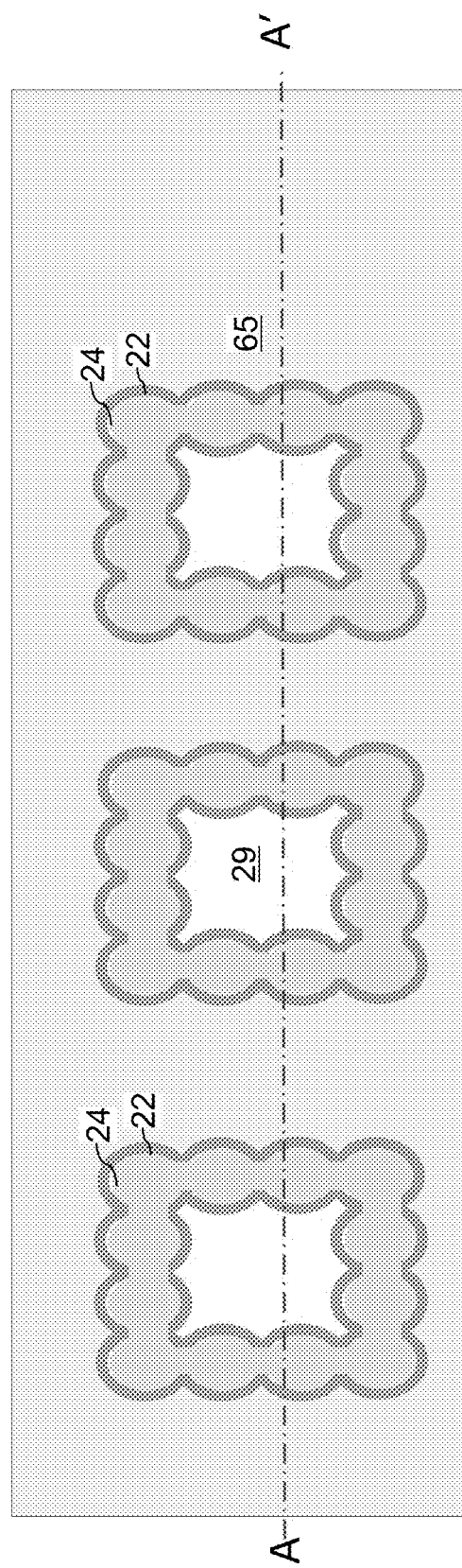
FIG. 30C is a horizontal cross-sectional view along the horizontal plane C-C' of the exemplary structure of FIG. 30A.

Referring to FIGS. 30A-30C, the sacrificial contact cavity fill structures 26 can be removed, for example, by ashing. A contact cavity 29 can be formed within each volume of the contact cavity 25 shown in FIGS. 27A-27C. The contact cavity 29 is laterally surrounded by a respective laterally perforated support pillar structure 120. A top surface of a topmost electrically conductive layer 46 of a subset of electrically conductive layers 46 that underlie the contact cavity 29 is physically exposed underneath each contact cavity 29.

Referring to FIGS. 31A and 31B, layer contact via structures (e.g., word line contact via structures) 86 can be formed within each contact cavity 29 by depositing at least one conductive material in the contact cavities 29 and removing portions of the at least one conductive material from above the horizontal plane including the top surface of the insulating cap layer 70. Generally, each layer contact via structure 86 can be formed within the inner sidewall 120B of the respective laterally perforated support pillar structure 120 directly on an exposed topmost electrically conductive layer 46 of the subset of electrically conductive layers 46 located below the respective contact via cavity 29. The at least one conductive fill material can be deposited in the contact via cavities 29, and can be removed from above the contact via cavities 29 by performing a planarization process, which may employ a chemical mechanical polishing process and/or a recess etch process. Each layer contact via structure 86 comprises a remaining portion of the at least one conductive fill material. Each layer contact via structure 86 is formed on the top surface of the topmost electrically conductive layer 46 of the subset of the electrically conductive layers 46 that underlie a respective contact via cavity 29. Thus, each layer contact via structure 86 can be laterally surrounded by a respective laterally perforated support pillar structure 120, and can contact a top surface of a topmost electrically conductive layer 46 of the subset of the electrically conductive layers 46 that underlie a respective contact via cavity 29.

In one embodiment, each layer contact via structure 86 may comprises a top surface located within a horizontal plane including a top surface of the insulating cap layer 70, a sidewall that contacts an inner sidewall of a laterally perforated support pillar structure 120, and a bottom surface that contacts the top surface of the topmost electrically conductive layer 46 of the subset of the electrically conductive layers 46 that underlie the layer contact via structure 86.

In one embodiment, each laterally perforated support pillar structure 120 comprises a dielectric liner 22 contacting the alternating stack (32, 46) and the retro-stepped dielectric material portion 65, and a fill material portion 24 laterally surrounded by the dielectric liner 22, and is spaced from the alternating stack (32, 46), the retro-stepped dielectric material portion 65, and the layer contact via structure 86 by the dielectric liner 22. In one embodiment, an inner surface and an outer surface of each laterally perforated support pillar structure 120 may comprise a respective laterally undulating vertical cross-sectional profile such that the fill material portion 24 has a greater lateral extent at levels of the insulating layers 32 that underlie the retro-stepped dielectric material portion 65 than at levels of the electrically conductive layers 46 that underlie the retro-stepped dielectric material portion 65.

Figure 32B:
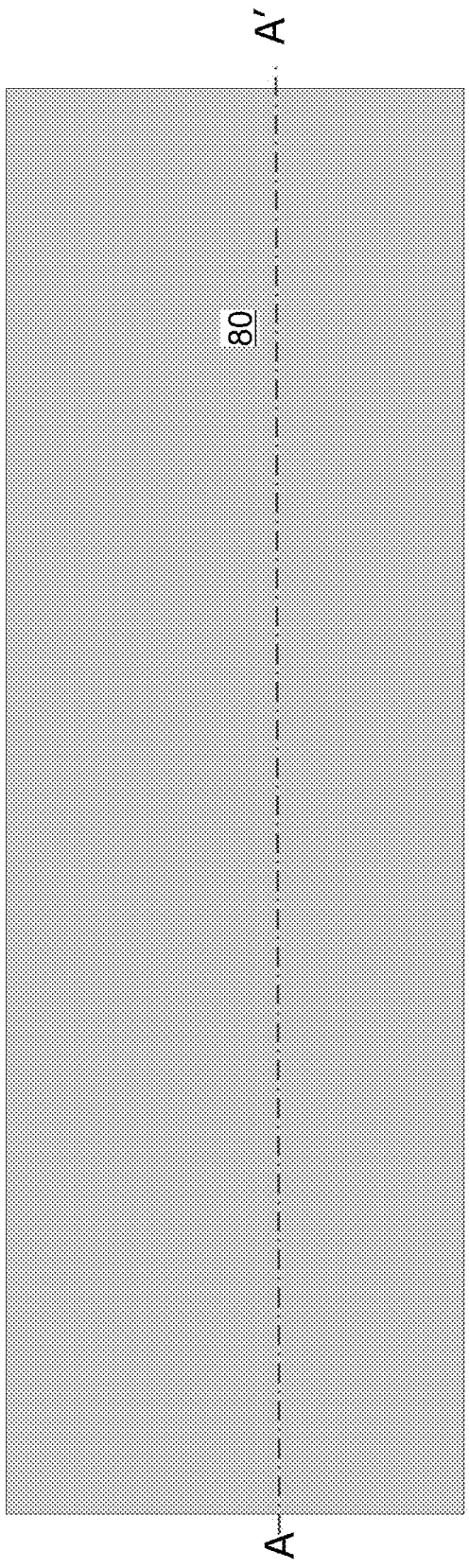
FIG. 32B is a top-down view of the exemplary structure of FIG. 32A. The vertical plane A-A' is the plane of the cross-section for FIG. 32A.
Figure 32A:
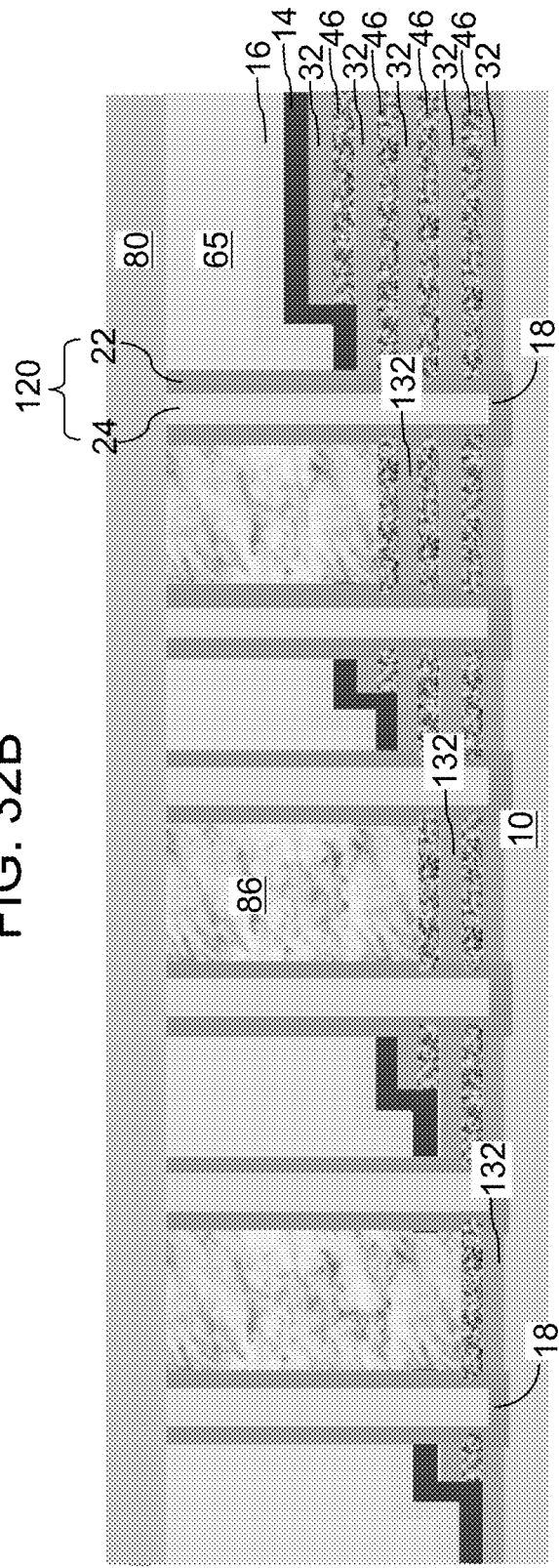
FIG. 32A is a schematic vertical cross-sectional view of a staircase region of the exemplary structure after formation of a contact-level dielectric layer according to an embodiment of the present disclosure.
Figure 32C:
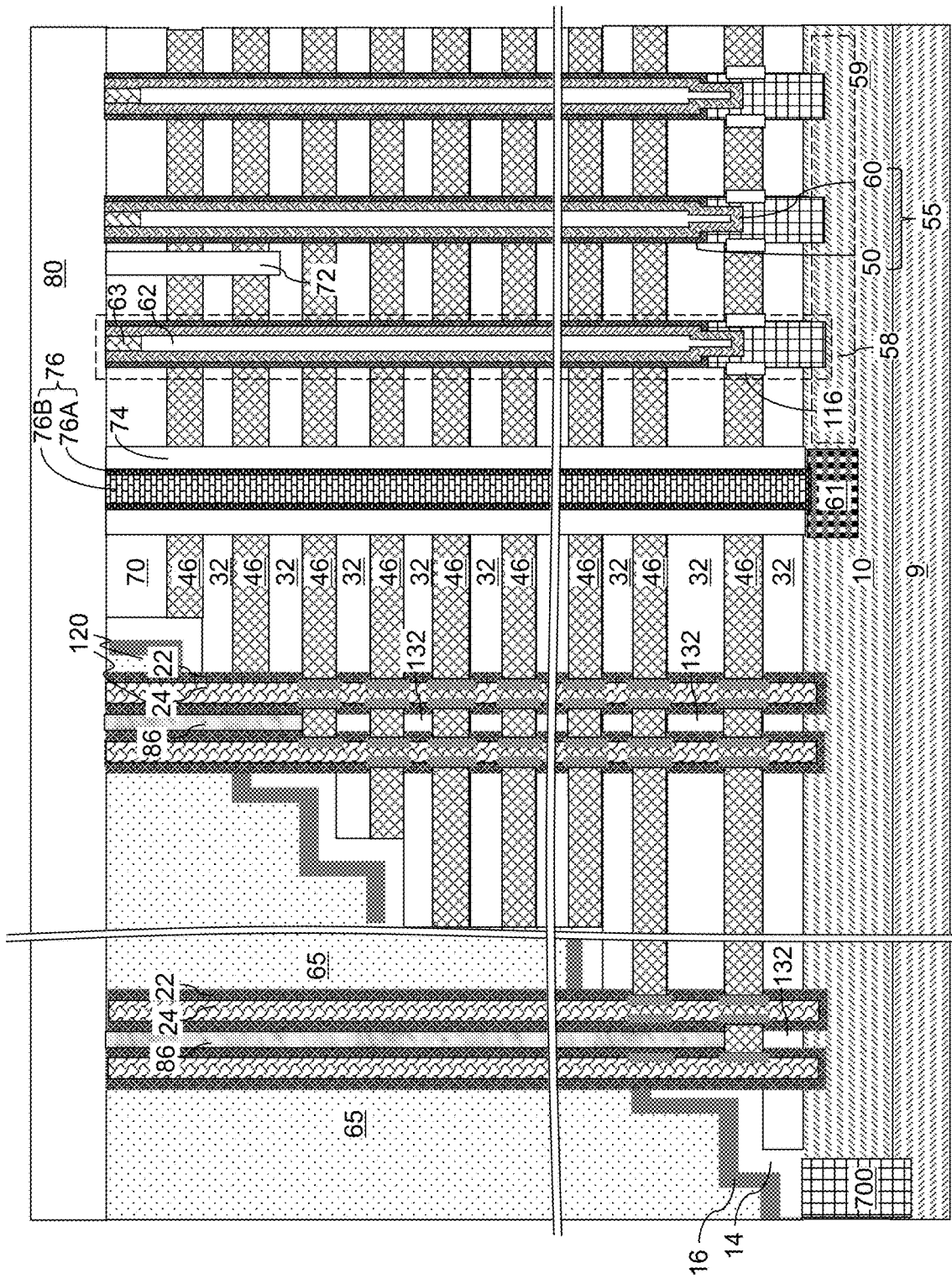
FIG. 32C is a schematic vertical cross-sectional view of the exemplary structure at the processing steps of FIGS. 32A and 32B.

Referring to FIGS. 32A-32C, a contact-level dielectric layer 80 can be deposited over the retro-stepped dielectric material portion 65 and the insulating cap layer 70. The contact-level dielectric layer 80 includes a dielectric material such as silicon oxide, and may have a thickness in a range from 50 nm to 600 nm, although lesser and greater thicknesses may also be employed.

Figure 33B:
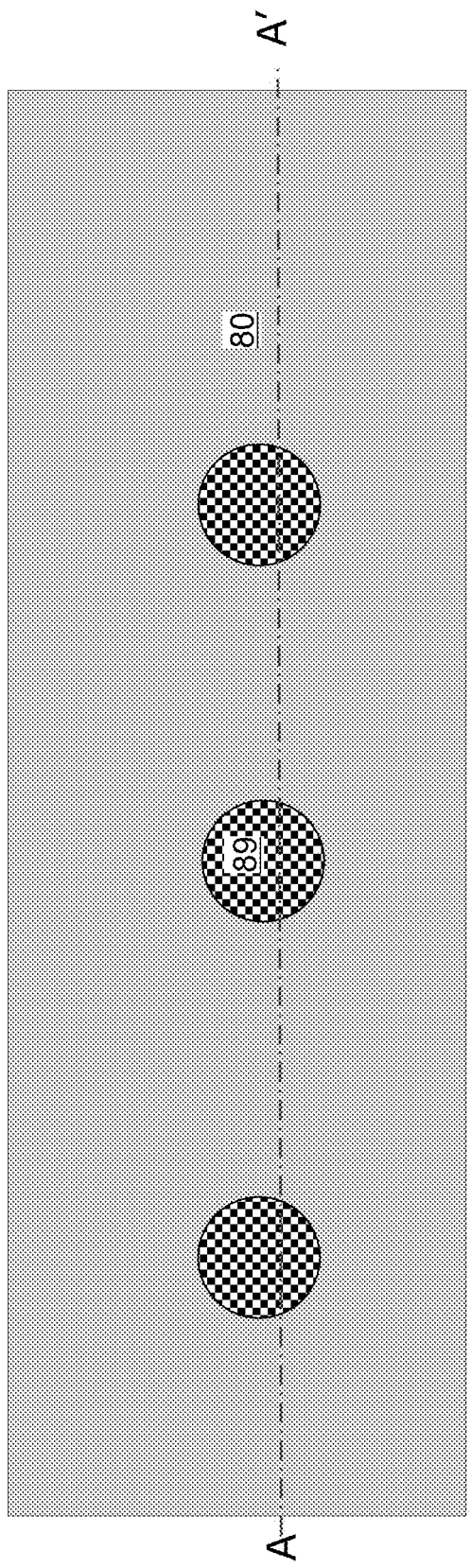
FIG. 33B is a top-down view of the exemplary structure of FIG. 33A. The vertical plane A-A' is the plane of the cross-section for FIG. 33A.
Figure 33A:
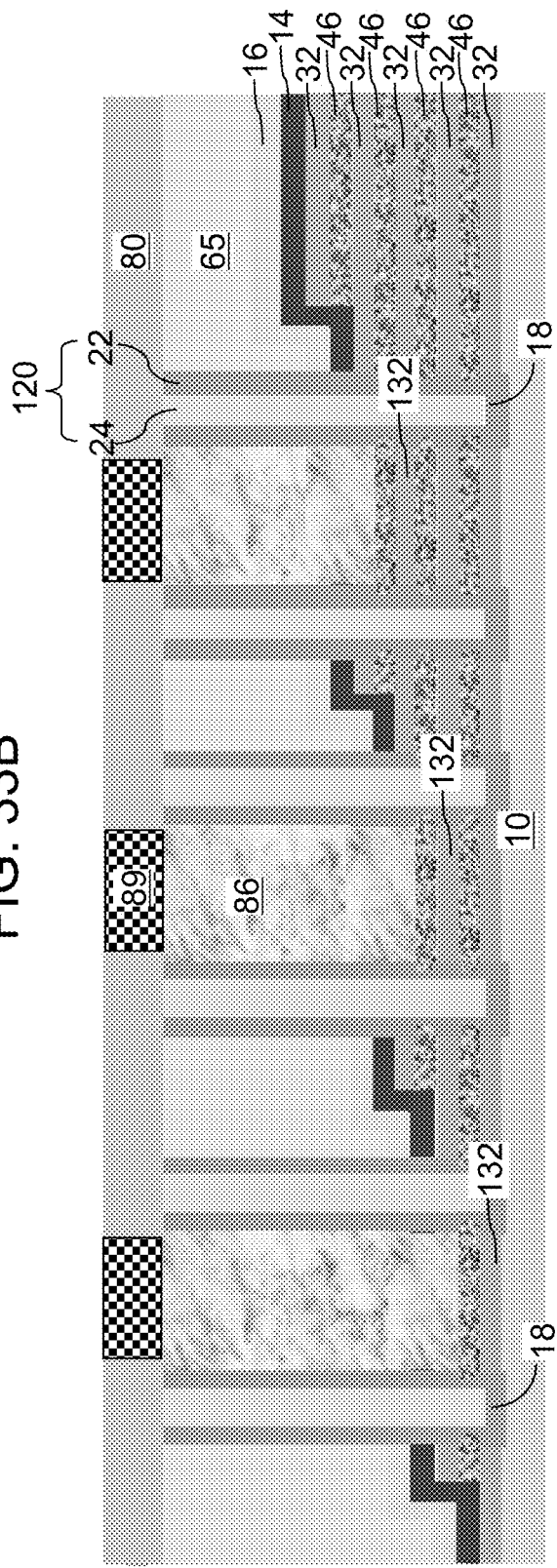
FIG. 33A is a schematic vertical cross-sectional view of a staircase region of the exemplary structure after formation of drain contact via structures and connection via structures according to an embodiment of the present disclosure.
Figure 33C:
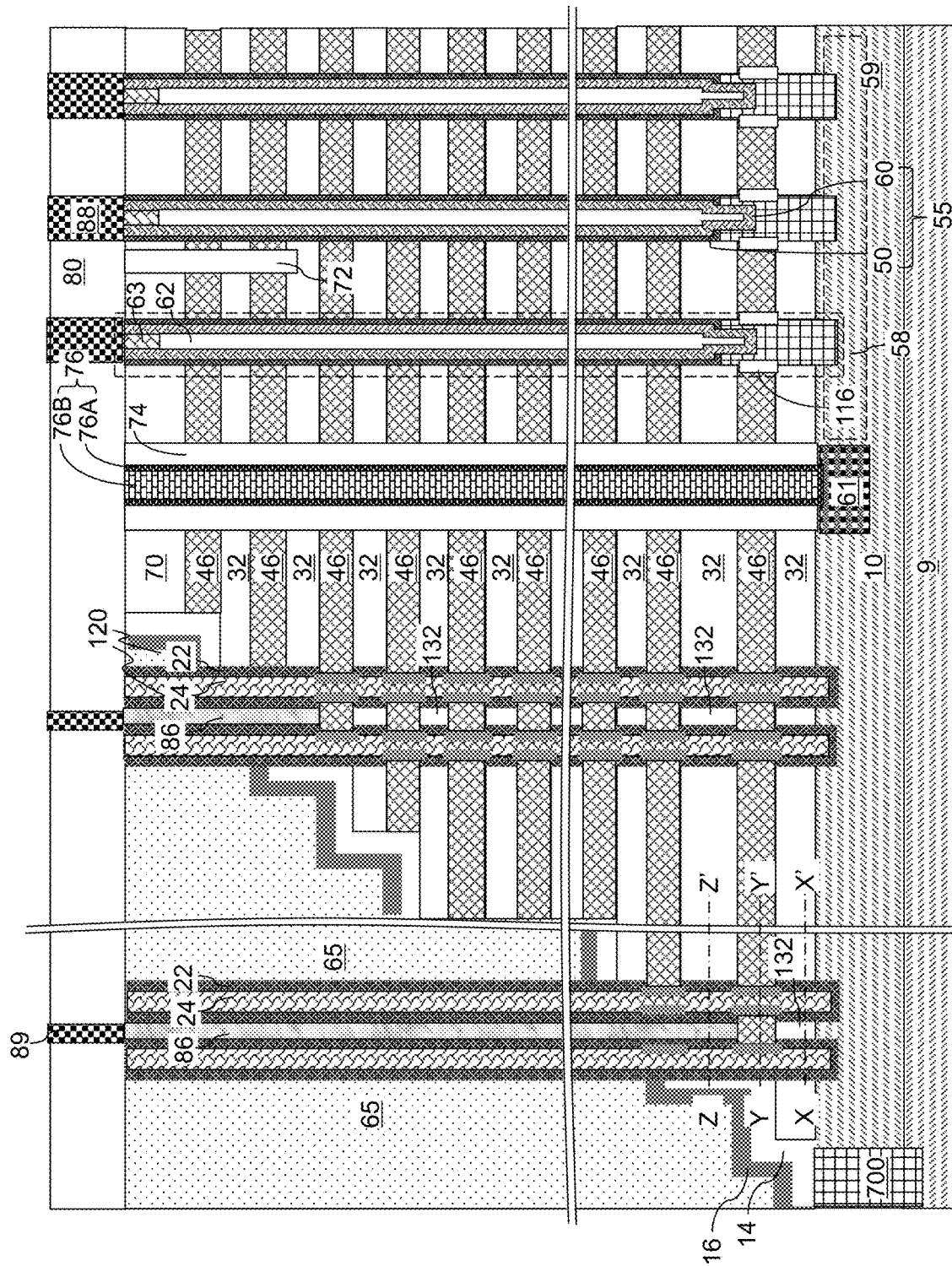
FIG. 33C is a schematic vertical cross-sectional view of the exemplary structure at the processing steps of FIGS. 33A and 33B.

Referring to FIGS. 33A-33C, various conductive via structures (88, 89) can be formed through the contact-level dielectric layer 80. The conductive via structures (88, 89) can include, for example, drain contact via structures 88 contacting a top surface of a respective one of the drain regions 63, and connection via structures 89 contacting a top surface of a respective one of the layer contact via structures 86. Bit lines (not shown) can then be formed in electrical contact with the drain contact via structures 88.

Figure 34A:
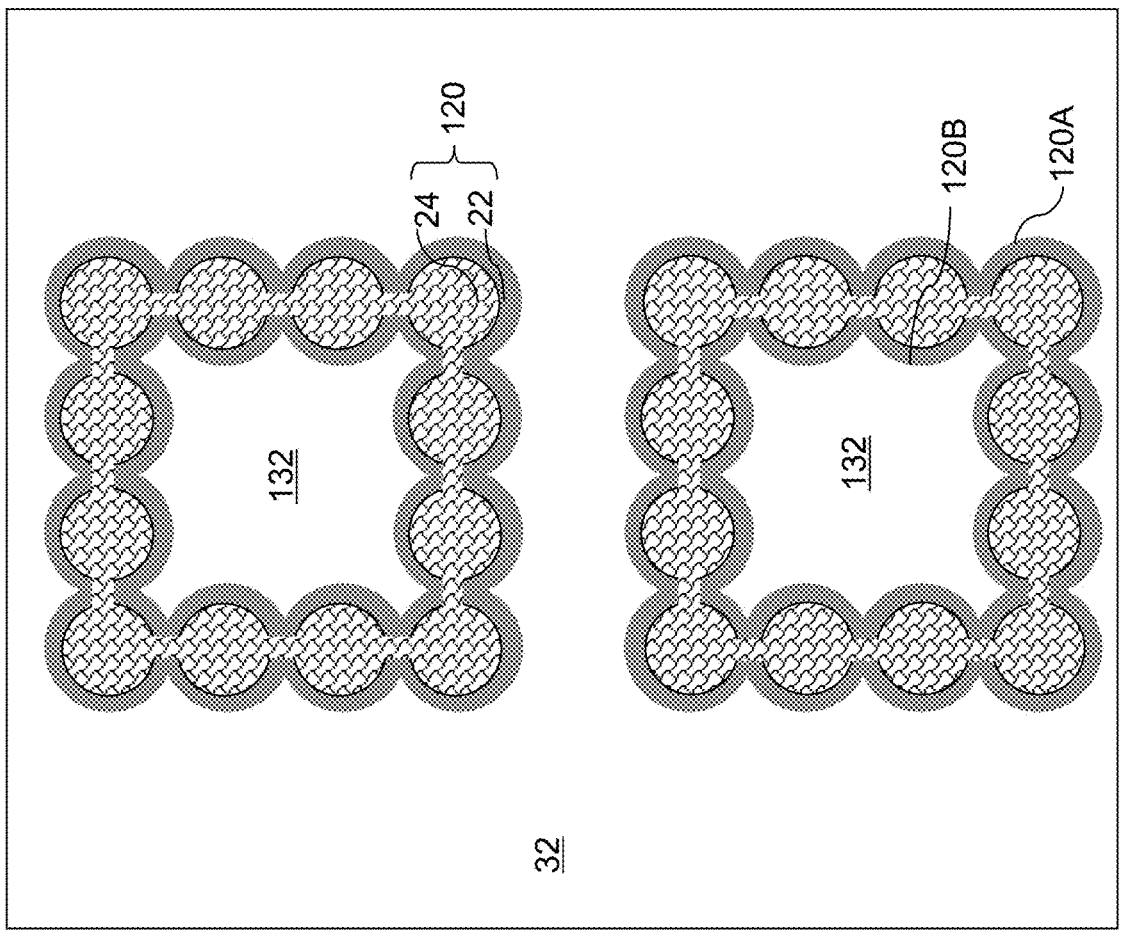
FIG. 34A is a horizontal cross-sectional view along the horizontal plane X-X' of FIG. 33C for a first configuration of the exemplary structure according to an embodiment of the present disclosure.
Figure 34B:
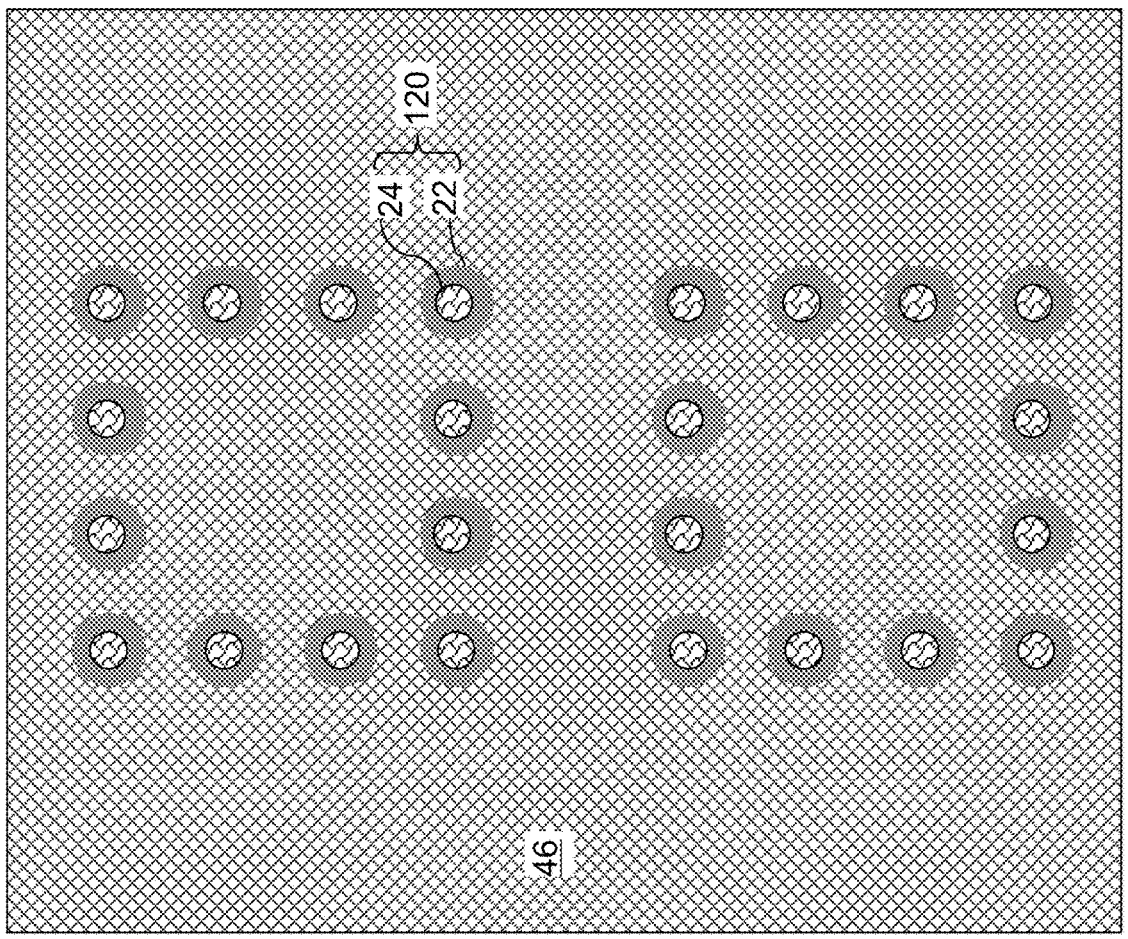
FIG. 34B is a horizontal cross-sectional view along the horizontal plane Y-Y' of FIG. 33C for the first configuration of the exemplary structure according to an embodiment of the present disclosure.
Figure 34C:
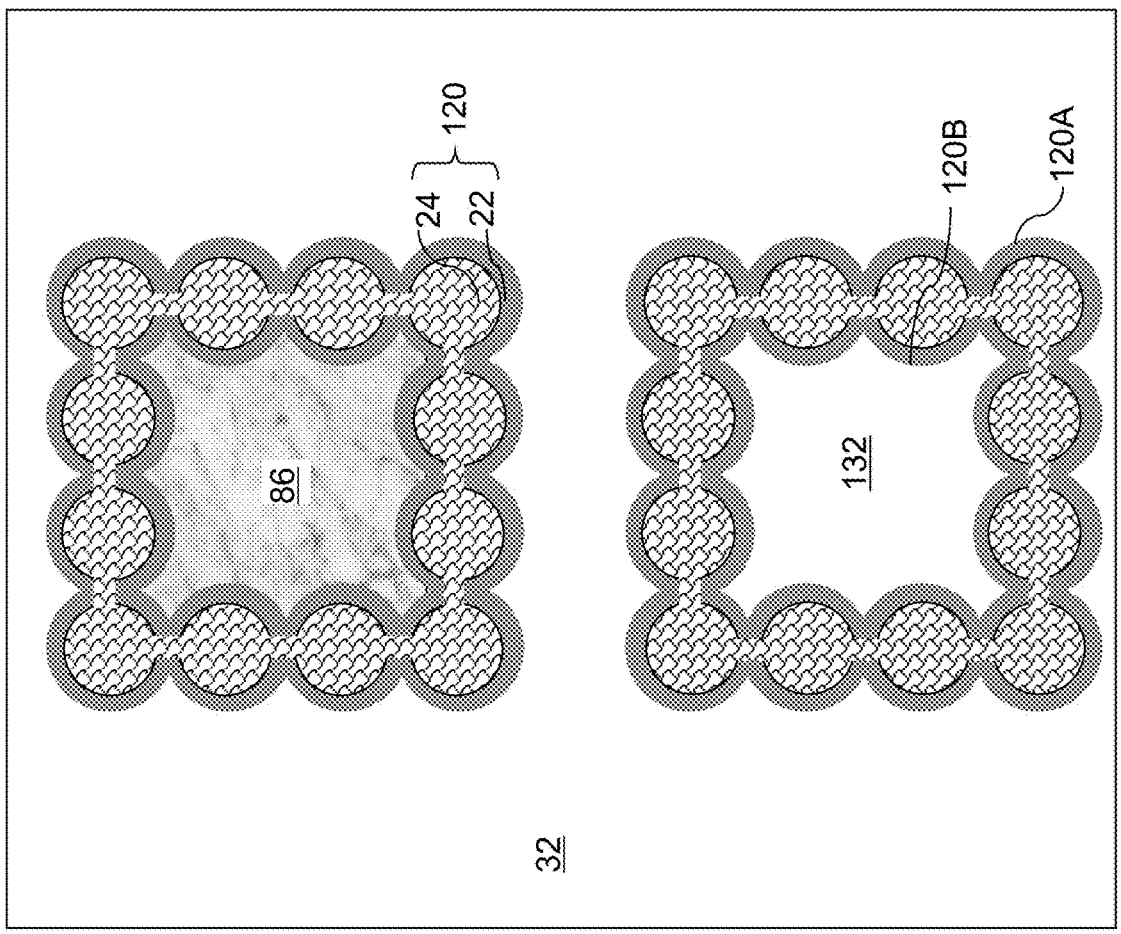
FIG. 34C is a horizontal cross-sectional view along the horizontal plane Z-Z' of FIG. 33C for the first configuration of the exemplary structure according to an embodiment of the present disclosure.

FIGS. 34A-34C illustrate a first configuration of the exemplary structure in which support openings 17 for forming an interconnected support cavity 117 are arranged along a periphery of a square shape.

Figure 35B:
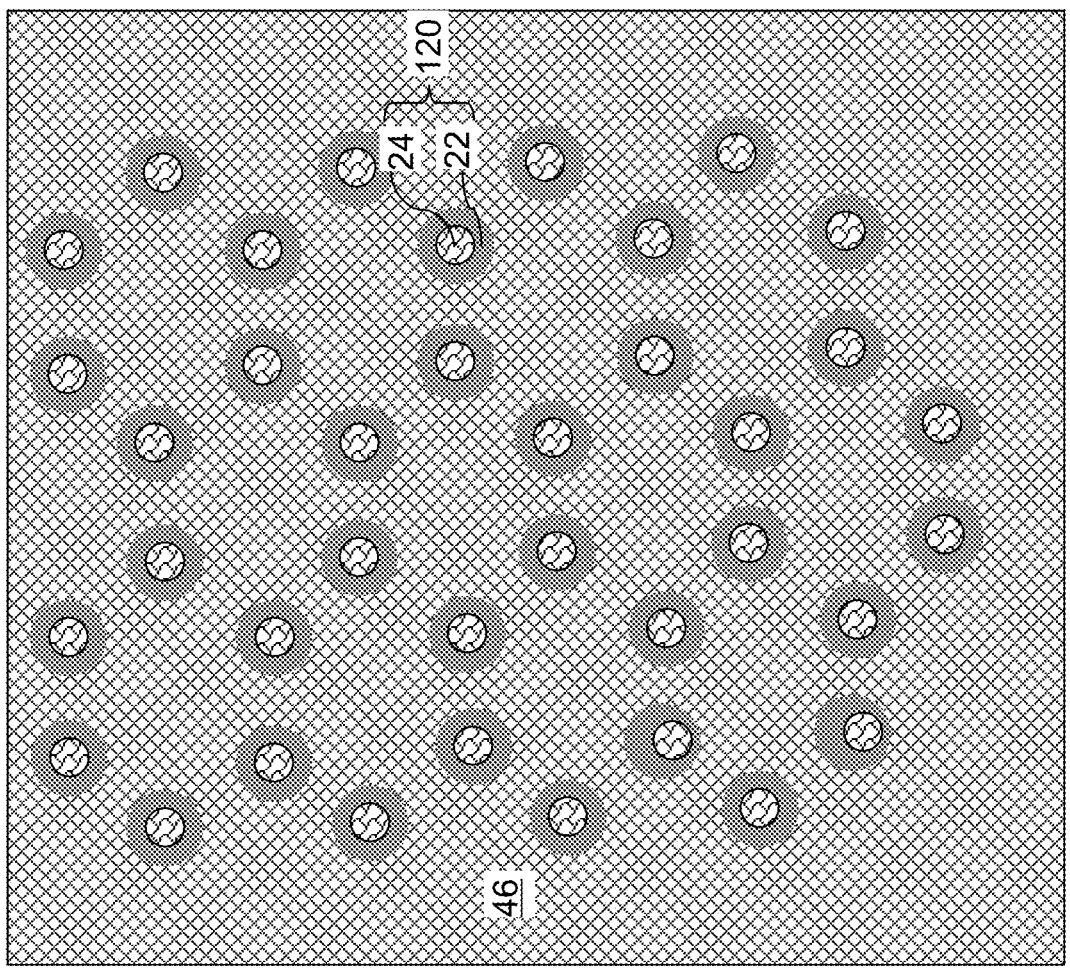
FIG. 35B is a horizontal cross-sectional view along the horizontal plane Y-Y' of FIG. 33C for the second configuration of the exemplary structure according to an embodiment of the present disclosure.
Figure 35C:
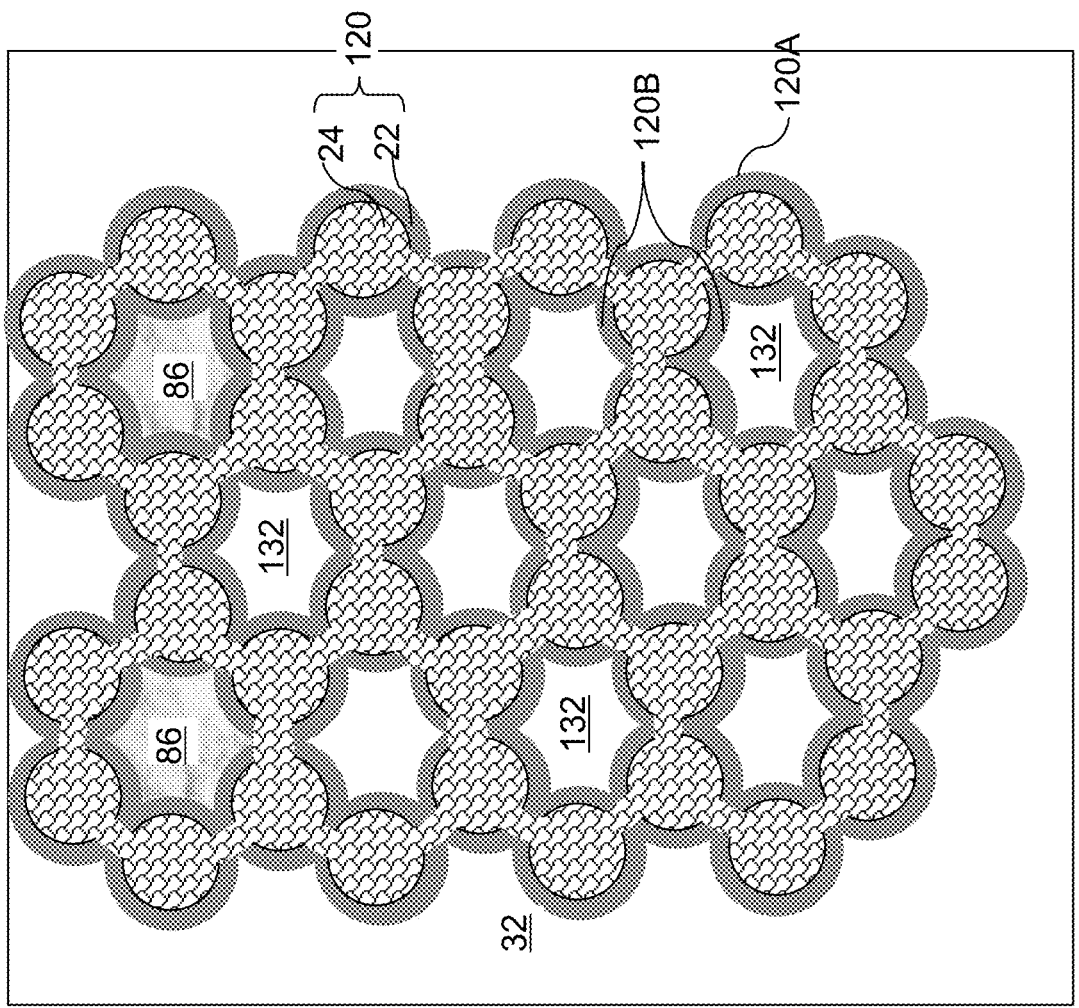
FIG. 35C is a horizontal cross-sectional view along the horizontal plane Z-Z' of FIG. 33C for the second configuration of the exemplary structure according to an embodiment of the present disclosure.

FIGS. 35A-35C illustrate a second configuration of the exemplary structure in which support openings 17 are arranged a vertices of a hexagonal shape to form an interconnected support cavity 117 having a honeycomb configuration. In this case, a laterally perforated support pillar structure 120 may comprise a plurality of inner sidewalls 120B that are laterally spaced apart from each other, and laterally enclosed by an outer sidewall 120A of the laterally perforated support pillar structure 120. In one embodiment, a plurality of layer contact via structures 86 can be located within the outer sidewall 120 and within a respective one of the inner sidewalls 120B. Each of the plurality of inner sidewalls laterally surrounds a respective layer contact via structure 86 among the plurality of layer contact via structures 86.

In one embodiment, each of the plurality of layer contact via structures 86 can contact a top surface of a respective electrically conductive layer 46 within a subset of the electrically conductive layers having an areal overlap with an area defined by the outer sidewall 120A of the laterally perforated support pillar structure 120. At least two electrically conductive layers 46 within the subset of the electrically conductive layers 46 may be contacted by a respective layer contact via structure 86 of the plurality of layer contact via structures 86. In one embodiment, the plurality of inner sidewalls 120B can be arranged as a hexagonal array in the plan view. In one embodiment, the plurality of layer contact via structures 86 may be arranged as a hexagonal array, as shown in FIG. 35C.

Referring to all drawings and according to various embodiments of the present disclosure, a three-dimensional memory device comprises: an alternating stack of insulating layers 32 and electrically conductive layers 46 and comprising stepped surfaces in a staircase region; memory stack structures 55 vertically extending through the alternating stack (32, 46) and comprising a respective vertical stack of memory elements located at levels of the electrically conductive layers 46; a retro-stepped dielectric material portion 65 overlying the stepped surfaces of the alternating stack (32, 46); a laterally perforated support pillar structure 120 located in the staircase region 300 and including an outer sidewall 120A, an inner sidewall 120B laterally offset inward from the outer sidewall, and lateral openings 122 at levels of a subset of the electrically conductive layers 46, wherein each electrically conductive layer 46 within the subset of the electrically conductive layers 46 extends from outside of an area defined by the outer sidewall through a respective subset of lateral openings into an area defined by the inner sidewall; and a layer contact via structure 86 laterally surrounded by laterally perforated support pillar structure 120 and contacting a top surface of a topmost electrically conductive layer 46 of the subset of the electrically conductive layers 46.

In one embodiment, the outer sidewall 120A defines a continuous surface having a closed periphery and not having any lateral opening therethrough at levels of the insulating layers 32, and the subset of the electrically conductive layers 46 has a respective lateral boundary that encloses an area of the laterally perforated support pillar structure 120 in a plan view.

In one embodiment, the layer contact via structure 86 comprises a top surface located within the horizontal plane including the top surface of the laterally perforated support pillar structure 120, a sidewall that contacts the laterally perforated support pillar structure 120, and a bottom surface that contacts the top surface of the topmost electrically conductive layer 46 among the subset of the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers and comprising stepped surfaces in a staircase region;
memory stack structures vertically extending through the alternating stack and comprising a respective vertical stack of memory elements located at levels of the electrically conductive layers;
a retro-stepped dielectric material portion overlying the stepped surfaces of the alternating stack;
a laterally perforated support pillar structure located in the staircase region and including an outer sidewall, an inner sidewall laterally offset inward from the outer sidewall, and lateral openings at levels of a subset of the electrically conductive layers, wherein each electrically conductive layer within the subset of the electrically conductive layers extends from outside of an area defined by the outer sidewall through the lateral openings into an area defined by the inner sidewall;
and a layer contact via structure laterally surrounded by the laterally perforated support pillar structure and contacting a top surface of a topmost electrically conductive layer of the subset of the electrically conductive layers.

2. The three-dimensional memory device of claim 1, wherein:
the outer sidewall defines a continuous surface having a closed periphery and not having any lateral opening therethrough at levels of the insulating layers;
each of the outer sidewall and the inner sidewall vertically extends through the retro-stepped dielectric material portion; and
the subset of the electrically conductive layers has a respective lateral boundary that encloses an area of the laterally perforated support pillar structure in a plan view.

3. The three-dimensional memory device of claim 2, wherein the layer contact via structure comprises a top surface located within a horizontal plane including a top surface of the laterally perforated support pillar structure, a sidewall that contacts the laterally perforated support pillar structure, and a bottom surface that contacts the top surface of the topmost electrically conductive layer of the subset of the electrically conductive layers.

4. The three-dimensional memory device of claim 1, wherein:
each of the memory stack structures comprises a vertical semiconductor channel and a memory film containing the respective vertical stack of memory elements; and
each of the lateral opening within the laterally perforated support pillar structure has a respective height that is the same as a height of a respective electrically conductive layer that laterally extends through the lateral opening.

5. The three-dimensional memory device of claim 1, wherein:
a subset of the insulating layers has a respective lateral boundary that encloses the area of the laterally perforated support pillar structure in the plan view; and
each insulating layer within the subset of the insulating layers comprises a respective opening having a set of sidewall segments that contact a respective contiguous set of vertically-straight and laterally-convex sidewall segments of the outer sidewall of the laterally perforated support pillar structure.

6. The three-dimensional memory device of claim 5, wherein the set of sidewall segments comprises a plurality of concave sidewall segments that are adjoined to each other at vertical edges and defines a continuous surface having a closed top periphery and a closed bottom periphery and not having any lateral opening therethrough.

7. The three-dimensional memory device of claim 6, further comprising at least one insulating plate laterally surrounded by the laterally perforated support pillar structure, comprising a same material as the insulating layers, and located at the levels of the subset of the insulating layers.

8. The three-dimensional memory device of claim 1, wherein:
the laterally perforated support pillar structure comprises an array of pedestals that are laterally spaced apart at each level of the subset of the electrically conductive layers; and
the lateral openings comprise gaps between neighboring pairs of the pedestals of the laterally perforated support pillar structure.

9. The three-dimensional memory device of claim 8, wherein the array of pedestals is arranged in a pattern in which the pedestals are spaced along four sides of a rectangular shape in a plan view, or are spaced along six sides of a hexagonal shape in the plan view.

10. The three-dimensional memory device of claim 1, wherein:
the laterally perforated support pillar structure comprises a plurality of inner sidewalls that are laterally spaced apart from each other, the plurality of inner sidewalls comprising the inner sidewall and additional inner sidewalls; and
at least one additional layer contact via structure is located within the outer sidewall such that each of the plurality of inner sidewalls laterally surrounds a respective one of the layer contact via structure and the at least one additional layer contact via structure.

11. The three-dimensional memory device of claim 10, wherein:
each of the at least one additional layer contact via structure contacts a top surface of a respective electrically conductive layer within the subset of the electrically conductive layers; and
at least two electrically conductive layers within the subset of the electrically conductive layers are contacted by the layer contact via structure and the at least one additional layer contact via structure, respectively.

12. The three-dimensional memory device of claim 10, wherein the plurality of inner sidewalls is arranged as a hexagonal array in plan view.

13. The three-dimensional memory device of claim 1, wherein the laterally perforated support pillar structure comprises:
a dielectric liner contacting the alternating stack and the retro-stepped dielectric material portion; and
a fill material portion laterally surrounded by the dielectric liner, and spaced from the alternating stack, the retro-stepped dielectric material portion, and the layer contact via structure by the dielectric liner.

14. The three-dimensional memory device of claim 13, wherein an inner surface and an outer surface of the laterally perforated support pillar structure comprise a respective laterally undulating vertical cross-sectional profile such that the fill material portion has a greater lateral extent at levels of the insulating layers that underlie the retro-stepped dielectric material portion than at levels of the electrically conductive layers that underlie the retro-stepped dielectric material portion.

\* \* \* \* \*